(12) United States Patent
Naoi et al.

(10) Patent No.: US 7,291,392 B2
(45) Date of Patent: Nov. 6, 2007

(54) INORGANIC/ORGANIC COMPLEX NANO-BEADS AND METHOD FOR MANUFACTURING THE SAME

(75) Inventors: Katsuhiko Naoi, Koganei (JP); Shunzo Suematsu, Koganei (JP)

(73) Assignee: Aoi Electronics Co., Ltd., Kagawa (JP)

( * ) Notice: Subject to any disclaimer, the term of this patent is extended or adjusted under 35 U.S.C. 154(b) by 0 days.

(21) Appl. No.: 10/469,531

(22) PCT Filed: Sep. 12, 2001

(86) PCT No.: PCT/JP01/07913

§ 371 (c)(1),
(2), (4) Date: Mar. 29, 2004

(87) PCT Pub. No.: WO02/073632

PCT Pub. Date: Sep. 19, 2002

(65) Prior Publication Data

US 2004/0151907 A1     Aug. 5, 2004

(30) Foreign Application Priority Data

Mar. 8, 2001   (JP)  .............. 2001-065485

(51) Int. Cl.
*B32B 5/16*   (2006.01)
*B05D 1/04*   (2006.01)
(52) U.S. Cl. ............... 428/403; 427/215; 427/220; 427/222; 427/331; 427/458; 977/773
(58) Field of Classification Search .......... 428/403, 428/407; 977/DIG. 1, 773; 427/212, 215, 427/458, 220, 222, 331
See application file for complete search history.

(56) References Cited

U.S. PATENT DOCUMENTS

| | | | | |
|---|---|---|---|---|
| 4,419,279 A | * | 12/1983 | Abrams | ............ 252/514 |
| 4,828,955 A | * | 5/1989 | Kasai et al. | ............ 430/110.2 |
| 5,994,015 A | * | 11/1999 | Vail | ............ 430/111.35 |
| 6,475,670 B1 | * | 11/2002 | Ito | ............ 429/217 |
| 2003/0077515 A1 | * | 4/2003 | Chen et al. | ............ 429/231.8 |

FOREIGN PATENT DOCUMENTS

| | | |
|---|---|---|
| JP | 6-162817 | 6/1994 |
| JP | 6-238161 | 8/1994 |
| JP | 10-249985 | 9/1998 |
| JP | 11-297577 | 10/1999 |
| WO | WO 99/04441 | 1/1999 |

OTHER PUBLICATIONS

K. Naoi et al., *Electrochemistry of Poly(1,5-diaminoanthraquinone) and Its Application in Electrochemical Capacitor Materials*, Journal of The Electrochemical Society, 147 (2), pp. 420-426 (2000).
A. Malinauskas, *Chemical deposition of conducting polymers*, Polymer 42, pp. 2957-3972 (2001).
Katsuhiko Naoi et al.; Journal of the Electrochemical Society, vol. 147, No. 2, pp. 420-426, 2000. Cited in the int'l. search report.

* cited by examiner

*Primary Examiner*—H. T Le
(74) *Attorney, Agent, or Firm*—Westerman, Hattori, Daniels & Adrian, LLP.

(57) ABSTRACT

An inorganic/organic composite material which is advantageous in physical characteristics (mechanical strength), chemical characteristics (thermal stability) and electric characteristics (electric conductivity), as compared with a sole system, as being compounded in nano order. An improved energy storage device using the inorganic/organic composite nano-beads, and especially an improved electrochemical capacitor for covering the range of a power energy density which cannot be achieved with devices of the prior art. A method of producing the inorganic/-organic composite nano-beads.

The inorganic/organic composite nano-beads have a three-dimensional structure in which nuclei are made of an inorganic material having a particle diameter of nano order and a high electronic conductivity, and are covered with thin films of an organic conductive material.

11 Claims, 36 Drawing Sheets

(a)

(b)

(c)

Parameter: $r_1$ [nm]= 1000, 500, 200, 100, 50, 20, 10, 5, 2

RuO$_2$
radius $r_1$ [nm]
volume $V_1$ [l]
Specific capacity $C_1$ [Ah l$^{-1}$]
density $d_1$ [g cm$^{-3}$]

Density

Conducting polymer
Thick of film $r_2 - r_1$ [nm]
volume $V_2$ [l]
Specific capacity $C_2$ [Ah l$^{-1}$]
density $d_2$ [g cm$^{-3}$]

Energy beads

Energy Beads

Capacity per E. B.: $Q = C_1 V_1 + C_2 V_2$

E. B. : one layer

Total Capacity of E. B. $Q_t =$
$Q \times$ (The Number of E. B.)

Electrochemical cell $E_{oc} = 1.4$ [V]

$L_{ele} = 1$ [nm]

$\kappa_{ele}$ (30 [wt%] $H_2SO_4$) =0.7 [S cm$^{-1}$]

$d_{E.B.} = 1.36$ [g cm$^{-3}$]

$d_{RuO2} = 6.97$ [g cm$^{-3}$]

$d_{ele} = 1.215$ [g cm$^{-3}$]

Energy density [Wh l$^{-1}$] = $Q_t \times E_{oc}$

Power density [W l$^{-1}$] = ($E_{oc}^2 / (4R_{ele})) \times (S / \rho L_e) \times (1 / W_{cell})$ $R_{ele} = (1 / \kappa_{ele}) \times (L_{ele} / S)$ $W_{cell} = d_{E.B.} \, S \, L_{E.B.} \, [2 + (y_{max} / 100 \, M_c)]$ $d_{E.B.} = x d_{C.P.} + (1-x) d_{RuO2}$

INORGANIC/ORGANIC COMPLEX NANO-BEADS AND METHOD FOR MANUFACTURING THE SAME

TECHNICAL FIELD

The present invention relates to inorganic/organic composite nano-beads, an energy storage device, and a method of producing the nano-beads.

BACKGROUND ART

Recently, with development of information-oriented society, a higher energy density and a higher output density have been demanded for power sources of small-sized portable electronic equipment, such as cellular phones and notebook type personal computers, and electric cars which will take an important role in transportation means in future. While needs for energy storage devices will continue to increase in future, the characteristics much superior to existing ones will be demanded for the energy storage devices at the same time. Main examples of currently available energy storage devices are an electrolytic capacitor, an electric double layer capacitor, and a battery. On the other hand, as novel devices capable of covering the range of power energy density which cannot be achieved with those devices, attention is focused on a new type energy device, called an electrochemical capacitor, in which conducting polymers and metal oxides are used as electrode materials.

An electrochemical capacitor stores and releases energy through a peculiar mechanism different from those of conventional capacitors and electric cells. Therefore, the electrochemical capacitor is expected to have such primary advantageous characteristics that a higher power density is achieved and a larger energy density as compared with the electrolytic capacitor, etc. is realized while ensuring superior cycle characteristics.

There are three kinds of materials for use in the electrochemical capacitor, i.e., carbon-base materials, conductive high-molecular (polymer) materials, and metal oxide-base materials.

Among the carbon-base materials, activated charcoal is used as an electrode material of an electric double layer capacitor. The reason is that the activated charcoal has a high specific surface area and, therefore, a very large electric double layer capacity is developed at the hetero interface between the surface of the activated charcoal and an electrolytic solution. Other examples of carbon materials include carbon black, graphite, carbon nano-tubes, and carbon coils. Of these materials, the carbon black is used as conductivity aids for various conductive materials because of having a high electronic conductivity.

As examples of the metal oxide-base materials, oxides of rare metals, valve metals, transition metals, and lithium transition metals are used as energy storage materials. Of those examples, the valve metals are used as materials of electrolytic capacitors, and the other metals are used as electrode materials of electrochemical capacitors and various electric cells.

Electric double layer capacitors have been employed as small-sized and highly-reliable memory backup power sources from the second-half of 1970s with miniaturization of electronic equipment and introduction of microcomputers and semiconductor memories. At present, electric double layer capacitors are widely used in the energy backup field as aids for secondary cells or new energy supply sources which are expected to be substituted for cells.

An electric double layer is a thin film which is naturally produced at the interface between an electrode and an electrolytic solution, and has a thickness of about several angstroms. When an electrode is immersed in an electrolytic solution and a voltage is applied, no current flows in an initial stage before the start of electrolysis because an electric double layer produced between the electrode and the electrolytic solution functions to maintain insulation. In such a condition, electric charges or holes present on the conductor side with respect to the electric double layer cause adsorption with and desorption from ions having opposite polarities (i.e., non-Faraday reaction between the electrode and the ions without transfer of electrons) so that electric charges are stored and released. The electric double layer capacitor utilizes such a phenomenon. Features of the electric double layer capacitor are as follows: i) quick charging/discharging of a large current is enabled because the charging/discharging accompanies with no chemical reactions, ii) stable charging/discharging behaviors are ensured over a wide temperature range, iii) the capacitor is not failed upon short-circuiting and, therefore, no restrictions are imposed on the charging/discharging, iv) the charging/discharging can be continued semi-permanently and replacement is virtually not required, and v) the capacitor is friendly to environments because of no use of heavy metals, such as lead and cadmium.

On the other hand, when an aqueous-base electrolytic solution, e.g., sulfuric acid, is used, the withstand voltage is as low as 1 V. The withstand voltage can be increased to a level of 3 V by employing an organic electrolytic solution. However, such a capacitor has a problem such as a drop of electronic conductivity and cannot be said as being satisfactory from the viewpoint of energy density. Also, while the electric double layer has a very small capacity of about 20 to 40 $\mu Fcm^{-2}$ with the use of a mercury electrode, a large capacity of farad order can be obtained by employing, as an electrode, phenol-base activated charcoal fibers or pitch-base activated charcoal powders, which have a large specific surface area with a pore size of a not-too-small level (about 1,500 to 3,000 $m^2/g$), and which are highly conductive and are electrochemically stable.

Electrochemical capacitors using metal oxides are advantageous in that they are more compact, have smaller internal resistance, and have less risk of ignition than the case of using carbon-base materials. Further, an electrochemical capacitor using $RuO_2$ shows relatively high characteristic values, i.e., operating voltage of 1.4 V, energy density of about $10^1$ to $10^2$ Wh/kg, and power density of about 500 W/kg, when immersed in an aqueous solution of sulfuric acid. Thus, a higher energy density than the case of using carbon-base materials is obtained. In consideration of that Ru and Ir are produced in very small amount and are very expensive materials, however, it is studied to use, instead of Ru and Ir, transition metals such as Co and Ni, valve metal oxides such as $TiO_2$, $SnO_2$ and $ZrO_2$, or mixed materials such as $V_2O_5$ and $RuO_2$.

The charge storage mechanism of an electrochemical capacitor resides in absorption and desorption of hydrogen ions in the electric double layer and at the electrode surface, as well as incidental reduction and oxidation of metals. Charge accumulation occurs primarily based on the Faraday reaction in which electrons drift at the electrode interface. The valence of a metal in the oxide is changed with reduction and oxidation. In $RuO_2$, for example, the valence of Ru as a center metal continuously changes from 2 to 4, and the reaction expressed by the following formula (1) occurs with motion of protons for compensating for the charge change:

Chemical Formula 1 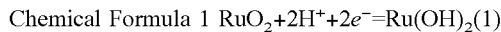

Unlike the adsorption process of H onto a Pt metal, such a mechanism is featured in that H is coupled and dissociated upon the reduction/oxidation reactions of Ru itself, the valence of the center metal is thereby continuously changed, and a differential capacity value with respect to potential is almost constant. From those features, charging/discharging behaviors similar to those of a capacitor are expected. In addition, although the reduction/oxidation reactions accompany with a phase change, a very high cycle characteristic on the order of about several ten thousands times is obtained because of high electrochemical reversibility.

In electric double layer capacitors employing conductive high molecules (conducting polymer), there also develop in parallel an electric double layer capacity and a pseudo capacity resulting from electron motion process at the electrode interface with reduction and oxidation in active sites. As electrode materials of those capacitors, polyaniline, polypyrrole, polyacene and polythiophene derivatives are proposed so far. The achieved energy density and power density differ depending on combinations of the electrode materials used.

The charge storage mechanism in those capacitors resides in reduction/oxidation reactions with transfer of π electrons between π-conjugate conductive high molecules. More specifically, during the oxidation, π electrons present in the highest occupied molecule orbit (HOMO) are withdrawn and the molecules are charged positive. To compensate for the positive charges thus produced, there occurs p-doping in which anions in the electrolytic solution are taken into an electric double layer film. On the other hand, during the reduction, electrons are injected into the lowest unoccupied molecule orbit (LUMO) and the molecules are charged negative. Accordingly, there occurs n-doping in which cations in the electrolytic solution are taken into the electric double layer film. The band gap between LUMO and HOMO corresponds to the difference between the start potentials of the n- and p-doping in a cyclic voltammogram. When the voltage during the discharge reaches that potential difference, there occurs a behavior like a cell, such as an abrupt voltage drop.

Gottesfeld, Ferraris, et al. classified the electric double layer capacitors employing conductive high molecules, depending on combinations of the electrode materials, into symmetrical Type I employing, as the two electrodes, two kinds of p-doped materials having the same reduction and oxidation potential, asymmetrical Type II employing, as the two electrodes, p-doped materials having different reduction and oxidation potentials, and asymmetrical Type III employing, as the two electrodes, n- and p-doped materials. The Type I shows a lower operating voltage and energy density. While it is therefore required to thicken the film and increase the number of active sites to increase energy obtained, a problem arises in that the power density decreases with a reduction of ion diffusivity. In the Type II, as compared with the Type I, the operating voltage is slightly increased, and the energy density is increased about twice. In the Type III, electric charges are accumulated and released with the n-doping on the negative electrode side and the p-doping on the positive electrode side. The operating voltage is twice that of the Type II and the energy density is also maximum. However, because there is a potential range in which the redox (reduction and oxidation) reaction does not occur and no currents flow, the Type III is disadvantageous in exhibiting a discontinuous charging behavior, i.e., an abrupt voltage drop, after electric charges produced with the redox reaction are released.

DISCLOSURE OF THE INVENTION

An object of the present invention is to provide an inorganic/-organic composite material which is advantageous in physical characteristics (mechanical strength), chemical characteristics (thermal stability) and electric characteristics (electric conductivity), as compared with a sole system, as being compounded in nano order.

Another object of the present invention is to provide an improved energy storage device using the inorganic/organic composite nano-beads, and especially an improved electrochemical capacitor for covering the range of a power energy density which cannot be achieved with devices of the prior art.

Still another object of the present invention is to provide a method of producing the inorganic/organic composite nano-beads.

The present invention resides in inorganic/organic composite nano-beads having a three-dimensional structure in which nuclei are made of an inorganic material having a particle diameter of nano order and a high electronic conductivity, and are covered with thin films of an organic conductive material.

Preferably, the nucleus material has a continuously changing valence and also has a redox activity over a wide potential range. In this case, the present invention resides in inorganic/organic composite nano-beads having a three-dimensional structure in which nuclei are made of an inorganic material having a particle diameter of nano order and a high electronic conductivity, the nucleus organic material having a continuously changing valence and also having a redox activity over a wide potential range, and are covered with thin films of an organic conductive material.

Preferably, the nucleus material has a structure in which inter-particle paths are spontaneously constructed. In this case, the present invention resides in inorganic/organic composite nano-beads having a three-dimensional structure in which nuclei are made of an inorganic material having a particle diameter of nano order and a high electronic conductivity, the nucleus organic material having a structure in which inter-particle paths are spontaneously constructed, and are covered with thin films of an organic conductive material.

Preferably, the nucleus material has a structure in which a chain structure made up of primary particles coupled with each other in a moniliform shape is highly developed. In this case, the present invention resides in inorganic/organic composite nano-beads having a three-dimensional structure in which nuclei are made of an inorganic material having a particle diameter of nano order and a high electronic conductivity, the nucleus organic material having a structure in which inter-particle paths are spontaneously constructed and also having a structure in which a chain structure made up of primary particles coupled with each other in a moniliform shape is highly developed, and are covered with thin films of an organic conductive material.

Preferably, the conductive material has an electric activity over a wide potential range. In this case, the present invention resides in inorganic/organic composite nano-beads having a three-dimensional structure in which nuclei are made of an inorganic material having a particle diameter of nano order and a high electronic conductivity, the nucleus organic material preferably having a continuously changing valence and also having a redox activity over a wide potential range, or the nucleus organic material having a structure in which inter-particle paths are spontaneously constructed and also having, as required, a structure in which a chain structure made up of primary particles coupled with each other in a moniliform shape is highly developed, and are covered with thin films of an organic conductive material, the conductive material having an electric activity over a wide potential range.

Preferably, high molecules of the conductive material are conductive oligomers. In this case, the present invention resides in inorganic/organic composite nano-beads having a three-dimensional structure in which nuclei are made of an inorganic material having a particle diameter of nano order and a high electronic conductivity, the nucleus organic material preferably having a continuously changing valence and also having a redox activity over a wide potential range, or the nucleus organic material having a structure in which inter-particle paths are spontaneously constructed and also having, as required, a structure in which a chain structure made up of primary particles coupled with each other in a moniliform shape is highly developed, and are covered with thin films of organic conductive oligomers, preferably conductive oligomers having an electric activity over a wide potential range.

Also, the present invention resides in an energy storage device made of the inorganic/organic composite nano-beads according to any one of the aspects of the present invention.

Furthermore, the present invention resides in a method of producing the inorganic/organic composite nano-beads according to any one of the above-mentioned aspects of the present invention, the method comprising the steps of dispersing colloidal particles of a nucleus material in a chemically stable condition to form a disperse system in which a mean particle diameter of resulting structures is a minimum value, converting organic monomers into oligomers in the disperse system to form an organic conductive material, and coating the structures with thin films of the organic conductive material.

Preferably, a selective reaction field is created by causing oxidants to be adsorbed onto surfaces of the nucleus material by electrostatic forces. In this case, the present invention resides in a method of producing the inorganic/organic composite nano-beads according to any one of the above-mentioned aspects of the present invention, the method comprising the steps of dispersing colloidal particles of a nucleus material in a chemically stable condition to form a disperse system in which a mean particle diameter of resulting structures is a minimum value, creating a selective reaction field by causing oxidants to be adsorbed onto surfaces of the nucleus material by electrostatic forces, converting organic monomers into oligomers in the disperse system to form an organic conductive material, and coating the structures with thin films of the organic conductive material.

Preferably, the oligomers are obtained by adjusting a monomer concentration and lowering a system temperature, thereby controlling a reaction rate. In this case, the present invention resides in a method of producing the inorganic/organic composite nano-beads according to any one of the above-mentioned aspects of the present invention, the method comprising the steps of dispersing colloidal particles of a nucleus material in a chemically stable condition to form a disperse system in which a mean particle diameter of resulting structures is a minimum value, preferably creating a selective reaction field by causing oxidants to be adsorbed onto surfaces of the nucleus material by electrostatic forces, converting organic monomers into oligomers in the disperse system to form an organic conductive material by adjusting a monomer concentration and lowering a system temperature, thereby controlling a reaction rate, and coating the structures with thin films of the organic conductive material.

Preferably, the method further comprises the step of continuously maintaining a physically dispersed state with irradiation of an ultrasonic wave. In this case, the present invention resides in a method of producing the inorganic/organic composite nano-beads according to any one of the above-mentioned aspects of the present invention, the method comprising the steps of dispersing colloidal particles of a nucleus material in a chemically stable condition to form a disperse system in which a mean particle diameter of resulting structures is a minimum value, preferably creating a selective reaction field by causing oxidants to be adsorbed onto surfaces of the nucleus material by electrostatic forces, converting organic monomers into oligomers in the disperse system to form an organic conductive material while continuously maintaining a physically dispersed state with irradiation of an ultrasonic wave, preferably converting organic monomers into oligomers in the disperse system to form an organic conductive material by adjusting a monomer concentration and lowering a system temperature, thereby controlling a reaction rate, and coating the structures with thin films of the organic conductive material.

BEST MODE OF CARRYING OUT THE INVENTION

An inorganic/organic composite system is constructed in expectation of physical properties that cannot be obtained with an inorganic or organic sole system, and in pursuit of the effect beyond that achievable with simple addition of respective properties of the inorganic and organic sole systems. Inorganic and organic start materials may have various sizes and different dimensions from each other. To obtain a stable system, however, a due consideration is required with regards to affinity between components, and size, shape, and dispersed condition of a disperse phase. As to compounding at a nano level, it is already known that, because of particles being very small, a total area of the interfaces between particles and a matrix is drastically increased and the distance between the particles is remarkably reduced, whereby the inter-particle interaction is remarkably enhanced. Thus, the construction of the inorganic/organic composite system is expected in providing, instead of simple addition of respective properties of a nucleus and a conducting polymer thin film, a novel material having more excellent properties in physical characteristics such as mechanical strength, chemical characteristics such as thermal stability and electric characteristics such as electric conductivity.

In producing a nano-composite, start materials can be selected from among various conductive high molecules (conductive oligomers), metal oxides, carbon black, and graphite. Among various metal oxides, especially those ones in which a center metal has a continuously changing valence and also has a redox activity over a wide potential range are highly potential for use as electrode materials. Likewise, among various conductive high molecules, those ones having an electric activity over a wide potential range are highly potential for use as electrode materials.

Figure 30:
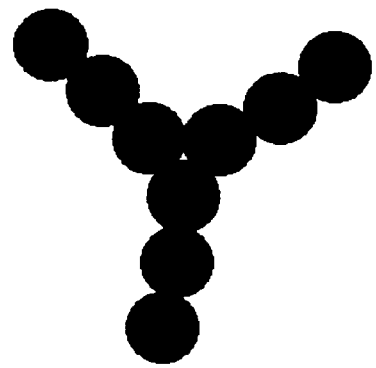
FIG. 30 is an illustration showing a chain structure made up of primary particles of acetylene black (AB) coupled with each other in a moniliform shape.

In one embodiment of the present invention, acetylene black as one kind of carbon black and polyaniline, which is particularly easy to develop chemical polymerization and is most closely studied with regards to basic physical properties among proton-exchangeable ionic conductive high molecules, were selected as materials of the nano-composite. In acetylene black (AB), as shown in FIG. 30, a chain structure made up of primary particles coupled with each other in a moniliform shape is highly developed (see Isao Mochida, "Tansozai no Kagaku to Kogyo (Chemistry and Industry of Carbon Materials", 99). It is hence thought that, when compounding the acetylene black, inter-particle paths are spontaneously constructed. Accordingly, the acetylene black can be said as being most suitable as a material for nuclei. Polyaniline has various electrochemical characteristics, i.e., i) it develops reduction/oxidation reactions accompanying with proton exchange, ii) it is electrochemically active over a wide potential range of −0.1 to 0.7 V vs. Ag/AgCl and exhibits a behavior like a capacitor from the electrochemical point of view, iii) it shows a relatively high cycle characteristic in an acidic aqueous solution, and iv) it develops the electrode catalyst effect with disulfide, quinone, metal ions, etc.

Figure 31:
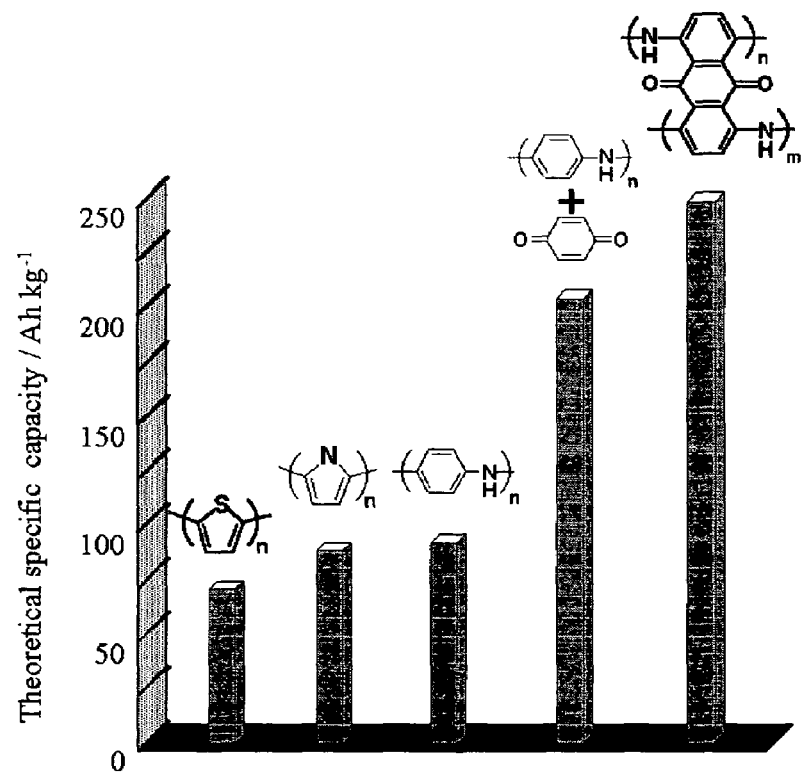
FIG. 31 is a histogram showing theoretical specific capacity or organic redox materials.

In another embodiment of the present invention, ruthenium oxide, which has a relatively high theoretical specific capacity among proton-exchangeable metal oxides and 1,5-diaminoanthraquinone (DAAQ) were selected as materials of the nano-composite. DAAQ has the following features. As shown in FIG. 31, because DAAQ has a large number of reactive electrons, i.e., three electrons, per molecular weight, its theoretical specific capacity (241 Ah/kg) is 3 to 5 times as high as those of polyaniline (71 Ah/kg) and polypyrrole (54 Ah/kg) which are general conducting polymers. Also, since DAAQ exchanges a proton as an ion having the smallest size and has quinone groups and amino groups, the intra-molecule interaction is caused and a high power density is increased. Further, because of the presence of π-π stacking and isotropic expansion/contraction in the process of proton exchange, DAAQ has a higher cycle characteristic of 100,000 or more times than polyaniline (25,000 or more times) that is not isotropic. While DAAQ is a compound having such superior characteristics, there is a problem that the specific density after electrolytic polymerization is as low as 50 Ah/kg and hence the utilization rate is low, i.e., about 20%. The reason is presumably in that, during the polymerization. DAAQ monomers are trapped and remain in the produced oligomers, thus causing a reduction in percentage of active sites. To overcome the problem, it is conceivable to reduce the film thickness of DAAQ for reducing the number of monomers trapped.

Ruthenium oxide has various electrochemical characteristics, i.e., i) it develops reduction/oxidation reactions accompanying with proton exchange, ii) because the valence continuously changes from $Ru^{2+}$ to $Ru^{4+}$, it is electrochemically active over a wide potential range of −0.1 to 1.1 V vs. Ag/AgCl and exhibits a behavior like a capacitor from the electrochemical point of view, iii) it has a theoretical specific capacity as high as about 1400 Ah/I per unit volume, and iv) among the various conducting polymers, electrochemical characteristics of polyaniline, particularly, have been studied for a long time.

A method of producing the nano-composite will now be described in connection with the case of using, as start materials, ruthenium oxide and 1,5-diaminoanthraquinone (DAAQ). First, nano-particles of the ruthenium oxide, serving as nuclei of the nano-composite, are produced. Then, a reaction field is created around the nano-particles so as to more easily cause polymerization of the conductive high molecules, followed by chemical polymerization with ultrasonic waves. Using such a method, it is possible to produce, for example, a nano-composite (1) in which the ruthenium oxide particles serving as nuclei have a relatively large diameter, i.e., 300 nm, and the films of the conducting polymer formed around the ruthenium oxide particles have a relatively large thickness, i.e., 33 nm, and a nano-composite (2) in which the ruthenium oxide particles serving as nuclei have a relatively small diameter, i.e., 100 nm, and the films of the conducting polymer formed around the ruthenium oxide particles have a relatively small thickness, i.e., 12 nm.

At a scan rate of 100 mV/s, the nano-composite (1) has a specific capacity of 41.6 Ah/kg, which is about three times per unit weight as compared with the specific capacity of the metal oxide sole system. Further, at the time when the specific capacity is reduced to 50% of the initial value, the discharge voltage of the nano-composite is 0.4 V/s, while the discharge voltage of the ruthenium oxide sole system is 20 mV/s. At high scan rates, the nano-composite film develops a higher specific capacity and provides a higher capacity development rate than those of the metal oxide sole system. Also, as compared with the polyaniline sole system ($\Delta E$=0.125 V) for the reaction rate at a first reduction/-oxidation peak, the peak separation obtained from energy beads (1) is $\Delta E$=0.089 V and the nano-composite (1) have a smaller value of the peak separation. Presumably, this result is attributable to that, because of the electrode catalysis effect generated at the interface between $RuO_2.nH_2O$ and PAn, the electron mobility is increased and so is the proton exchange rate correspondingly.

At a scan rate of 100 mV/s, the nano-composite (2) has a specific capacity of 92 Ah/kg, which is about 1.2 times per unit weight as compared with the specific capacity of the metal oxide sole system. Further, at the time when the specific capacity is reduced to 50% of the initial value, the discharge voltage of the nano-composite is about 20 V/s, while the discharge voltage of the ruthenium oxide sole system is about 0.7 V/s. At high scan rates, the nano-composite film develops a higher specific capacity and provides a higher capacity development rate than those of the metal oxide sole system. Comparing the nano-composites (1) and (2) with each other, the nano-composite (2) made up of smaller particles exhibit a higher retention rate of capacity development when the scan rate is gradually increased.

Also, as compared with the polyaniline sole system ($\Delta E$=0.125 V) for the peak separation at a first reduction/oxidation peak, the peak separation obtained from energy beads (2) is $\Delta E$=0.089 V and the nano-composite (2) have a smaller value of the peak separation. As with the nano-composite (1), this result is also presumably attributable to that, because of the electrode catalysis effect generated at the interface between $RuO_2.nH_2O$ and PAn, the electron mobility is increased and so is the proton exchange rate correspondingly.

Comparing the nano-composites (1) and (2) with each other, the nano-composite (2) made up of smaller particles exhibit a higher retention rate of capacity development when the scan rate is gradually increased. Accordingly, it is thought that the nano-composite provide a higher capacity incidence than the metal oxide sole system and a further size reduction of the nano-composite is effective in increasing the electron mobility or the proton exchange reaction rate.

In still another embodiment, as a novel energy nano-material, energy nano-beads are produced which comprise nano-particles of transition metal oxide having a high energy density per unit volume, and polyaniline highly stable in an acidic aqueous solution and being easy to cause chemical polymerization with those nano-particles. Then, the produced energy nano-beads are cohered and fixed onto an electrode for studies with regards to electrochemical characteristics of the energy nano-beads and a practical possibility as an electrochemical capacitor material.

Compounding of those start materials is expectable in providing advantages given below.

Figure 32:
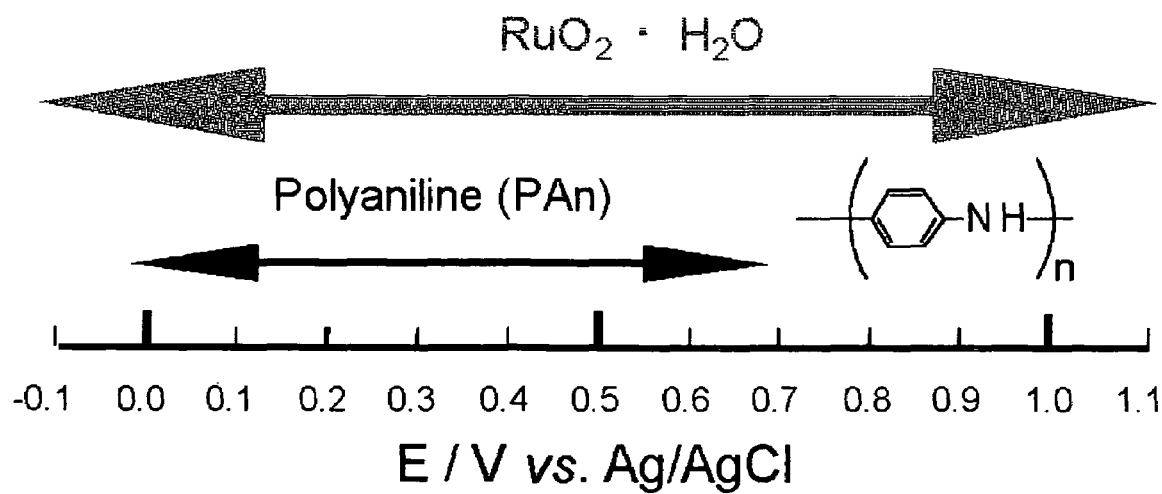
FIG. 32 is an illustration showing that $RuO_2.H_2O$ and polyaniline (ANn) are materials causing reduction and oxidation at similar energy levels.
Figure 33:
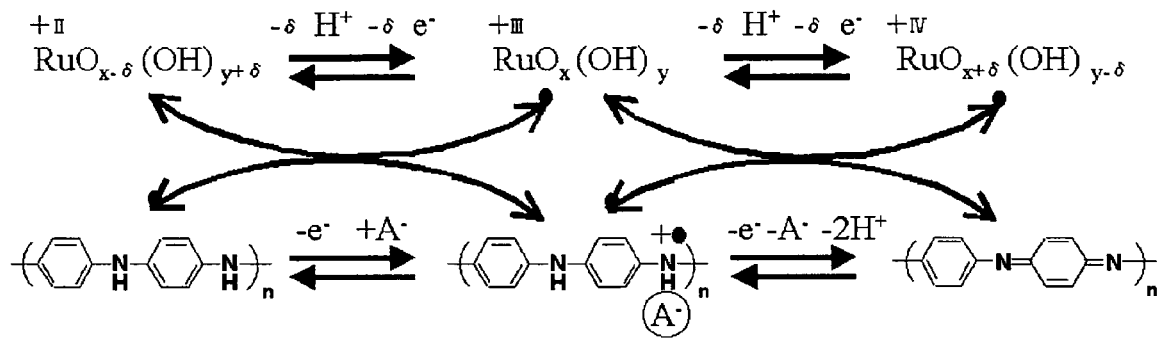
FIG. 33 is an illustration for explaining redox reactions of $RuO_2.H_2O$ and ANn.

Ruthenium oxide and polyaniline overlap with each other in the potential range of 0 to 0.7 V vs. Ag/AgCl in which reduction/oxidation reductions take place (see FIG. 32). This means that both the materials cause reduction/oxidation at similar energy levels. When compounding those materials, therefore, it is thought that the electron mobility is increased with the electrode catalyst effect. As a result, while the reduction/oxidation reaction step in the charge drift process of the conductive high molecules and the metal oxide is a rate-determining step, the rate of that step, i.e., the reaction rate of reduction/oxidation, is increased in each of both the materials. This leads to an increase of power density when the energy nano-beads are applied to devices. In addition, because both the materials perform proton exchange with the reduction/oxidation reactions, an increase of the proton exchange rate is also expectable with to the electrode catalyst effect (see FIG. 33).

The ruthenium oxide has a relatively high specific density per unit volume. On the other hand, polyaniline has a relatively high cycle stability in an acidic aqueous solution. Accordingly, it is thought that advantages of both the materials can be usefully employed by compounding them. Thus, when applied to devices, the energy nano-beads can be said as a material that is advantageous in energy density reflecting the characteristics of ruthenium oxide and cycle characteristic reflecting the characteristics of polyaniline.

Further, theoretical calculations show that the smaller the domain size of the materials, the larger is a contact area at the interface between both the materials. Expectable features resulting from compounding ruthenium oxide and polyaniline in nano order size are as follows.

Figure 34:
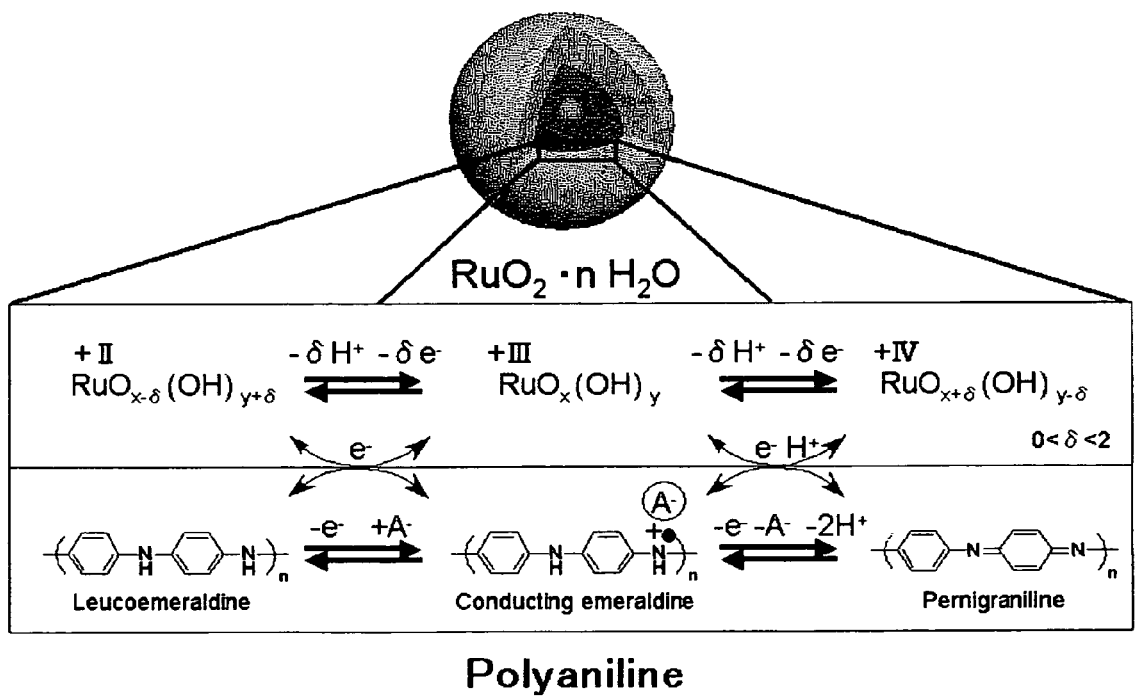
FIG. 34 is an illustration for explaining the electrode catalysis effect in the energy beads.

In order to develop the electrode catalyst effect, the interface at which both the materials contact with each other has to exist. By reducing the contact area at the interface to nano order size, the electrode catalyst effect is relatively increased. Therefore, the number of sites developing the electrode catalyst effect is increased in the case of compounding both materials in nano-order domain size as compared with the case of compounding them in relatively large domain size. As a result, the electron mobility and the ion diffusivity are increased, whereby the redox reaction rate is further increased (see FIG. 34). In other words, it is thought that compounding the start materials in nano order size closer to a molecule level provides a novel material superior in physical characteristics (mechanical strength), chemical characteristics (thermal stability) and electric characteristics (electric conductivity), which reflect the characteristics of ruthenium.

Crystallinity of ruthenium oxide changes with hydrating water. When crystallinity is high, the short range order and the long range order are both good, but in an amorphous state only the short range order is good. Looking at ruthenium oxide in terms of short range, however, the ruthenium oxide is in an ionic crystal state in any cases. Generally, it is reported that, from results of electrochemical measurements for lithium transition metal oxides, etc. which are layered compounds, capacity is more easily developed in the case of edge surfaces being present in the bead surfaces in a larger number than base surfaces as compared with the case of base surfaces being present in the bead surfaces in a larger number than edge surfaces. A similar report is also publicized regarding carbon materials for use in electric double layer capacitors. It is therefore thought that ruthenium oxide also has a similar tendency to more easily develop capacity in the case of edge surfaces appearing in the ruthenium oxide surface in a larger number. This results in that, by reducing the ruthenium oxide size to nano order or smaller, the entire ruthenium oxide surface is eventually made up of edge surfaces and capacity becomes relatively easier to develop.

Expectable features resulting from compounding ruthenium oxide and polyaniline in the form of beads of nano order size are as follows.

Figure 35:
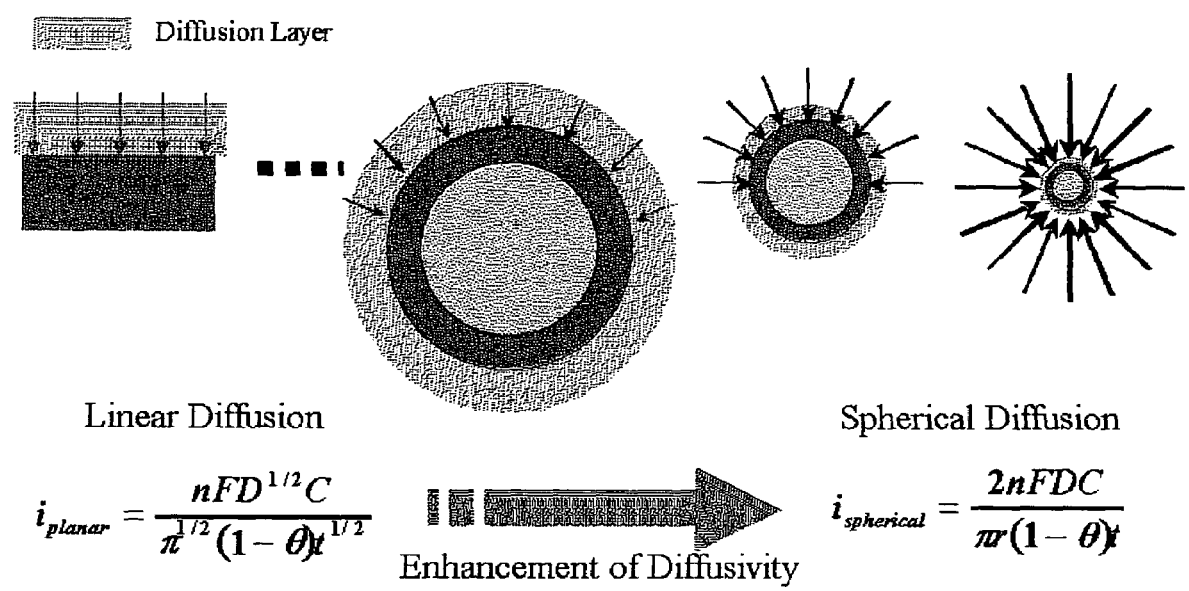
FIG. 35 is an illustration for explaining the relationship between the particle diameter and the diffusivity of the energy beads.
Figure 36:
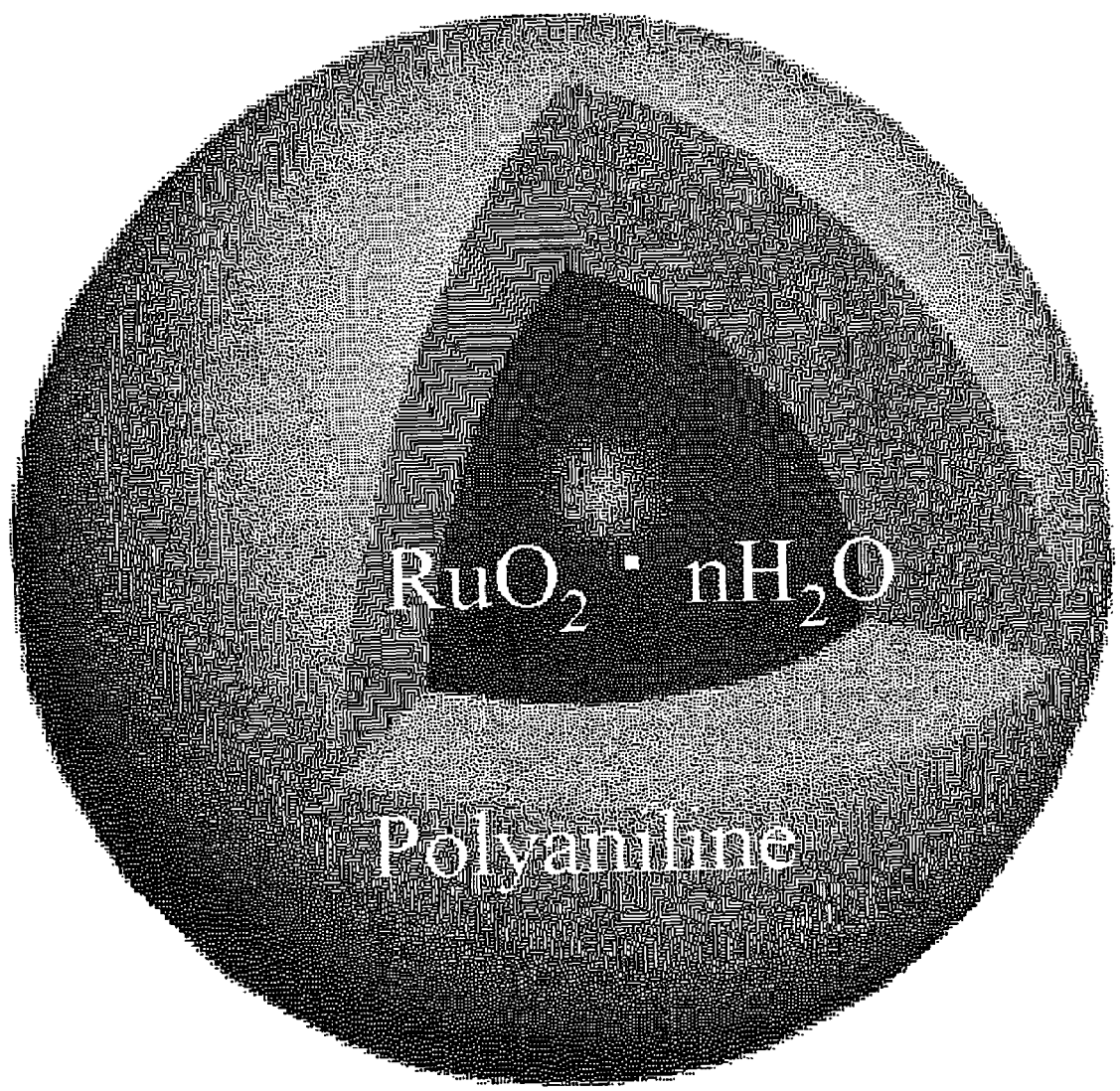
FIG. 36 is an illustration showing an energy nano-composite of $RuO_2.nH_2O$ and ANn.

Forming nano-particles in a bead-like or spherical shape is expected to enhance the ion diffusivity. Although there are two kinds of diffusions, i.e., linear diffusion and spherical diffusion, the spherical diffusion has a higher diffusivity under the same conditions (see FIG. 35). It is therefore thought that the nano-particles formed in a bead-like shape leads to an increase of the power density. The present invention includes, as one preferred embodiment of the new electrochemical capacitor material, a nano compounded material (energy nano-composite material) made of ruthenium oxide and polyaniline. The energy nano-composite material is constituted as energy nano-beads having a structure in which nano-particles of ruthenium oxide are used as nuclei and very thin films of nano order thickness produced by polymerization of the ruthenium oxide and polyaniline are formed around the nano-particles (see FIG. 36).

Dependency of the energy density and the power density obtained with the energy nano-composite material upon the particle diameter is determined from theoretical calculations.

Conditions and assumptions for the theoretical calculations will be described below.

Figure 37:
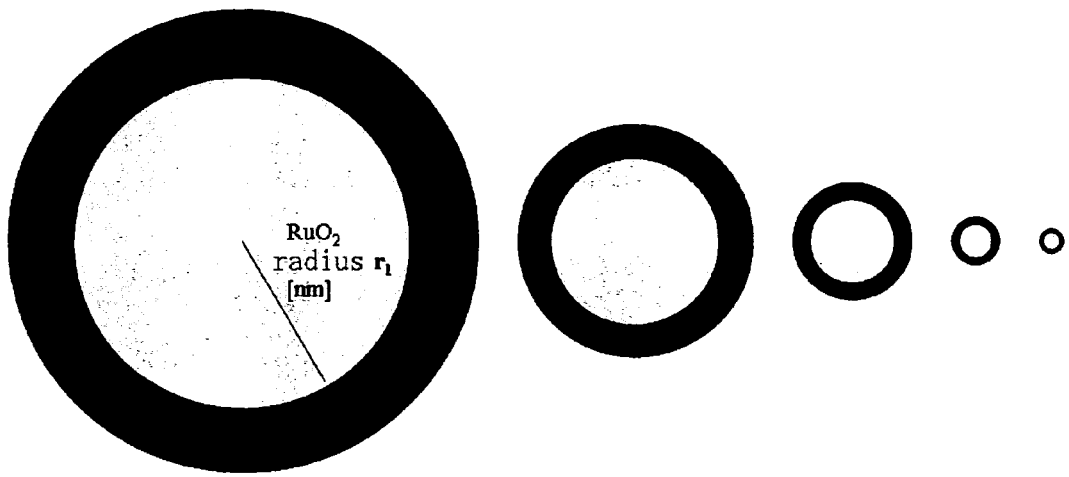
FIG. 37 is an illustration for explaining sizes of the energy nano-beads.

Assuming the radius of the ruthenium oxide nano-particle to be r1, a value of the radius r1 is varied from 2 nm to 1 μm (see FIG. 37).

It is here assumed that the ruthenium oxide nano-particle has a radius r1 nm, a volume $V_1$ I, a theoretical specific capacity C1 Ah/I, and a density d1 $gcm^{-3}$.

A conducting polymer combined with the ruthenium oxide nano-particle is assumed to have a film thickness r1 to r2 nm, a volume $V_2$ I, a theoretical specific capacity C2 Ah/I, and a density d2 $gcm^{-3}$.

Figure 38:
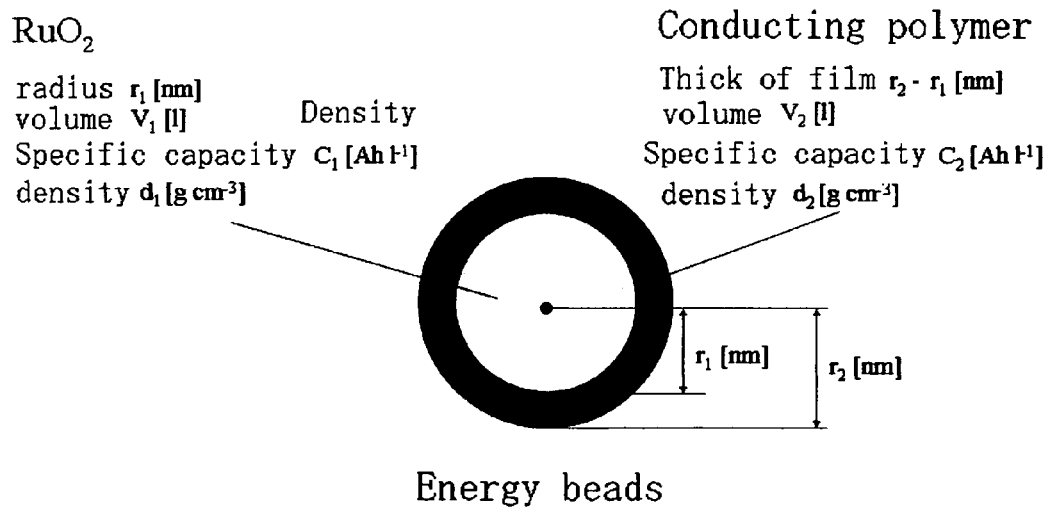
FIG. 38 is an illustration for explaining theoretical calculations of energy density and power density of the energy nano-beads.
Figure 39:
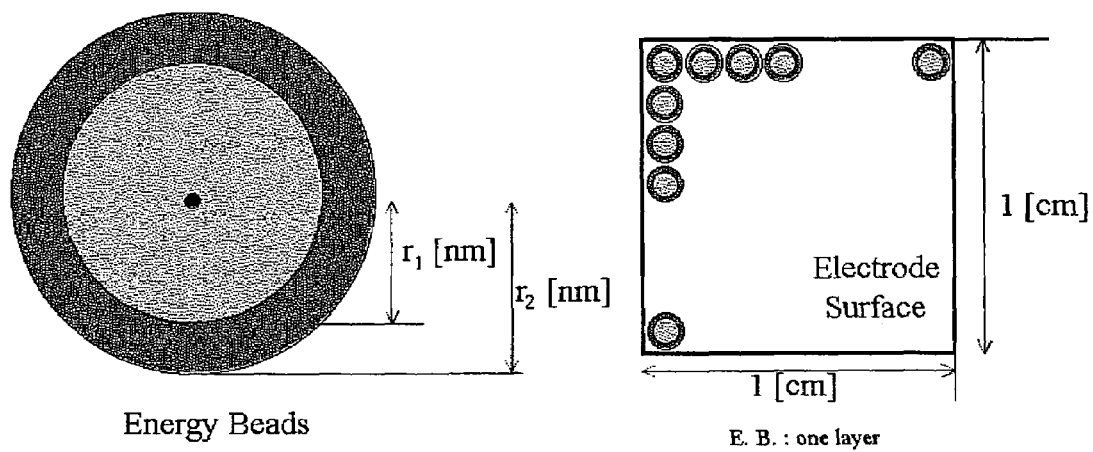
FIG. 39 is an illustration for explaining calculations of specific capacity and energy/power density of the energy nano-beads.

The calculations are executed such that a ratio of the specific capacity obtained with the metal oxide to the specific capacity obtained with the conducting polymer is 1 (see FIGS. 38 and 39).

Figure 40:
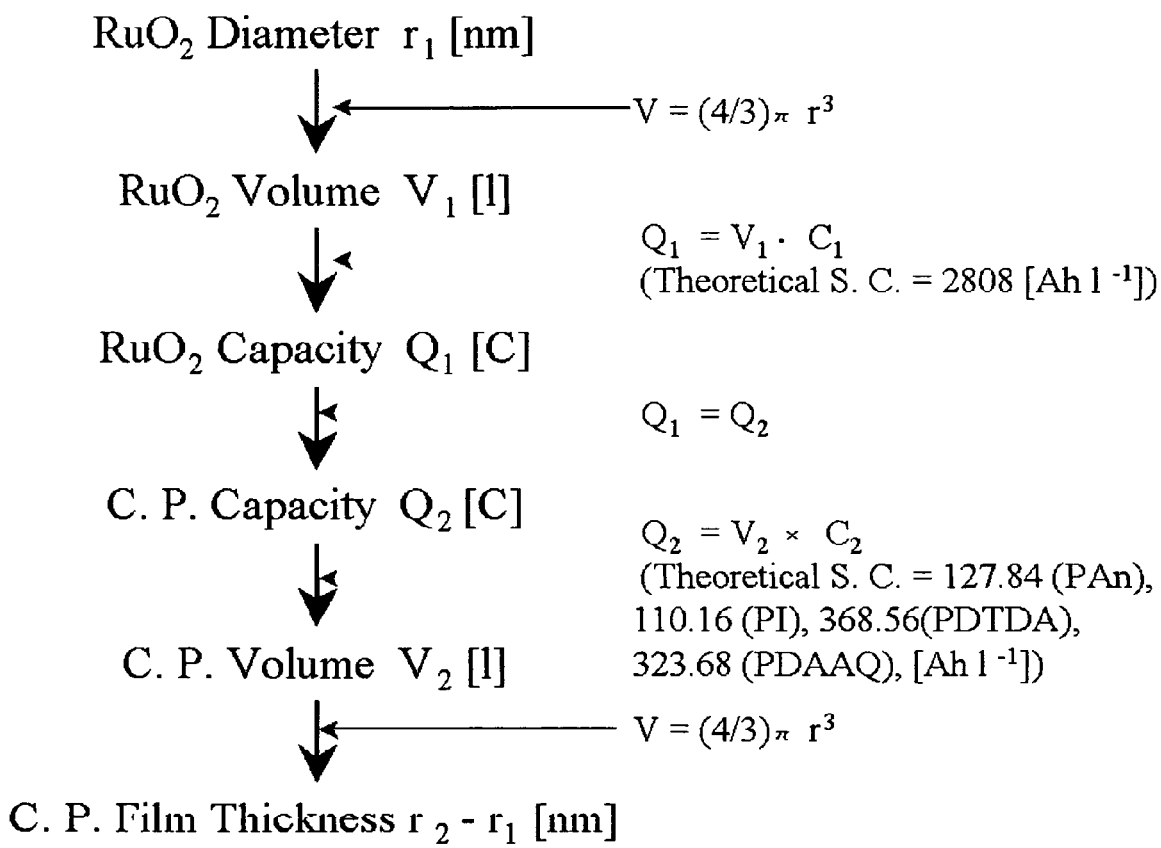
FIG. 40 is an illustration for explaining calculations of specific capacity, energy and power of the energy nano-beads.

The energy density is theoretically calculated in an assumption of an energy bead film in which the energy beads are arranged in a monolayer at a maximum packing density on an electrode having a size of 1 cm×1 cm (see FIG. 40).

Results of the theoretical calculations are as follows. For the purpose of comparison, the following description also includes results obtained from similar calculations made for polyindole (PI), poly-dithiodianiline (PDTDA), and poly-1, 5-diaminoanthraquinone (PDAAQ), which are proposed as materials for electrochemical capacitors in addition to polyaniline.

The capacity of the nano-beads obtained from each material is increased as the size of the ruthenium oxide particles serving as nuclei increases. The reason is that the larger the particle radius, the larger is a total volume of the ruthenium oxide particle and the conducting polymer, and that the product of the total volume by the theoretical specific capacity per unit volume represents the capacity on the basis of theoretical calculations.

Figure 41:
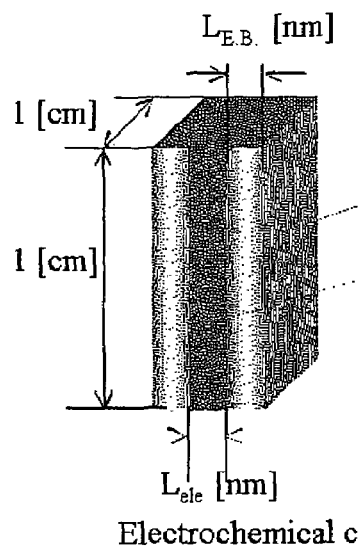
FIG. 41 is an illustration for explaining theoretical calculations of energy density and power density of the energy nano-beads.

The energy density is a value intrinsic to a material and hence does not depend upon the particle diameter (see FIG. 41).

The power density is drastically increased in three-digit magnitude at maximum as the particle diameter decreases from 1 μm to 2 nm (see FIG. 42).

The energy nano-composite material as the new electrochemical capacitor material having those features can be produced as follows. First, the ruthenium oxide particles serving as nuclei of the energy nano-beads are prepared. Then, very thin films of polyaniline in nano order are formed around the ruthenium oxide particles with polymerization. The energy nano-beads can be thereby produced.

Also, nano-beads having a peculiar three-dimensional structure can be produced by coating a thin film of DAAQ around an acetylene black structure serving as a nucleus. In this case, when producing the nano-composite, the process of forming an electrode with the produced nano-beads is also important in addition to the production of the nano-beads themselves. The energy density, the power density, and the cycle characteristics can be freely controlled by changing parameters used in the production process of the nano-beads, such as the weight ratio of DAAQ to acetylene black and the volume utilization rate in the process of forming the electrode. It is therefore possible to realize material design in match with individual objects, to construct energy storage devices capable of being used to various applications, and to provide an advantageous value in practical industrial uses.

Proton-exchangeable ionic conductive high molecules have a feature that the cycle stability is high in an acidic aqueous solution. On the other hand, metal oxides have a feature that the specific capacity per unit volume is high. The proton-exchangeable ionic conductive high molecules and the metal oxides have a common feature in that reduction/oxidation reactions occur in the redox steps. By compounding the proton-exchangeable ionic conductive high molecules and the metal oxide into the nano-composite, a novel material can be produced which has various features, i.e., i) the nano-composite effectively incorporates the advantages of both the start materials that the cycle stability is high and the specific capacity per unit volume is high; namely the nano-composites have a high energy density and a high cycle characteristic, ii) both the proton-exchangeable ionic conductive high molecules and the proton-exchangeable metal oxide cause electron shift and proton exchange in the redox steps, and therefore when they are combined with each other, an increase of the electron mobility and the proton exchange rate, i.e., a high power density, is expected due to the electrode catalysis action at the interface between both the materials, iii) because, by compounding both the materials in nano order, the contact area at the interface is increased in comparison with simple compounding of both the materials, the novel material has advantages in physical characteristics (mechanical strength), chemical characteristics (thermal stability) and electric characteristics (electric conductivity), and iv) a nano-composite film is a material being superior in electronic conductivity as well to the metal oxide sole system.

During the polymerization, monomers are trapped and remain in produced oligomers, thus causing a reduction in percentage of active sites. The number of monomers trapped can be reduced by reducing the film thickness of the organic conductive material.

For example, 1,5-diaminoanthraquinone (DAAQ) has a large number of reactive electrons, i.e., three electrons, per molecular weight, and therefore its theoretical specific capacity (241 Ah/kg) is 3 to 5 times as high as those of polyaniline (71 Ah/kg) and polypyrrole (54 Ah/kg) which are general conducting polymers. Also, since DAAQ exchanges a proton as an ion having the smallest size and has quinone groups and amino groups, the intra-molecule interaction is caused and a high power density is obtained. Further, because of the presence of π-π stacking and isotropic expansion/contraction in the process of proton exchange, DAAQ has a higher cycle characteristic of 100,000 or more times than polyaniline (25,000 or more times) that is not isotropic. While DAAQ is a compound having such superior characteristics, there is a problem that the specific density after electrolytic polymerization is as low as 50 Ah/kg and hence the utilization rate is low, i.e., about 20%. The reason is presumably in that, during the polymerization. DAAQ monomers are trapped and remain in the produced oligomers, thus causing a reduction in percentage of active sites. In view of the above, the film thickness of DAAQ is decreased to reduce the number of monomers trapped.

The term "nano-particle" means a particle having a size in the range of about 1 to 100 nm and represented by ultra-fine particles of metals, ceramics, etc., biological substances such as virus and DNA, and novel chemical substances such as fullerenes, carbon nano-tubes and dendrimers. The nano-particle exhibits peculiar properties in itself and, in addition, a system in which the nano-particles are dispersed, i.e., a nano-composite exhibits advantageous features that, because of particles being very small, a total area of the interface between a matrix and particles is drastically increased even at a low concentration, and the distance between the particles is remarkably reduced, whereby the inter-particle reaction is remarkably enhanced. Thus, the nano-composite has superior performance breaking through the common knowledge of known composite materials.

When producing the nano-composite, energy at the contact interface between hetero materials is reduced so as to increase affinity between both the materials. A polymer-base nano-composite can be produced, for example, by a process of intercalating monomers into a layered structure and polymerizing them, an interlayer inserting process of directly intercalating polymers into a layered structure, a sol-gel process, a solution mixing process, a fusion mixing and kneading process, or an ultra-fine particle direct dispersion process of mixing the materials after increasing affinity between the materials. In many cases, the nano-composite is compounded using any of those processes.

In practical use of electrochemical capacitors, it is required to increase the energy density and the power density, and to prolong the service life of the electrochemical capacitors. An electrochemical capacitor employing a conducting polymer has a smaller density per unit volume, is inexpensive, and is friendly to environments, while its cycle characteristic is inferior to that of other types of electrochemical capacitors. Also, since the ionic conductivity of a conducting polymer film is low in bulk, the power density must be increased by increasing both the ionic conductivity and the electronic conductivity of the conducting polymer film. Regarding the energy density, its value is intrinsic to the material, and hence a higher utilization rate must be pursued. For those reasons, inorganic and organic materials are compounded in anticipation of physical properties that cannot be achieved with the inorganic or organic sole system, or in pursuit of the effect beyond simple addition of the respective properties. As to compounding at a nano level, it is already known that, because of particles being very small, a total area of the interfaces between particles and a matrix is drastically increased and the distance between the particles is remarkably reduced, whereby the inter-particle interaction is remarkably enhanced. It is therefore possible to construct a material having more excellent properties in physical characteristics such as mechanical strength, chemical characteristics such as thermal stability and electric characteristics such as electric conductivity, instead of simple addition of the respective properties of the nucleus and the conducting polymer thin film. Novel materials having different values of the energy density, the power density and the cycle characteristic can be constructed by controlling parameters, e.g., the bead size and the weight ratio of the inorganic material and the organic redox material in the production process of the energy nano-structure beads.

The present invention will be described in more detail below in connection with Examples. Note that the present invention is in no way restricted by the following Examples.

EXAMPLE 1

Production of Nano-Beads of Acetylene Black/1,5-Diamino-Anthraquinone

In producing the energy nano-structure beads, novel materials having different values of the energy density, the power density and the cycle characteristic can be constructed by controlling parameters, e.g., the bead size and the weight ratio of the carbon material and the organic redox material. To obtain the materials advantageous in the energy density, the power density and the cycle characteristic, therefore, it is a very important factor to optimize the nano-beads of acetylene black/1,5-diaminoanthraquinone.

In this Example, nano-beads were produced which had small diameters and were made of acetylene black serving as nuclei uniformly coated with 1,5-diaminoanthraquinone as the organic redox material. Also, in this Example, the nano-beads were produced through processes of controlling the surface potential of the acetylene black with measurement of the $\zeta$ potential, measuring the particle diameter of the acetylene black, and carrying out chemical polymerization with ultrasonic waves.

<<Reagents and Measuring Apparatus>>

As reagents, 1,5-diaminoanthraquinone (DAAQ) made by Tokyo Kasei Kogyo Co., Ltd., tetraethylammonium perchlorate (TEAP) available as Wako Reagent Grade from Wako Pure Chemical Industries, Inc., trifluoro-acetic acid ($CF_3COOH$) available as Shika Reagent Grade from Kanto Kagaku Corporation, propylene carbonate (PC) made by Mitsubishi Chemical Corporation, ammonium peroxodisulfate available as being Reagent Grade from Kanto Kagaku Corporation, iron sulfate (II)-7 hydrates available as Wako Reagent Grade from Wako Pure Chemical Industries, Inc., methanol available as Wako Extra-Pure from Wako Pure Chemical Industries, Inc., and acetylene black available as Denka Black from TDK Electronics Co., Ltd. were used as they were.

The zeta potential and the particle diameter were measured using Laser Zeta Potential Meter ELS-8000 made by Otsuka Electronics Co., Ltd. A He—Ne laser of 10 mW with a power source voltage of 80 V was used as a light source, and the measurement was controlled using DELL OPTIPLEX GX1. Chemical polymerization with ultrasonic waves was carried out using an ultrasonic cleaner IKEDA RIKA UC-3.

<<Creation of Reaction Field>>

Dispersion Stability—Measurement of $\zeta$ Potential—

When an electric field is applied to a solution containing charged small particles such as colloids, the colloids in a solid phase move in the static solution. This phenomenon is called electrophoresis that is greatly affected by an electric double layer formed at the solid phase-solution interface. In the electric double layer formed at the solid phase-solution interface, one of the two phases is charged to be positive or negative and the other is charged to be negative or positive depending on the system. Generally, one phase having a higher dielectric constant than the other phase is charged to be positive relative to the other phase. When an electric field is applied in such a situation, a part of the solution containing several molecule layers in contact with each colloidal particle is adsorbed onto the colloidal particle and cannot move, while the other part of the solution outside the several molecule layers is movable. However, viscosity of the solution causes a moving speed distribution, and there appears a plane at which the moving speed is zero. This plane is called a sliding plane. The potential of the sliding plane with respect to a part of the solution away from the particle surface is called a zeta ($\zeta$) potential or an interface electrokinetic potential.

In this embodiment, the $\zeta$ potential was evaluated, for example, by using a laser Doppler method of irradiating a laser beam to the colloidal particles under the electrophoresis and measuring the particle mobility based on resulting scattered light.

<<Experiments>>

As solutions for the measurement, the following ones were employed:

i) a propylene carbonate solution containing 0.1 M tetraethyl-ammonium perchlorate (TEAP), 0.05 M trifluoroacetic acid ($CF_3COOH$) as a proton source, and 0.05 g/l of acetylene black, ii) a propylene carbonate solution containing 0.1 M TEAP, 0.1 M $CF_3COOH$ as a proton source, and 0.05 g/l of acetylene black, iii) a propylene carbonate solution containing 0.1 M TEAP, 0.5 M $CF_3COOH$ as a proton source, and 0.05 g/l of acetylene black, and iv) a propylene carbonate solution containing 0.1 M TEAP, 1.0 M $CF_3COOH$ as a proton source, and 0.05 g/l of acetylene black.

After bringing each of those solutions into a sufficiently dispersed condition under irradiation of ultrasonic waves, the solution was put in a measurement cell (standard) and the $\zeta$ potential was measured.

<<Results and Reviews>>

Figure 1:
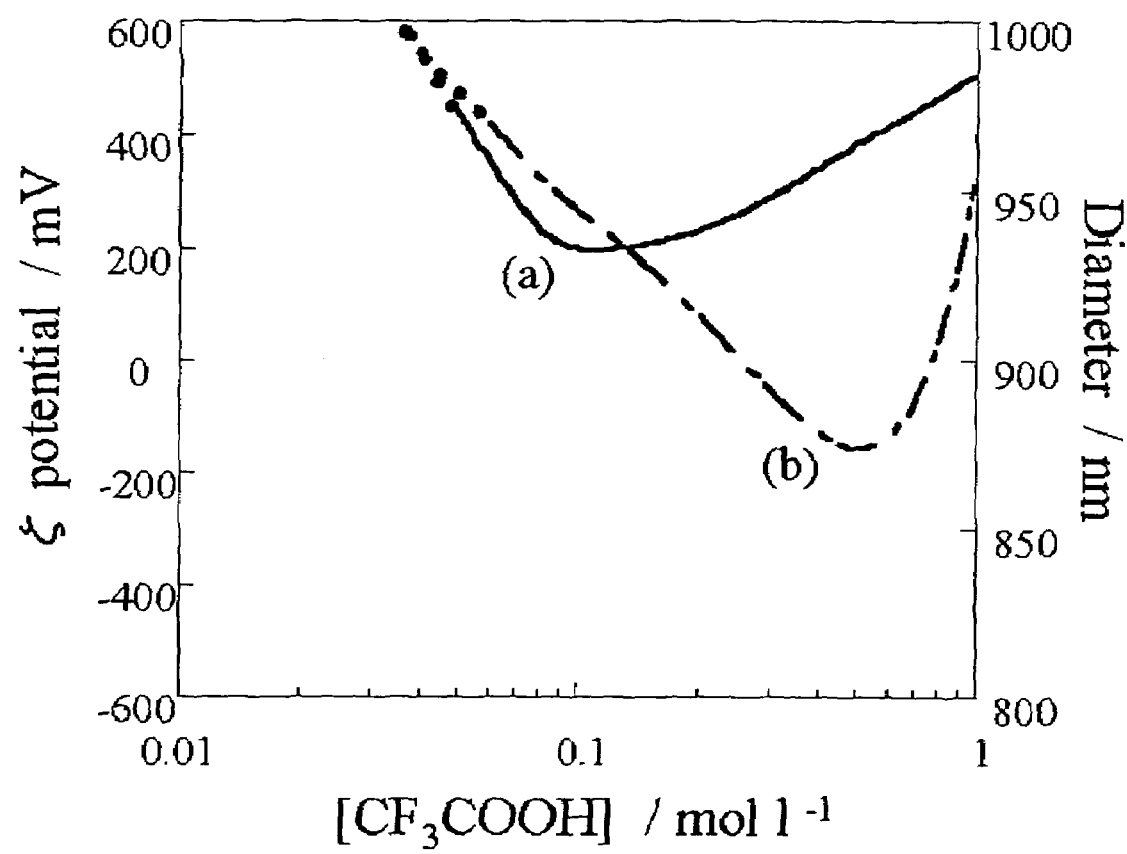
FIG. 1 is a graph in which a curve (a) represents dependency of $\zeta$ potential upon proton density in an acetylene black dispersed solution, and a curve (b) represents dependency of mean particle diameter of acetylene black upon proton density in a solvent.
Figure 2:
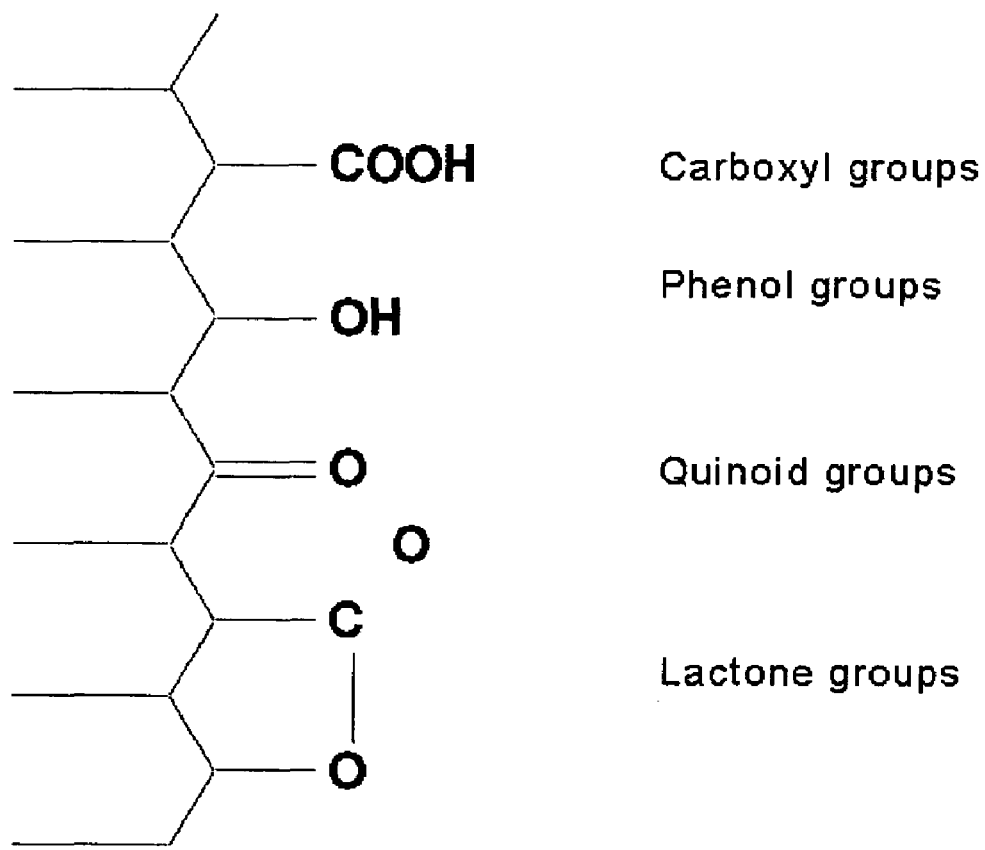
FIG. 2 is an illustration showing typical surface functional groups of the acetylene black.

In FIG. 1, a curve (a) represents dependency of the $\zeta$ potential upon the proton density in the acetylene black dispersed solution. The $\zeta$ potential was 441 mV in the system containing 0.05 M $CF_3COOH$, 193 mV in the system containing 0.1 M $CF_3COOH$, 384 mV in the system containing 0.5 M $CF_3COOH$, and 509 mV in the system containing 1.0 M $CF_3COOH$.

It is known that an absolute value of the $\zeta$ potential is one of indices for measuring the dispersion stability of collide particles in a solution. Generally, it is also known that when the ζ potential is in the range of +20 mV to −20 mV, the colloidal particles are in a cohesive condition and when the absolute value of the ζ potential is in excess of the range, the colloidal particles are in a dispersed condition. In the above-mentioned systems, therefore, the colloidal particles are held in a dispersed condition at any proton density.

Also, the reason why the ζ potential varies with changes of the pH value presumably resides in that different surface charges occur depending on the pH value. Main causes for generating surface charges are dissociation of surface functional groups present on the acetylene black surface and adsorption of ions. Typical surface functional groups of acetylene black are radicals containing oxygen, hydrogen and other atoms, such as a quinone group, a hydroxy group, and a carboxyl group [see Yoshimi Ishizuka, "Denchi Gijutu (Cell Technology)", 12, 187 (2000)]. The degree of those functional groups greatly depends on the pH value, and hence the surface charges differ depending on the pH value. It is therefore thought that the surface functional groups greatly affect the ζ potential and the charges at and near the acetylene black surface.

Further, the ζ potential being a positive value suggests that there is an atmosphere charged with positive charges near the acetylene black surface relative to a bulk portion of the solution.

However, because the dispersion stability is greatly affected by a solvent and coexisting ions as well, perfect reviews cannot be obtained only based on the ζ potential.

Measurement of Particle Diameter

<<Experiments>>

As solutions for the measurement, the following ones were employed as with the measurement of the ζ potential described above:

i) a propylene carbonate solution containing 0.1 M tetra-ethyl-ammonium perchlorate (TEAP), 0.05 M trifluoroacetic acid ($CF_3COOH$) as a proton source, and 0.05 g/l of acetylene black, ii) a propylene carbonate solution containing 0.1 M TEAP, 0.1 M $CF_3COOH$ as a proton source, and 0.05 g/l of acetylene black, iii) a propylene carbonate solution containing 0.1 M TEAP, 0.5 M $CF_3COOH$ as a proton source, and 0.05 g/l of acetylene black, and iv) a propylene carbonate solution containing 0.1 M TEAP, 1.0 M $CF_3COOH$ as a proton source, and 0.05 g/l of acetylene black.

After bringing each of those solutions into a sufficiently dispersed condition under irradiation of ultrasonic waves, the solution was put in a measurement cell (standard) and the particle diameter was measured. Also, for iii) a propylene carbonate solution containing 0.1 M TEAP, 0.5 M $CF_3COOH$ as a proton source, and 0.05 g/l of acetylene black, the particle diameter was measured after leaving the solution to stand for a time of 0, 10, 25 and 50 minutes subsequent to the irradiation of ultrasonic waves.

<<Results and Reviews>>

In FIG. 1, a curve (a) represents dependency of the ζ potential upon the proton density in the acetylene black dispersed solution. A curve (b) represents dependency of the particle diameter of acetylene black upon the proton density in a solvent.

As seen from the curve (b) in FIG. 1 representing dependency of the particle diameter of acetylene black upon the proton density in a solvent, the particle diameter was 980 nm in the system containing 0.05 M $CF_3COOH$, 945 nm in the system containing 0.1 M $CF_3COOH$, 873 nm in the system containing 0.5 M $CF_3COOH$, and 953 nm in the system containing 1.0 M $CF_3COOH$.

Here, the particle diameter was measured by observing changes in the intensity of scattered light from colloidal particles in the Brownian movement and determining a diameter value based on the correlation between the particle diameter and the observed intensity changes on an assumption that the particles are perfectly spherical. On the other hand, the acetylene black has a structure made up of primary particles coupled with each other in a moniliform shape. Strictly speaking, therefore, the measured particle diameter differs from the actual particle size of the acetylene black.

When plural structures in a cohered state are coated with DAAQ under the same conditions, the volume of acetylene black per bead is too increased and such acetylene black hardly contributes to capacity produced in the redox process, thus resulting in a reduction of the specific capacity. This requires the structures to be dispersed in minimum units. Accordingly, the measured mean particle diameter can be thought, although differing from the actual mean particle size in a strict sense, as providing an index effective in confirming a degree of cohesion of the structures. Thus, the structures having a smaller mean particle diameter are regarded here as being dispersed in smaller units. In other words, since the unit of structures in a cohered state can be regarded to be minimum in the system containing 0.5 M $CF_3COOH$, nano-beads were produced by setting the proton density in the polymerization solution to 0.5 M.

Figure 3:
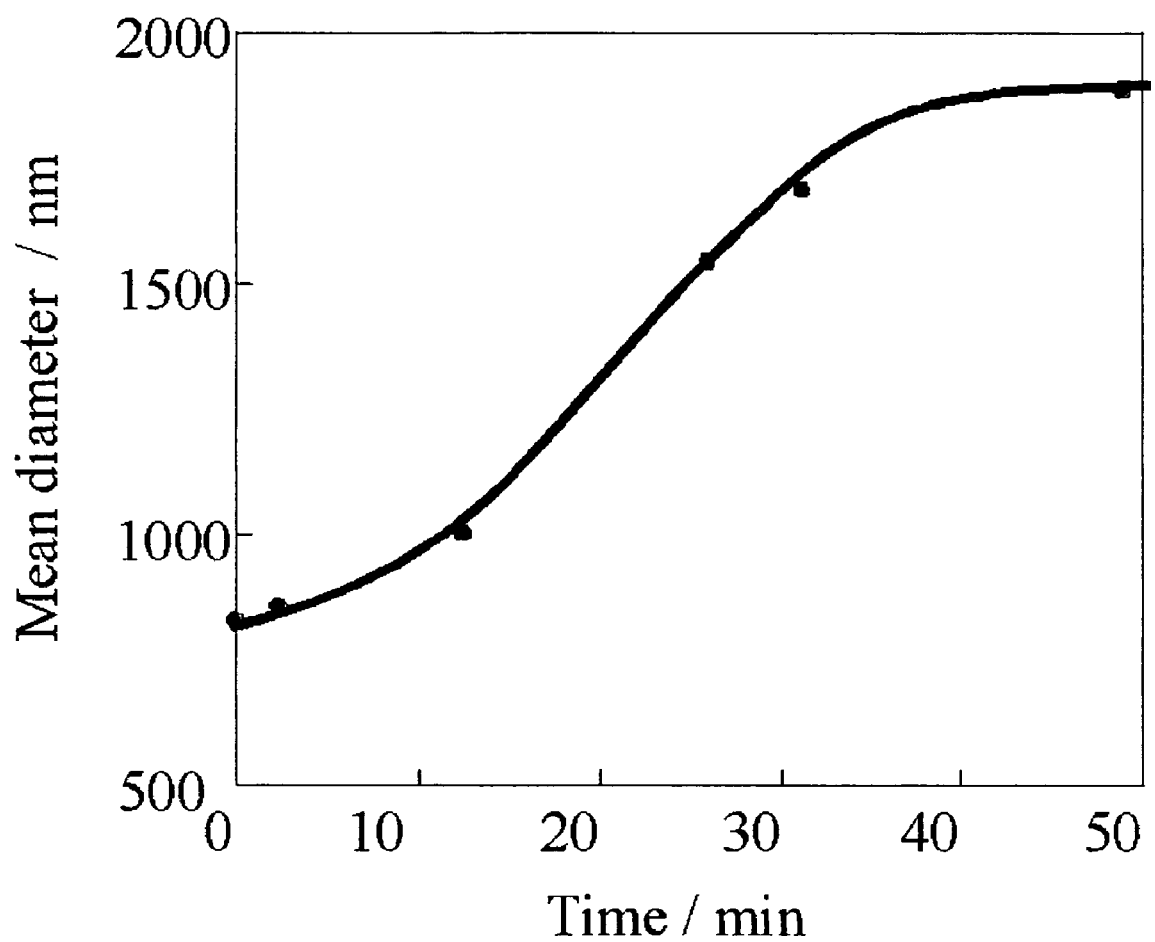
FIG. 3 is a graph showing changes with time in particle diameter of the acetylene black in a propylene carbonate solution containing 0.1 M TEAP and 0.5 M $CF_3COOH$.

FIG. 3 shows changes with time in particle diameter of the acetylene black in the propylene carbonate solution containing 0.1 M TEAP and 0.5 M $CF_3COOH$. The particle diameter measured at 0, 10, 25, and 50 minutes was 825 nm, 860 nm, 1550 nm, and 1885 nm, respectively. It was hence confirmed that acetylene black structures tend to cohere at a larger degree with the lapse of time.

From only the above result, it cannot be confirmed whether the chain structure of the acetylene black is developed two-dimensionally, or chains cohere with each other into aggregates. If the unit size of the acetylene black is too large, the acetylene black possibly precipitates in the polymerization solution. In such a case, a difficulty arises in coating DAAQ as a thin film around the acetylene black. Therefore, the acetylene black structure requires to be maintained as small as possible.

The cohesion of acetylene black cannot be completely avoided just by changing the proton density and thereby controlling the potential. It is hence required that, as means for preventing the cohesion of acetylene black, a physical measure, i.e., irradiation of ultrasonic waves be employed in combination with the chemical control of the ζ potential.

EXAMPLE 2

Characterization of Nano-Beads of Acetylene Black and 1,5-Diamino-Anthraquinone

The existence of the nano-beads produced in Example 1 was confirmed by characterizing the nano-beads.

More specifically, the bead structure was examined by observing the shape and surface geometries of the nano-beads with a transmission electron microscope, identifying the electronic structure with the ultraviolet—visible spectroscopic process (UV-vis spectroscopic process), identifying the primary structure with the infrared spectroscopic process (FT-IR), evaluating the lattice distance in the crystal structure with the X-ray diffraction process, and evaluating a weight ratio of acetylene black to 1,5-diaminoanthraquinone contained in the nano-beads with the thermogravimetric analysis (TGA).

<<Reagents and Measuring Apparatus>>

As reagents, 1-methyl-2-pyrrolidone available as one for peptide compounding from Wako Pure Chemical Industries, Inc., 1-buthanol available as being Reagent Grade from Wako Pure Chemical Industries, Inc., and potassium chloride (KCl) made by JASCO PARTS CENTER Co., Ltd. were used as they were.

H-700H made by Hitachi, Ltd. was used for the observation with a transmission electron microscope, and a microgrid made by Okenshoji Co., Ltd. was used for sample preparation. MULTI SPEC-1500 made by Shimadzu Corporation was used for the UV-vis measurement and COMPAQ DESKPRO was used for control of the UV-vis measurement. SYSTEM 2000 made by PERKIN ELMER Co. was used for the FT-IR measurement with a medium infrared light source and DTGS as a detector, and Digital DECpc 466D2LP was used for control of the FT-IR measurement. RAD-2X made by Rigaku Corporation was used for the XRD measurement with a counter cathode made of copper and a filter formed of a nickel foil under conditions of the tube voltage of 30 kV, the tube current of 20 mA, a divergent slit of 10, a light receiving slit of 0.3 mm, and a scattering slit of 10. TG/DTA 220 made by Seiko Electronic Industries Co., Ltd. was used for the thermogravimetric analysis, and DISK STATION SSC 5200H made by Seiko Electronic Industries Co., Ltd. was used for control of the thermogravimetric analysis. LARESTA-GP MCP-T600 made by Mitsubishi Chemical Corporation was used for the measurement of conductivity.

Particle Structure

Surface Geometries—Transmission Electron Microscope—

<<Experiments>>

A measurement sample was prepared by putting a very small amount of the nano-beads, produced with the ultrasonic chemical polymerization in Example 1, in 1-buthanol to form a disperse solution under irradiation of ultrasonic waves, coating the solution over the microgrid, and drying it in vacuum for about 24 hours. Another measurement sample was also similarly prepared using DAAQ alone produced with the chemical polymerization. The thus-prepared samples were observed by using a transmission electron microscope.

<<Results and Reviews>>

Figure 4:
FIG. 4 is a photograph showing an image of acetylene black/DAAQ nano-beads observed by using a transmission electron microscope (TEM).
Figure 4:
Figure 4:
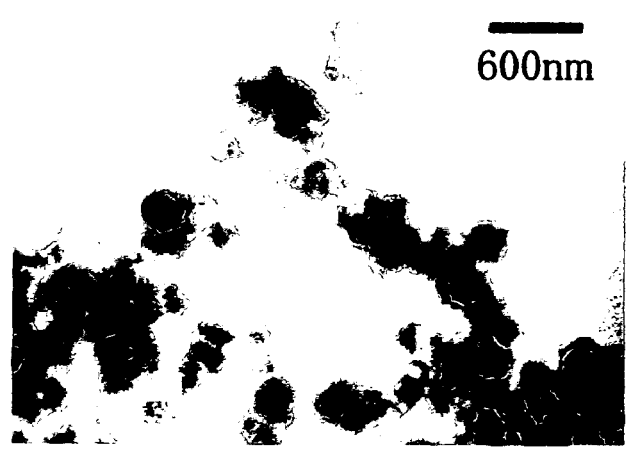

FIG. 4 is a photograph showing an image of the acetylene black/DAAQ nano-beads observed by using a transmission electron microscope (TEM). For the purpose of comparison, FIG. 4 also shows a TEM image of a DAAQ sole system similarly produced with the ultrasonic chemical polymerization. FIG. 4(a) is a TEM image of the DAAQ sole system observed at a magnification of 10,000, FIG. 4(b) is a TEM image of the acetylene black/DAAQ nano-beads observed at a magnification of 10,000, and FIG. 4(c) is a TEM image of the acetylene black/DAAQ nano-beads observed at a magnification of 60,000.

From comparison between FIGS. 4(a) and 4(b), it was observed that the composite nano-beads and the DAAQ sole system had shapes quite different from each other. The DAAQ sole system had a strip-like shape, while the acetylene black/DAAQ nano-beads had a shape formed by spherical primary particles cohering with each other. In other words, because the nano-beads are compounded with DAAQ . . . while maintaining the structure of acetylene black and a strip-like shape similar to that of the DAAQ sole system is not found in the nano-beads, all of DAAQ are thought as being coated on the acetylene black. The reason is presumably in that the reaction field created in Example 1 effectively contributes to realizing such a result. This can also be thought as suggesting that oxidants adsorb onto the acetylene black interface and monomers are selectively oxidized.

EXAMPLE 3

Electrochemical Characteristics of Acetylene Black/1,5-Diamino-Anthraquinone Nano-Beads The structure and characteristics of the nano-beads produced in Example 1, i.e., the acetylene black/1,5-diaminoanthraquinone nano-beads, were confirmed in this Example 2. To that end, a nano-composite film was formed by arranging the nano-beads into the form of an electrode. Then, the capacity development rate and other electrochemical characteristics of 1,5-diaminoanthraquinone in the nano-composite film were measured and compared with those of a DAAQ sole system and a system prepared by mechanically mixing the DAAQ sole system and an acetylene black sole system. Further, the electronic conductivity and the ion diffusivity generally regarded as developing in a rate-determining step in the redox reaction of conductive high molecules were measured for the nano-beads and the DAAQ sole system for comparison between them.

<<Reagents and Measuring Apparatus>>

As reagents, 1-methyl-2-pyrrolidone available as one for peptide compounding from Wako Pure Chemical Industries, Inc., tetraethyl-ammonium perchlorate (TEAP) available as Wako Reagent Grade from Wako Pure Chemical Industries, Inc., sulfuric acid available as being Reagent Grade from Kanto Kagaku Corporation, and a silicone admixture made by Toshiba Silicone Co., Ltd. were used as they were. Water used was secondary distilled water.

BAS 100B was used for cyclic voltammetry and GATEWAY 2000 P5-75 was used for control of the cyclic voltammetry. SI 1287 ELECTROCHEMICAL INTERFACE made by Solartron Co. and SI 1250 FREQUENCY RESPONSE ANALYZER made by Solartron Co. were used for measurement with the AC impedance method, and NEC PC-9801 was used for control of the AC impedance measurement.

Film Redox Response—Cyclic Voltammetry—

<<Experiments>>

First, electrodes were formed using the nano-beads produced in Example 1 and the DAAQ sole system. The electrodes were formed as follows. First, 10 wt % of tetraethylammonium perchlorate was dissolved in 1-methyl-2-pyrrolidone, and 15 wt % of the nano-beads were dispersed in a resulting solution. A disperse solution of the DAAQ sole system was also prepared in a similar manner. Each of the disperse solutions was pasted on a sheet of carbon paper and then dried in vacuum for about 12 hours. A measurement cell was constructed by employing the thus-obtained electrode as a working electrode, a silver/silver chloride (Ag/AgCl) filled with an aqueous solution of saturated sodium chloride as a control electrode, and a platinum winding as a counter electrode. The cyclic voltammetry was carried out at a sweep (scan) rate of 10 mV/s by using an aqueous solution of 4 $MH_2SO_4$ as an electrolytic solution.

<<Results and Reviews>>

FIG. 5(c) is a cyclic voltammogram of a nano-composite electrode made using the acetylene black/DAAQ nano-beads resulting from measurement in an aqueous solution of sulfuric acid within the potential range of −0.1 to 1.1 V vs. Ag/AgCl at the scan rate of 10 mV/s. For the purpose of comparison, FIGS. 5(a), 5(b) and 5(d) show respectively cyclic voltammograms of electrodes made of the DAAQ sole system, the mechanically mixed composite system of the acetylene black and the DAAQ sole system, and the acetylene black sole system.

One pair of peaks near about 750 mV were confirmed in the systems (a) and (b), while two pairs near about 500 mV (first peak) and about 650 mV (second peak) were confirmed in the nano-composite system (c). Regarding the nano-composite system (c), it is thought that proton exchange incidental to the redox (quinone/hydroquinone) reaction of quinone groups occurs at the first peak and doping/counter-doping of anions incidental to the redox (generation/extinction of polaron) reaction of the π-conjugate system occurs at the second peak. On the other hand, it is confirmed in DAAQ oligomers produced with electrolytic polymerization that the redox reaction of quinone and the redox reaction of the π-conjugate system occur substantially at the same potential, and that two peaks overlap with each other and hence appear as one peak. Regarding the systems (a) and (b), it is thought that overlapping of two peaks occurs for the same reason. Such a difference in the number of peaks is presumably attributable to that, as a result of compounding into the nano-composite system, the reaction rate in the entire electrode represented by the electronic conductivity and the ion diffusivity is increased to such an extent as causing peaks to not completely overlap with each other and to appear as two pairs. Furthermore, it is also conceivable that the standard reduction/oxidation potential E0 has varied in itself with a change of the electron state. As studied with the UV-vis. spectroscopic process in Example 2, however, it was confirmed that the nano-composite system also had the same electron state as the DAAQ sole system. Accordingly, a possibility of change in the E0 itself is thought as being low.

Figure 5:
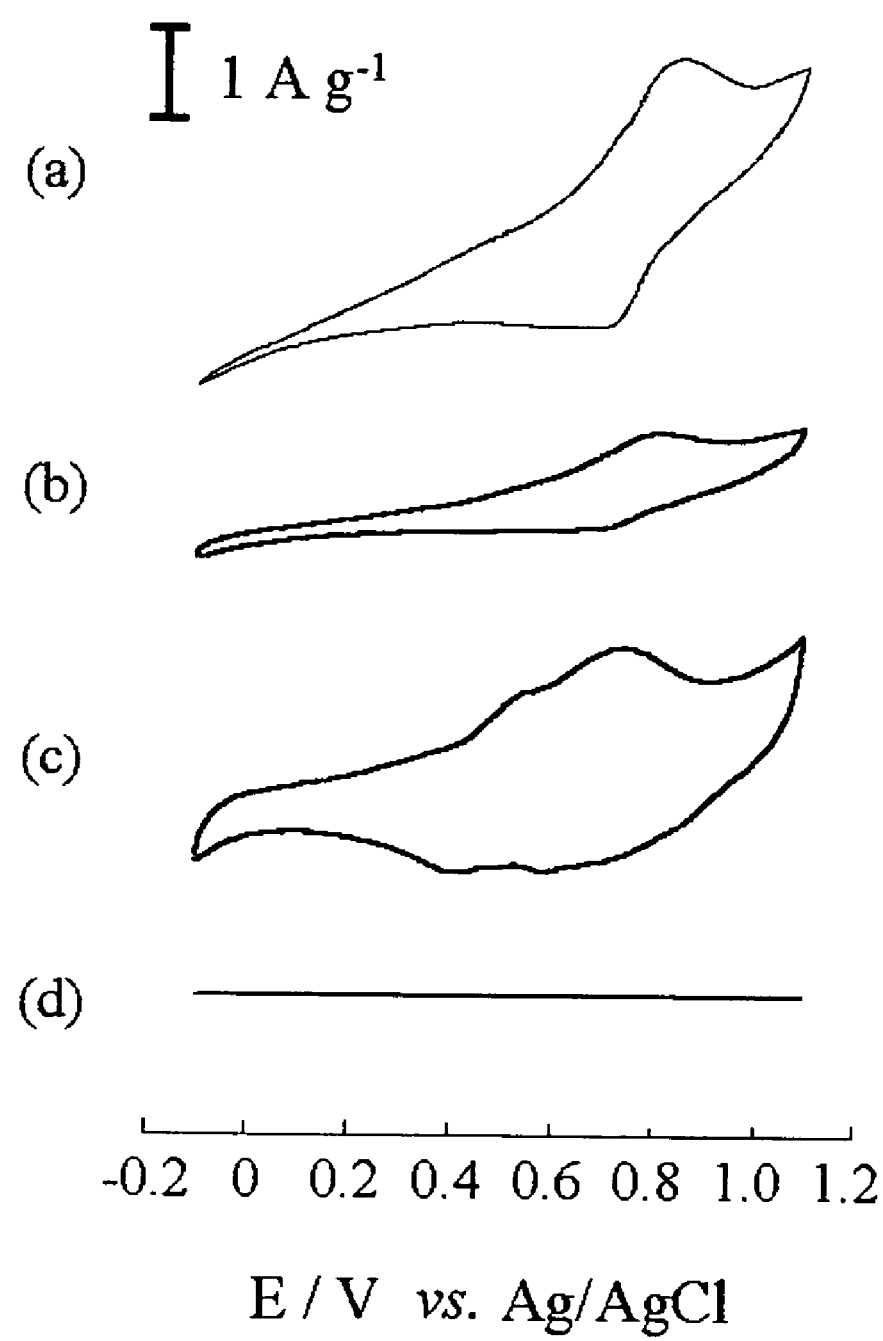
FIG. 5(c) is a cyclic voltammogram of a nano-composite electrode made using the acetylene black/DAAQ nano-beads resulting from measurement in an aqueous solution of sulfuric acid within the potential range of –0.1 to 1.1 V vs. Ag/AgCl at a sweep (scan) rate of 10 mV/s. For the purpose of comparison.
FIGS. 5(a), 5(b) and 5(d) show respectively cyclic voltammograms of electrodes made of a DAAQ sole system, a mechanically mixed composite system of the acetylene black and the DAAQ sole system, and an acetylene black sole system.

In addition, as seen from FIG. 5, the slope of waveform of the cyclic voltammogram increases in the order of the nano-composite system (c), the simple composite system (b), and the sole system (a). The waveform slope depends on the ohmic resistance of a composite film. More specifically, in the nano-composite system of structured acetylene black and DAAQ, electronic conducting paths are constructed and the electronic conductivity is increased, whereby the film resistance is reduced as compared with the sole system and the simple composite system. Such an increase of the electronic conductivity is also supported with the conductivity measurement in this Example.

Figure 6:
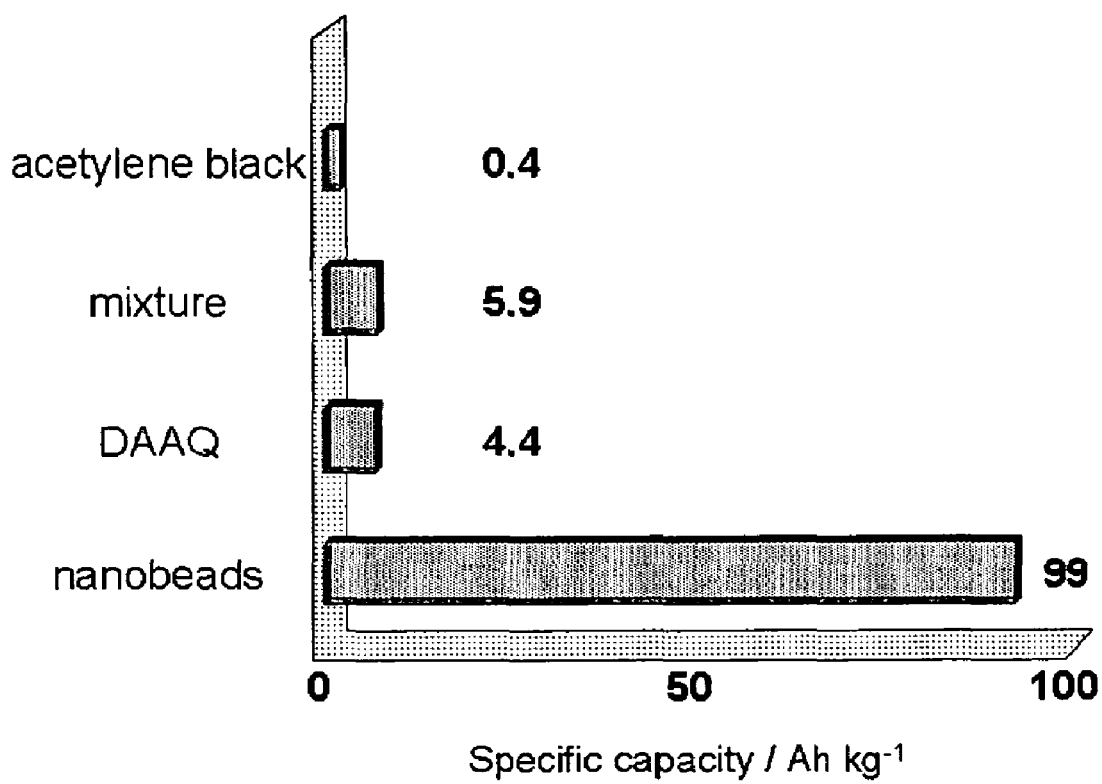
FIG. 6 is a histogram showing values obtained by integrating each cyclic voltammogram in FIG. 5 to calculate a reduction capacity and converting the reduction capacity into a value per unit mass of an active substance contained in the material.

FIG. 6 shows values obtained by integrating each cyclic voltammogram to calculate a reduction capacity and converting the reduction capacity into a value per unit mass of an active substance contained in the material. In the simple composite system, i.e., a mixture, of acetylene black and DAAQ, the specific capacity is slightly increased in comparison with that of the DAAQ sole system, but it can be said as being comparable. On the other hand, the specific capacity of the nano-composite system is increased about 17 times. This result is presumably attributable to the effect, such as an increase of the ion diffusivity and the electronic conductivity, obtained by forming thin films of DAAQ oligomers over the structured carbon.

SUMMARY OF EXAMPLES 1-3

In these Examples, attention was focused on, as an organic redox material, 1,5-diaminoanthraquinone (DAAQ) having the π-π stacking structure, exhibiting a smaller structure change with the redox reaction, and showing a high cycle characteristic over 100,000 cycles. DAAQ contains two redox species represented by quinone/hydroquinone and doping/counter-doping of the 1-conjugate system, has a large number of reactive electrons, i.e., three electrons, per unit weight, and therefore has a high specific capacity of 241 Ah/kg. In spite of those advantages, it is very important to increase a utilization rate of the high specific capacity. To that end, nano-beads were produced by forming thin films of DAAQ oligomers to cover acetylene black having a high electronic conductivity and having highly developed structures in a moniliform shape. Then, the nano-beads were evaluated with characterization for their electrochemical behaviors.

In Example 1, the nano-beads were produced with the ultrasonic chemical polymerization. First, acetylene black was physically dispersed under irradiation of ultrasonic waves in a propylene carbonate solvent containing tetra-ethylammonium as a support salt and trifluoro-acetic acid as an organic acid. By measuring the ζ potential of a resulting solution and particle diameters of the dispersed acetylene black, conditions for achieving the dispersion stability from the chemical point of view and providing the mean diameter of acetylene black structures as a minimum value were examined. As a result, it was confirmed that the optimum concentration of trifluoroacetic acid was 0.5 M. To control the reaction rate under that condition, the monomer concentration was set to a relatively low value, i.e., 0.01 M, that is 0.1 time the value set in the ordinary chemical polymerization of aniline and the solution was cooled with ices while irradiating ultrasonic waves to the solution maintain the disperse state from the physical point of view as well. Ammonium peroxodisulfate as an oxidant was dripped into a resulting polymerized solution. At that time, it was confirmed with the measurement of the ζ potential that the reaction field is controlled so as to charge the acetylene black surface to a positive potential and provide a maximum absolute value. It is therefore thought that a selective reaction field can be created by causing oxidants to be adsorbed onto the acetylene black surfaces by electrostatic forces. Thus, monomers were oxidized under such an uneven reaction field to produce radical cations, and DAAQ oligomers were created with coupling of the radical cations, whereby the acetylene black/DAAQ nano-beads, i.e., the objectives, were produced.

In Example 2, the nano-beads produced in Example 1 and the DAAQ oligomer sole system produced with ultrasonic chemical polymerization similar to that carried out in Example 1 were evaluated with characterization and compared. First, it was from a TEM image that the nano-beads were in the form of structures similar to those of acetylene black. On the other hand, the DAAQ sole system had a strip-like shape. This meat that the nano-beads and the DAAQ sole system had apparently different shapes. Then, to more closely study the nucleus surface, the electron state was examined using the UV-vis. spectroscopic process. The nano-beads were electrically active, had the same electron state as the DAAQ sole system, and exhibited peaks at 658 nm and 519 nm which belonged to the π-π*transition at polaron and quinone sites, respectively. Subsequently, the primary structure was confirmed with the FT-IR spectroscopic process. As a result, it was confirmed that the nano-beads and the DAAQ sole system had a similar primary structure and a peak attributable to DAAQ oligomers appeared. Further, with the XRD measurement, a crystal structure of about 8 Å was confirmed in both the nano-beads and the DAAQ sole system, and they had the π-π stacking structure. From those results of three kinds of characterization, it was thought the DAAQ oligomers were coated over the surface of acetylene black serving as nuclei. The weight of the coating DAAQ oligomers was measured with the TG analysis. The measured result suggested that a coating film of the DAAQ oligomers was very thin, i.e., that a weight ratio of DAAQ oligomers to acetylene black was 40:60 and a mean film thickness of the DAAQ oligomers was calculated to be about 0.3 nm. In addition, as a result of measuring the conductivity by the 4-probe method, the nano-beads had the conductivity of $5 \times 100 S\ cm^{-1}$ and the DAAQ sole system had the conductivity of $1 \times 10^{-65}\ cm^{-1}$. Thus, a remarkable increase of the electronic conductivity was confirmed with the acetylene black constituting skeletons of the nano-beads.

A nano-composite electrode was produced by dispersing the nano-beads obtained as mentioned above into NMP and casting the dispersed nano-beads onto a sheet of carbon paper. By using the electrode thus produced, a redox response of the nano-composite film was evaluated with the cyclic voltammetry and compared with that of the DAAQ sole system as with the characterization. A resulting CV (cyclic voltammogram) had a smaller slope than the DAAQ sole system. Thus, the electronic conductivity was increased with electron paths formed by the acetylene black and the film resistance was reduced. Further, one pair of peaks appeared in the DAAQ sole system, while two pairs of peaks appeared in the nano-beads. This result suggested an increase of the reaction rate in the entire electrode. For closer studies, the AC impedance measurement was carried out. The obtained cyclic voltammogram showed that E0' of the nano-beads was 500 mV and 700 mV. Comparing impedance characteristics near those values, the charge drift resistance at 500 mV was 14.19 $\Omega cm^{-1}$ for the DAAQ oligomer sole system produced with the ultrasonic chemical polymerization and it was 4.334 $\Omega cm^{-1}$ for the nano-beads. Also, the charge drift resistance at 700 mV was 0.8514 $\Omega cm^{-1}$ and 0.8129 $\Omega cm^{-1}$, respectively. The ion diffusion resistance at 500 mV was 1038 $\Omega cm^{-1}$ for the DAAQ oligomer sole system produced with the ultrasonic chemical polymerization and it was 380.1 $\Omega cm^{-1}$ for the nano-beads. Further, the ion diffusion resistance at 700 mV was 136 $\Omega cm^{-1}$ and 28.98 $\Omega cm^{-1}$, respectively. Thus, the charge drift resistance and the ion diffusion resistance were both reduced in the nano-beads. This result is presumably attributable to that the DAAQ oligomers are coated as thin films over the acetylene black structures having a high electronic conductivity and electron conducting paths are formed. A rate-determining step in this reaction system is thought as being the ion diffusion step. Particularly, with an increase of the ion diffusion in the rate-determining, the redox capacity was increased, whereby the specific capacity of the nano-beads per unit mass of the active substance was increased to 99 Ah/kg and the utilization rate was increased to 41% from about 20% in the past.

Additionally, the power density and the energy density of this novel material can be controlled by changing the weight ratio of DAAQ oligomers to acetylene black per bead, and hence this novel material is expected as a material adapted for various industrial applications.

EXAMPLE 4

Compounding of Nano-Beads of Ruthenium Oxide Hydrate

In order to produce an energy nano-material, it is essential to first produce energy nano-beads as a minimum component unit. To produce the energy nano-beads, ruthenium oxide serving as nuclei of the beads must be produced and polyaniline must be polymerized in the form of very thin films in nano order around the ruthenium oxide.

Therefore, ruthenium oxide nano-particles were first produced.

The following is generally said regarding the production of inorganic fine particles such as ruthenium oxide nano-particles.

A method for producing those inorganic fine particles is primarily divided into three processes, i.e., a gas phase reaction, a solid phase reaction, and a liquid phase reaction. Of these processes, a more versatile process is the liquid phase reaction. The liquid phase reaction is an energy-saving process that requires neither high temperature nor high pressure. For that reason, the liquid phase reaction was employed in this Example.

With the liquid phase reaction, particles are generally produced from a solution containing a start material (hereinafter referred to as a "solute") through a process given below.

i) The solute concentration is increased beyond the solubility to create a supersaturated state. At this time, solute ions are generated in the solution.

ii) The concentration of solute ions in the solution fluctuates so as to increase partially. The ions are caused to approach each other and form complex ions.

iii) The complex ions polymerize to form polynuclear complex ions. This polymerization reaction depends on temperature, concentration, and the kind of ion.

iv) The solute ions further polymerize with the polynuclear complex ions, or the polynuclear complex ions cohere with each other, thereby creating germs. This process is reversible.

v) The germs having sizes larger than a certain value through the above stage iv) become nuclei. This process is reversible.

vi) The solute ions diffuse and adsorb onto the nuclei surfaces. Then, the nuclei size is increased to a certain value and primary particles are created.

vii) The primary particles cohere with each other and are crystallized through ion replacement.

viii) When the concentration of the solute ions is reduced to a level required for creation of the nuclei, the nuclei creation is stopped. Only growth of the created nuclei continues until the concentration of the solute ions is reduced to the solubility thereof.

In the above stage v), the minimum size (critical particle diameter) of the nuclei depends on a degree of supersaturation and reduces as the degree of supersaturation increases. To produce the fine particles, therefore, the concentration of the solute ions must be increased to a level over the degree of supersaturation. When the nuclei creation period in the above stage v) is long, earlier created nuclei grow into larger particles than later created nuclei and particles having different sizes are generated. To avoid that drawback and produce uniform particles, it is required to prevent the particle growth during the nuclei creation period. However, because such a solution is difficult to control, it is required to increase the nuclei creation rate such that the nuclei are generated at the same time as close as possible, and to reduce the crystal growth rate in a subsequent period.

The crystal growth rate depends on (1) the concentration of the solute ions, (2) the diffusion rate of the solute ions toward the nuclei surfaces, and (3) frequency of collisions of the solute ions against the nuclei surfaces. In order to reduce the crystal growth rate, therefore, it is important to control those parameters, namely to reduce the concentration, the reaction temperature and the collision frequency of the solute ions. Further, an additive for interrupting adsorption of the solute ions can be used to prevent the solute ions from colliding against and adsorbing onto the nuclei surfaces. The crystal growth rate is reduced by adding, for example, amine, carboxylic acid or a surfactant, which form complexes in combination with metal ions. However, such an additive may remain in the produced particles and may impede the formation of pure particles. For that reason, no additives were used in this Example.

Further, to prevent cohesion of the produced crystals, it is required to (i) reduce the particle concentration, and (ii) stir the reaction system.

A description is now made of a procedure for compounding the ruthenium oxide nano-particles and means used in the compounding process.

<<Experiment 1>>

Water used in all steps was secondary distilled water. Reagents used in the experiment were ruthenium oxide-n hydrates [made by Kojima Chemical Reagents Co., Ltd.], a sodium hypochlorite solution [made by Kojima Chemical Reagents Co., Ltd.], methanol for use in electronic industries [made by Kishida Chemical Co., Ltd.], and hydrochloric acid [made by Kanto Kagaku Corporation].

Devices used here were an ultrasonic cleaner Sine Sonic 100 (made by Kokusak Denki Eltech Co., Ltd.), NEO COOL DIP BD22 (Yamato Scientific Co., Ltd.) for temperature control, and VR-320 VACUUM DRYING OVEN (made by ADVANTEC Co.) for vacuum drying and sintering.

The compounding procedure is as follows (see FIG. 7).

An aqueous solution of ruthenium chloride was adjusted to a predetermined concentration by using the secondary distilled water, and the pH value was adjusted to 2 by using the hydrochloric acid. Then, sodium hypochlorite was added to a resulting solution such that the pH value was held at 12 or more. A reductant was added to the solution under irradiation of ultrasonic waves, i.e., sonication. Products were purified with the water and, after suction and filtration, dried in vacuum at 30° C. Powder was thereby obtained.

$RuO_2 \cdot nH_2O$ was produced in accordance with the procedure described above.

Producing finer particles was intended by controlling diameters of the $RuO_2 \cdot nH_2O$ fine particles through selection of reaction conditions (for (1) reducing the crystal growth rate and (2) suppressing cohesion of the products) during the production of ruthenium oxide.

To that end, the following measures were employed.

Figure 7:
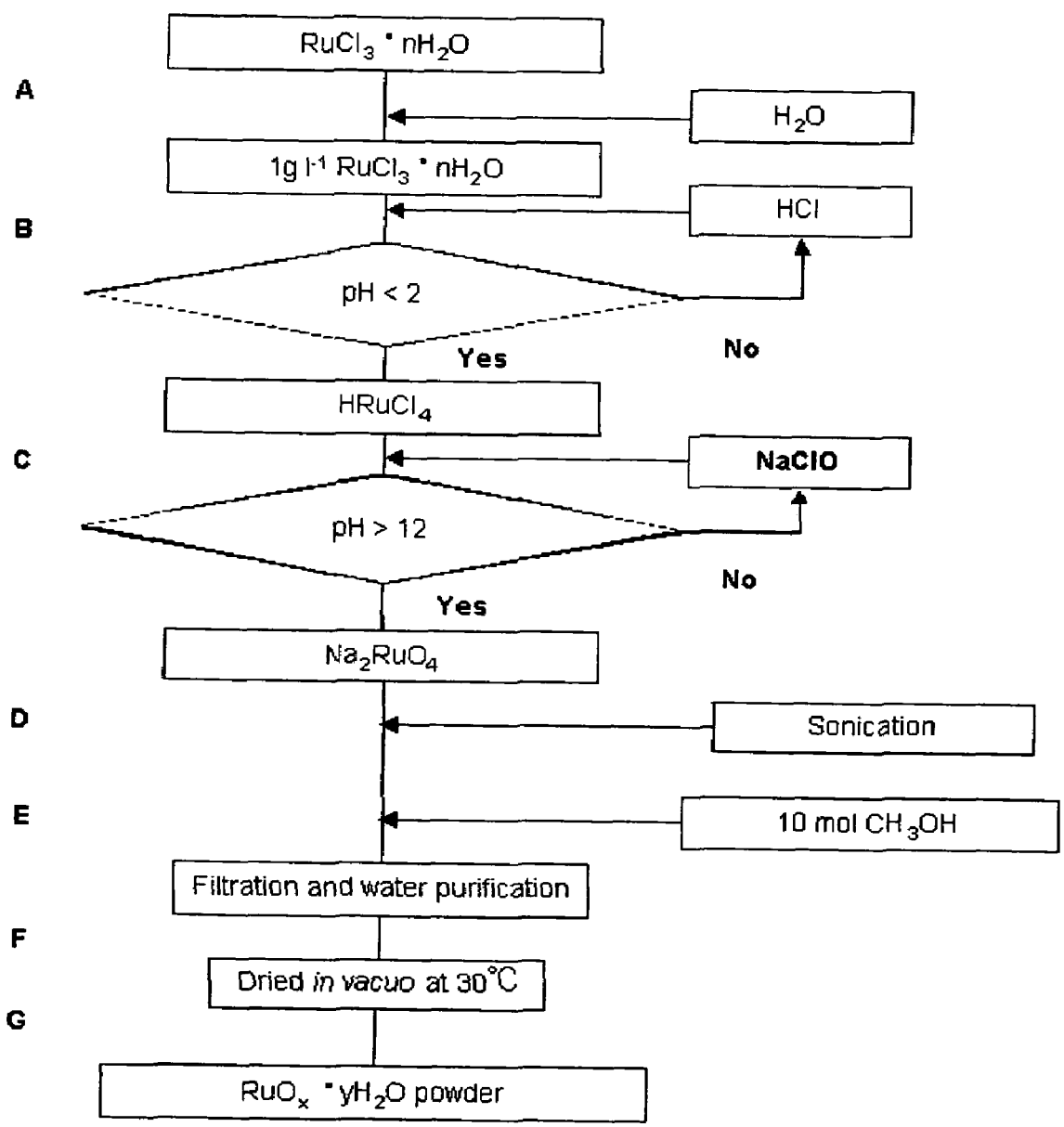
FIG. 7 is a chart showing steps of composing ruthenium oxide hydrate nano-beads.

In all of steps A-E in FIG. 7, the reaction temperature was controlled. The reason is that as reaction temperature lowers, cohesion of the products is more positively suppressed and the particle diameter of the product is slightly reduced. Another reason is to prevent the temperature of the reaction solution from rising to a level of about 60° C. because reaction heat is generated during the reduction of ruthenium and the temperature of the reaction solution rises to such a level if the reaction takes place at the normal temperature. In practice, a reaction tank was cooled with ices. However, the reaction heat was generated in the step E during the reduction of ruthenium and the temperature in the step E reached about 17° C. After the end of the reduction reaction, the solution temperature was returned again to the level under the state being cooled with ices.

In the step A, the concentration of ruthenium chloride as a start material was set to a supersaturated concentration. The reason is that, if the concentration of ruthenium chloride is set to a value much higher than the supersaturated concentration, the complex ions required for the nuclei creation are continuously generated even after the creation of a certain number of nuclei, and the concentration does not quickly reach a level of the solubility at which the creation of the complex ions is stopped. Another reason is that, generally, the higher the initial concentration of ruthenium chloride, the larger is viscosity of the reaction solution and the harder is uniform stirring. Since the ruthenium concentration in the range of 1 to 200 g/l is usually employed, the ruthenium concentration was set to 1 g/l in this Example.

In the step A, the ruthenium chloride hydrates were dissolved in a mixture of the water and the hydrochloric acid to form ruthenic acid instead of using only the water without the hydrochloric acid. If the ruthenium chloride hydrates are dissolved using only the water, the resulting ruthenic acid undergoes hydrolysis. In view of the above, the concentration of chlorine ions in the solution was set to a high level (pH=2) by using the hydrochloric acid.

In the step C, the pH value of the reaction solution was controlled. Generally, the pH value of the reaction solution can be set to the range from a weak acidic level to a strong alkaline level. However, the higher the pH value, the smaller is the particle diameter of the product. Also, if the pH value is too low, the reducing power of the reductant is too weak. It is hence usually desired that the reaction takes place at the pH value not smaller than 7. Therefore, the pH value of the reaction solution was adjusted to about 12 by using hypochlorous acid.

In the steps A-C, the reaction solution was stirred with a stirrer. There are various stirring methods. In the case of mixing a solid or liquid reagent and a liquid solvent with each other, however, using a stirrer is the simplest and highly effective method. Therefore, a stirrer was employed in the steps A-C.

In the subsequent steps, ultrasonic waves were used as the stirring method. The reason is that the ruthenium oxide fine particles are produced with the reduction of ruthenium in the step E and, at this time, it is required to avoid the ruthenium oxide fine particles from adhering with each other for reducing the particle diameters of the fine particles.

In the step E, the reductant was selected and the concentration and the addition rate were controlled as follows. As the reductant, one having reducing power as low as possible was selected. Acetone, ethylmethylketone, cyclohexane, acetophenone, methanol, amyl alcohol, benzyl alcohol, methoxyethanol, ethanol, etc. are usually employed as reductants in production of ultra-fine particles of metal oxides. Among those examples, methanol having a relatively low reducing power was used in the step E. Generally, it is known regarding the concentration of a reductant that the higher the concentration of a reductant, the smaller is the particle diameter of the product. However, if the concentration of a reductant is too high, the resulting effect is small and the cost is less efficient. The reductant is therefore employed in amount not smaller than the equivalent and in the range of 1 to 50 molar equivalents. With regards to the addition rate of a reductant, it is also generally known that the higher the addition rate of a reductant, the smaller is the particle diameter of the product. However, if the addition rate of a reductant is too high, the resulting effect is small. Further, if the addition rate is too slow, the reaction time is prolonged. For those reasons, 10 mol of the reductant was added at the rate of 300 ml/s in the step E.

Precipitates of the ruthenium oxide fine particles thus produced were purified and subjected to filtration, followed by drying in vacuum at 30° C. As a result, powder of the ruthenium oxide fine particles was obtained. Thus obtained nano-particles of the ruthenium oxide hydrates were annealed under vacuum at temperatures of 150° C. and 400° C. for a time of about 12 hours.

Characterization of Nano-Particles of Ruthenium Oxide Hydrates

The nano-particles of ruthenium oxide hydrates produced in Experiment 1 were closely evaluated for the surface potential and dispersivity by using a zeta potentiometer, the surface geometries and particle diameter by using a transmission electron microscope (TEM), the amount of hydrating water by using a thermogravimetric analyzer (TGA), the crystal structure by using an X-ray diffraction apparatus (XRD), and the electrochemical behaviors by using cyclic voltammetry.

<<Experiment 2>>

Samples subjected to characterization were as follows.

i) The nano-particles of ruthenium oxide hydrates produced in Experiment 1, but not yet annealed. This sample is referred to as $RuO_2.nH_2O$ (30° C.) hereinafter.

ii) The nano-particles of ruthenium oxide hydrates produced in Experiment 1 and annealed at predetermined temperatures (150° C. and 400° C.). These samples are referred to as $RuO_2.nH_2O$ (150° C.) and $RuO_2.nH_2O$ (400° C.) hereinafter.

iii) $RuO_2.2H_2O$ (made by Kojima Chemical Reagents Co., Ltd.) as a control for comparison.

As reagents, sodium n-dodecylbenzenesulfonate [made by Wako Pure Chemical Industries, Inc.], concentrated sulfuric acid [made by Kanto Kagaku Corporation, reagent grade], sodium sulfate [made by Kanto Kagaku Corporation], and sodium hydroxide [made by Kanto Kagaku Corporation] were used as they were.

The surface potential ($\zeta$ potential) and the particle diameter were measured using a laser $\zeta$ potentiometer ELS-8000 [made by Otsuka Electronics Co., Ltd.].

Water used in all steps was secondary distilled water.

An electron microscope H-700H made by Hitachi, Ltd. was used as the TEM. A film shot by the electron microscope was developed using a solution prepared in a predetermined volume by dissolving, in distilled water, COPINAL (made by Fuji Film Co., Ltd.) which is a developer for mini-copier films, and FUJIFIX (made by Fuji Film Co., Ltd.) which is an acidic hard-film fixative for monochromatic sensitized films.

Figure 8:
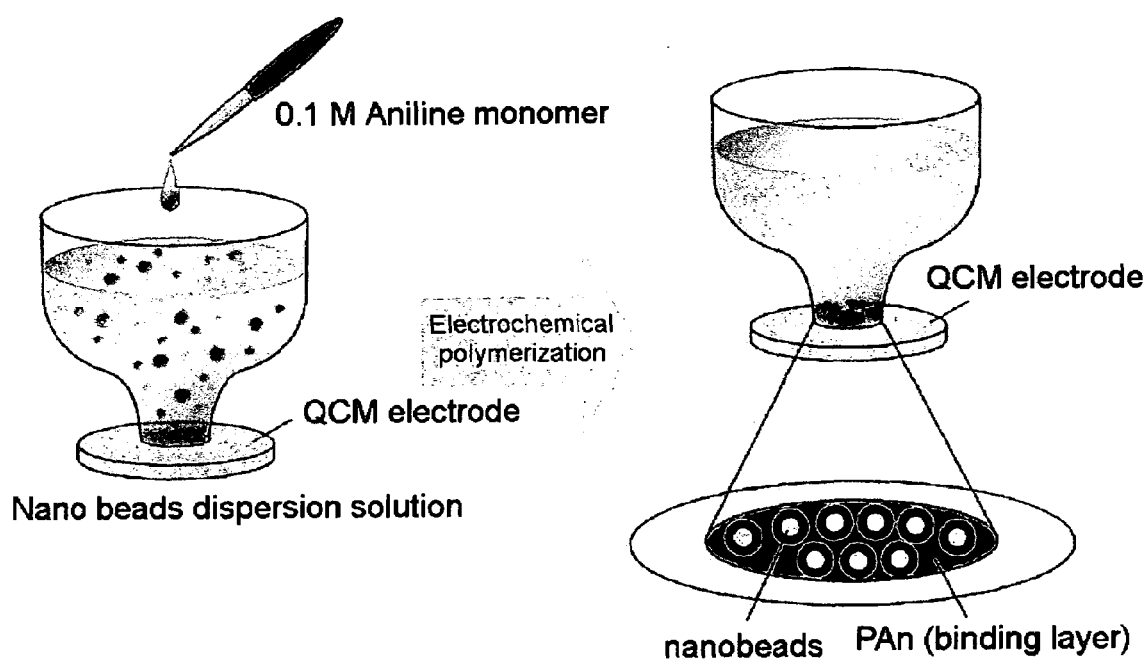
FIG. 8 is an illustration for explaining a method of dispersing ruthenium oxide hydrate nano-beads in a 4M sulfuric acid solution containing 0.1 M aniline monomer and fixing the nano-beads onto the electrode with sweep electrolytic polymerization by using polyaniline as a binder.

TG/DTA220 (made by Seiko Electronic Industries Co., Ltd.) was used for TGA. A platinum pan (made by Seiko Electronic Industries Co., Ltd.) endurable against high temperatures of 1000° C. or higher was used as a sample stand. For the electrochemical measurement, the nano-particles of ruthenium oxide hydrates were formed into an electrode in accordance with the following procedure. The nano-particles of ruthenium oxide hydrates were dispersed in a solution of 4 M sulfuric acid containing 0.1 M aniline monomers, and fixed onto an electrode with sweep electrolytic polymerization with polyaniline used as a binder (see FIG. 8). At this time, the sweep (scan) rate was set to a very high value of 400 mV/s, and the sweep potential range was set to a narrower range of 0 to 1.0 V vs. Ag/AgCl than that required for producing ordinary polyaniline. Thus, the conditions were selected such that polyaniline was polymerized into a very thin and light film.

Aniline Reagent made as being Reagent Grade [by Kanto Kagaku Corporation] was used it was.

A coulomb meter COULOMETER/AMPERE HOUR METER 3320 (made by Toho Technical Research Co., Ltd.) and a potentio-stat POLARIZATION UNIT PS-07 (made by Toho Technical Research Co., Ltd.) were used for the electrolytic polymerization of the polyaniline film.

System 2000 made by Perkin Elmer Co., was used for the infrared spectroscopic (FT-IR) measurement with a medium infrared light source and DTGS as a detector.

MULTI SPEC-1500 made by Shimadzu Corporation was used for the ultraviolet to visible spectrum measurement and COMPAQ DESKPRO was used for control of the UV-vis measurement.

A ptQCM (Quartz Crystal Microbalance) electrode was used as a working electrode, Ag/AgCl was used as a control electrode, and a platinum winding was used as a counter electrode.

<<Results and Reviews>>

Figure 9:
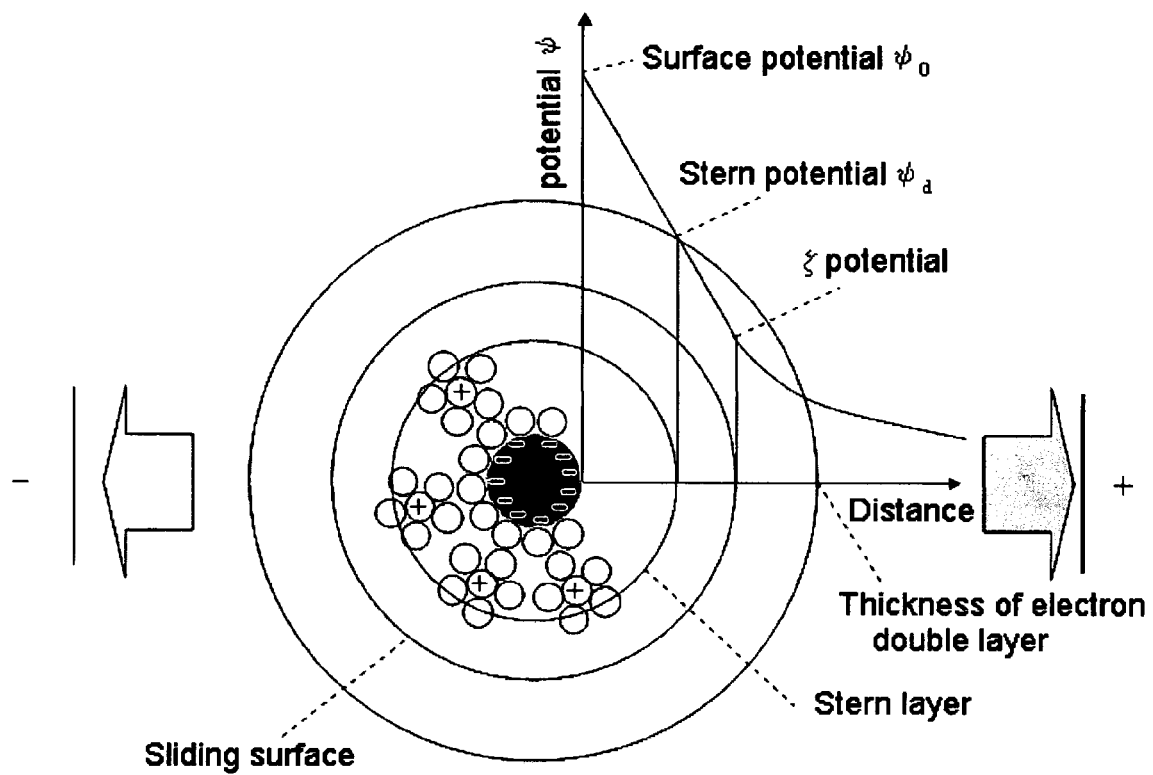
FIG. 9 is an illustration for explaining the surface potential (zeta potential) of the ruthenium oxide hydrate nano-beads.

The interface electrokinetic potential ($\zeta$ potential) of the nano-particles of ruthenium oxide hydrates and the surface potential (zeta potential) of the nano-particles of disperse ruthenium oxide hydrates [$RuO_2.2H_2O$ (made by Kojima Chemical Reagents Co., Ltd.) and $RuO_2.nH_2O$ (150° C.)] (see FIG. 9) were measured for evaluation of dispersivity of those fine particles.

Used as a measurement solution was a solution obtained by preparing an aqueous solution having a pH value varied from 2 to 12 by using sulfuric acid, sodium hydroxide and sodium sulfate, and adding sodium n-dodecylbenzenesulfonate, as a dispersant, adjusted to have a concentration of 10 mM.

Figure 10:
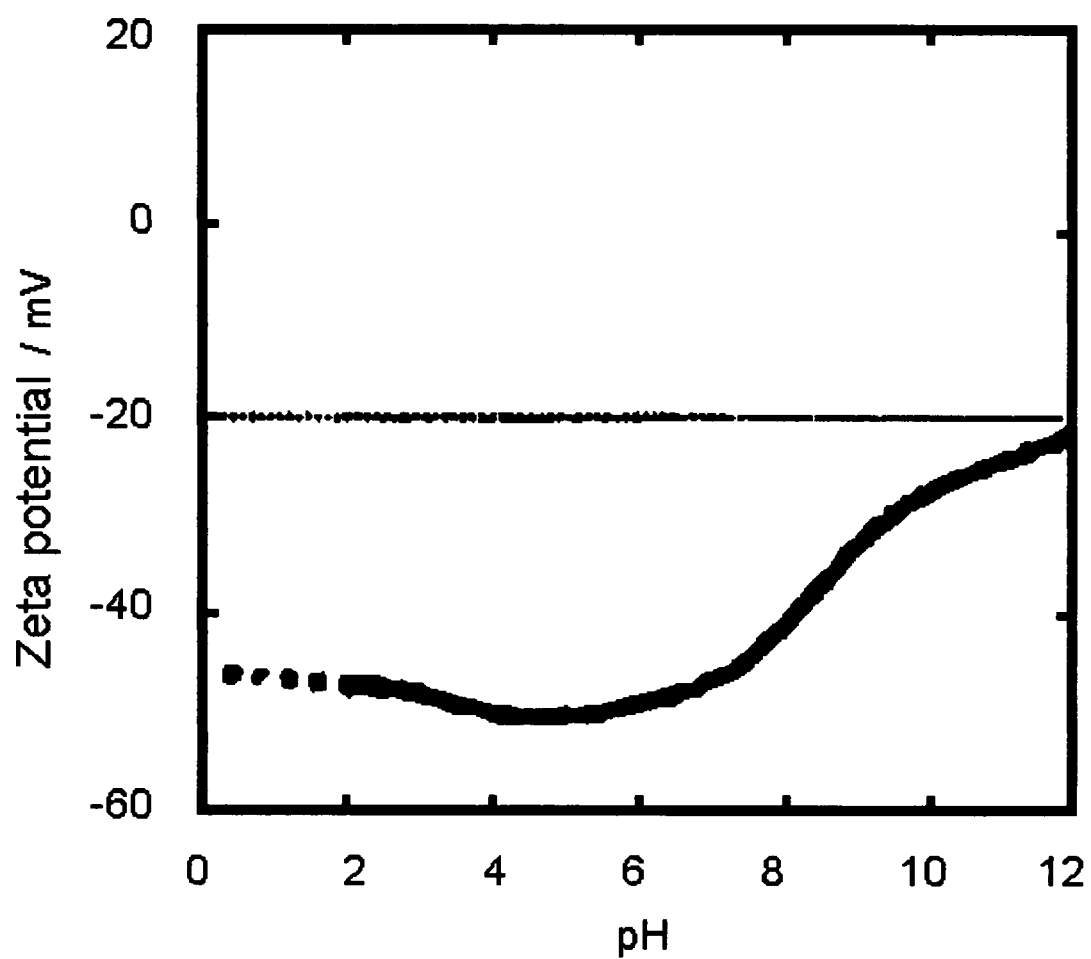
FIG. 10 is a graph showing the zeta potential of $RuO_2.2H_2O$ (made by Kojima Chemical Reagents Co., Ltd.) in a 10 mM SDBS aqueous solution.

For $RuO_2.2H_2O$ (made by Kojima Chemical Reagents Co., Ltd.), the zeta potential was over −20 mV in the entire pH range used for the measurement. As a result of extrapolating a resulting graph from the measured range to pH=0, the zeta potential was also over −20 mV in the extrapolated pH range. (See FIG. 10)

Figure 11:
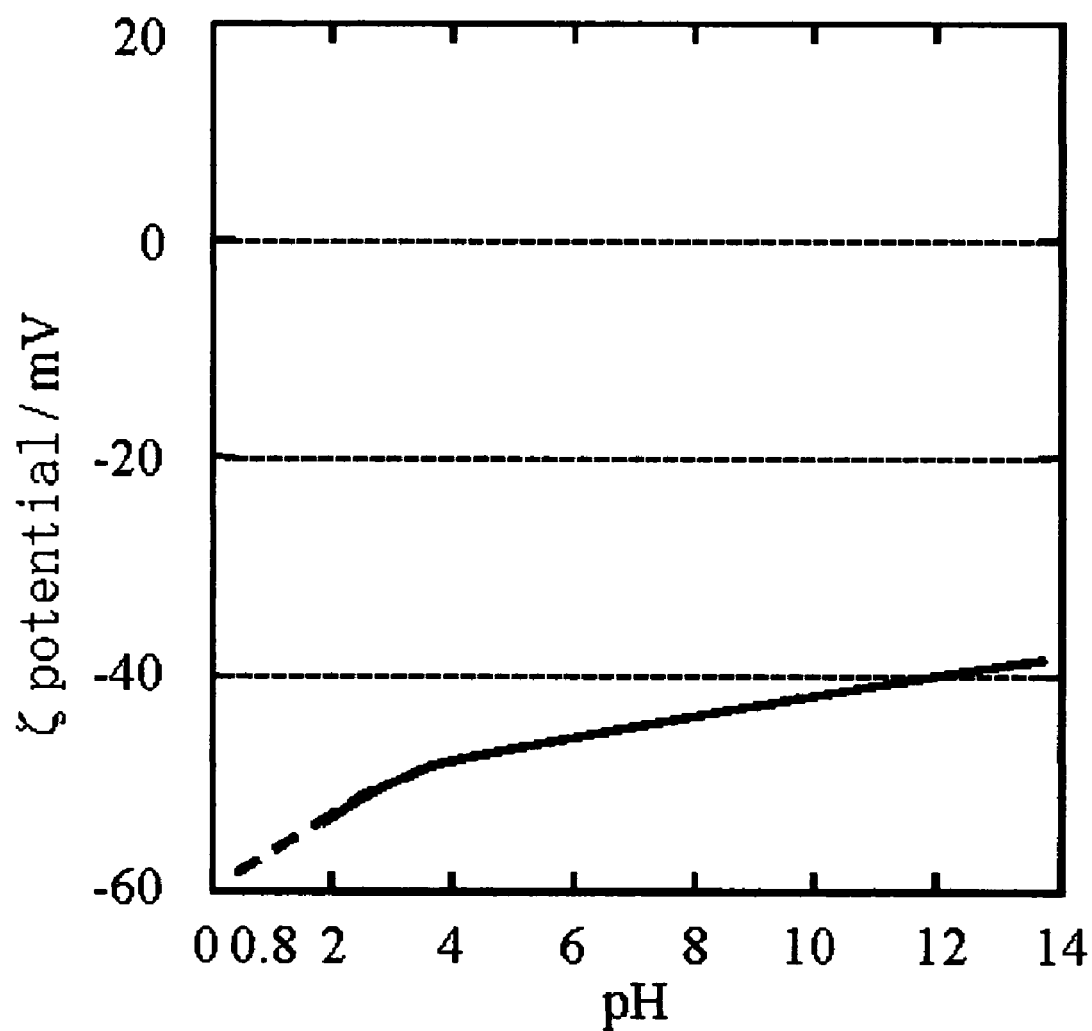
FIG. 11 is a graph showing the zeta potential of $RuO_2.nH_2O$ (30° C.) in the 10 mM SDBS aqueous solution.

$RuO_2.nH_2O$ (150° C.) also showed a similar tendency and its zeta potential was over −20 mV in the entire pH range. (See FIG. 11)

In general, dispersivity is said as being high when the $\zeta$ potential has an absolute value over 20 mV. This is understood from that forces acting upon fine particles in the liquid phase are a function of the $\zeta$ potential. Primary forces acting upon fine particles in the liquid phase are a van der Waal's attraction force and a static interaction force such as an electrostatic repulsive force attributable to surface charges of particles. The stability of a colloidal disperse system is decided depending on balance between those two forces. Discussion as to this point is made as the so-called DLVO (Derjaguin-Landau-Verway-Overbeek) theory.

Usually, the static interaction between two particles having the same diameter is discussed using a potential V. The potential V is related to an interaction force F as expressed by the following formula:

$$F = -dV/dr \quad \text{Formula 1}$$

When two charges particles approach to such an extent that respective electric double layers overlap with each other, an electrostatic repulsive force is generated between the two particles. If the surface potential, i.e., the $\zeta$ potential, is below several tens mV, an electrostatic repulsive potential $V_R$ between two spherical particles each having a radius a is expressed by the following formula:

$$V_R = \pm 2\pi \in a\phi_0^2 \ln[1 \pm \exp(-\kappa(r-2a))] \quad \text{Formula 2}$$

where $\in = \in_r \in_0$, $\in_r$ is relative dielectric constant, $\in_0$ is vacuum dielectric constant, $\phi_0$ is surface potential, and $\kappa$ is a scale of electrolyte concentration.

A van der Waal's attraction force $V_A$ is expressed by the following formula:

$$V_a = -(A/6)[2a^2/(r^2-4a^2)+2a^2/r^2+\ln((r^2-4a^2)/r^2)] \quad \text{Formula 3}$$

where A is Hamaker constant.

In addition to those two potentials, there is a Bohn repulsive potential $V_B$. The Bohn repulsive potential $V_B$ represents a strong interaction force generated when two particles approach and respective electron clouds overlap with each other.

Accordingly, a total potential acting between the particles are given as $V_r = V_R + V_A + V_B$. Thus, as the absolute value of the $\zeta$ potential decreases, the system becomes more instable and particles cohere together to a larger extent. Conversely, as the absolute value increases, the system becomes more stable and is brought into a disperse state.

Moreover, it is generally known that the system is further stabilized with addition of a surfactant. For example, when the metal oxide used as the sample in this Experiment is in an aqueous solution, it is thought that moisture adsorbed onto the surface of the metal oxide dissociates the coupling between the metal and oxygen to produce metal —OH coupling, and the entire surface is covered with hydroxyl groups. Accordingly, the surface of the metal oxide is presumably hydrophilic with the presence of the hydroxyl groups. When a surfactant is added in such a state wherein the surface of the metal oxide is hydrophilic, hydrophilic groups adsorb onto the surface and the surface becomes hydrophobic, thus making the system instable. With further addition of the surfactant, a bimolecular layer is formed and the surface becomes hydrophilic, whereby the system is brought again into a stabilized disperse state. It is known that particles stabilized with a surfactant are held in a more stable disperse state than particles stabilized with only charges because an adsorption layer serves as a steric barrier.

It is therefore thought that both the types of ruthenium oxides ($RuO_2.2H_2O$ (made by Kojima Chemical Reagents Co., Ltd.) and $RuO_2.nH_2O$ (150° C.)) are in a very stable disperse state in the solution having those compositions.

Figure 12:
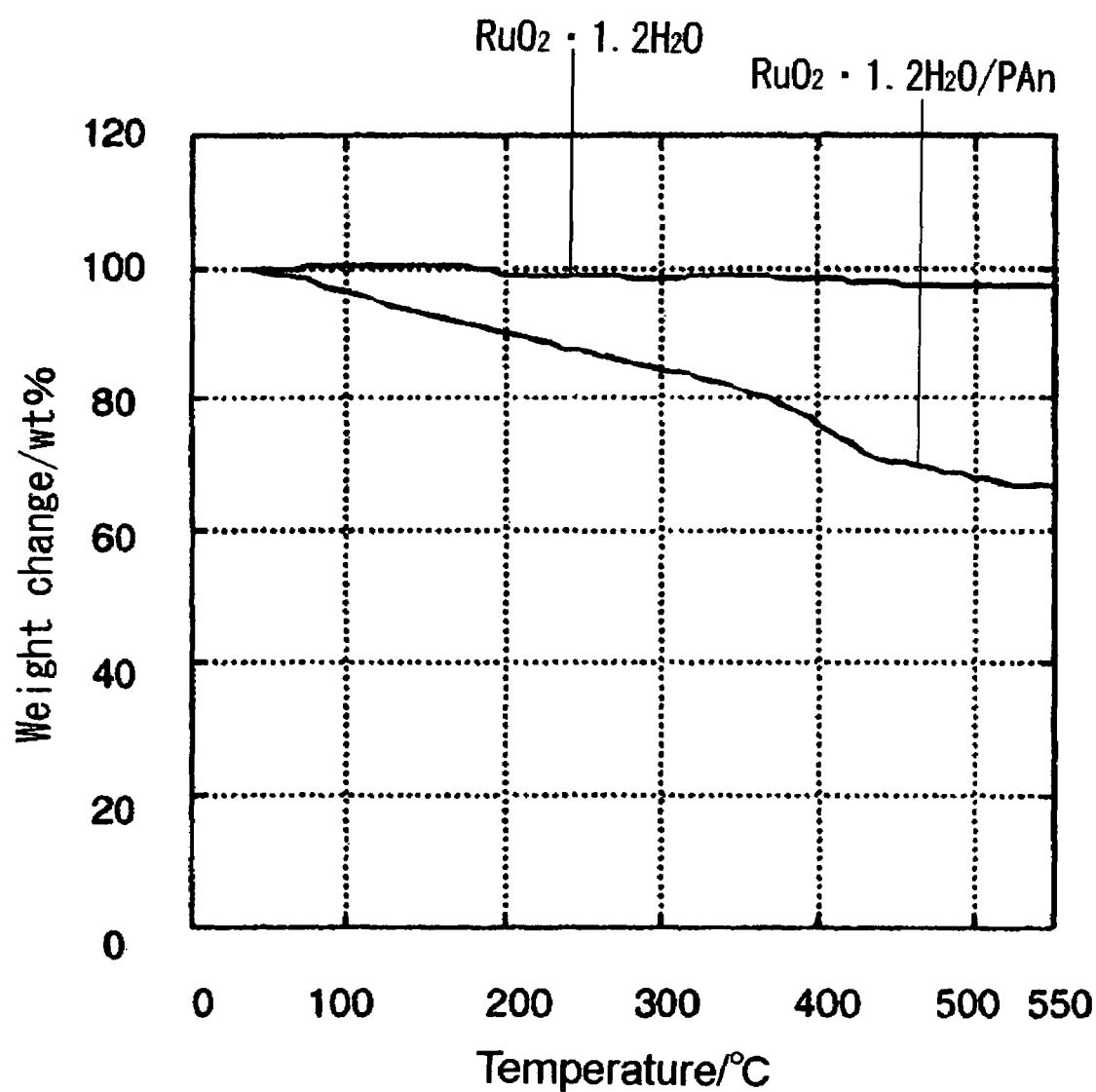
FIG. 12 is a graph for explaining a method of measuring the zeta potential at the surface of a metal oxide.

Usually, when the pH value is changed from the acidic side to the alkaline side, a metal oxide is said as having a point (equipotential point) at which the surface potential becomes zero. However, in the case where an anionic surfactant adsorbs around fine particles and forms a bimolecular layer as in the system in this Example, it is thought that, depending on the method of measuring the zeta potential (see FIG. 12), a total surface potential tends to be negative because of adsorption of the anionic surfactant.

Next, the dispersion stability was examined using a solution of pH=0.8 having the same composition as that used for measuring the $\zeta$ potential.

An experiment procedure was as follows. Prior to the start of the measurement, ultrasonic waves were irradiated to a solution containing ruthenium oxide hydrates to bring the solution into a disperse state. Then, the irradiation of ultrasonic waves was stopped, and changes in particle diameter with the subsequent lapse of time were measured.

Figure 13:
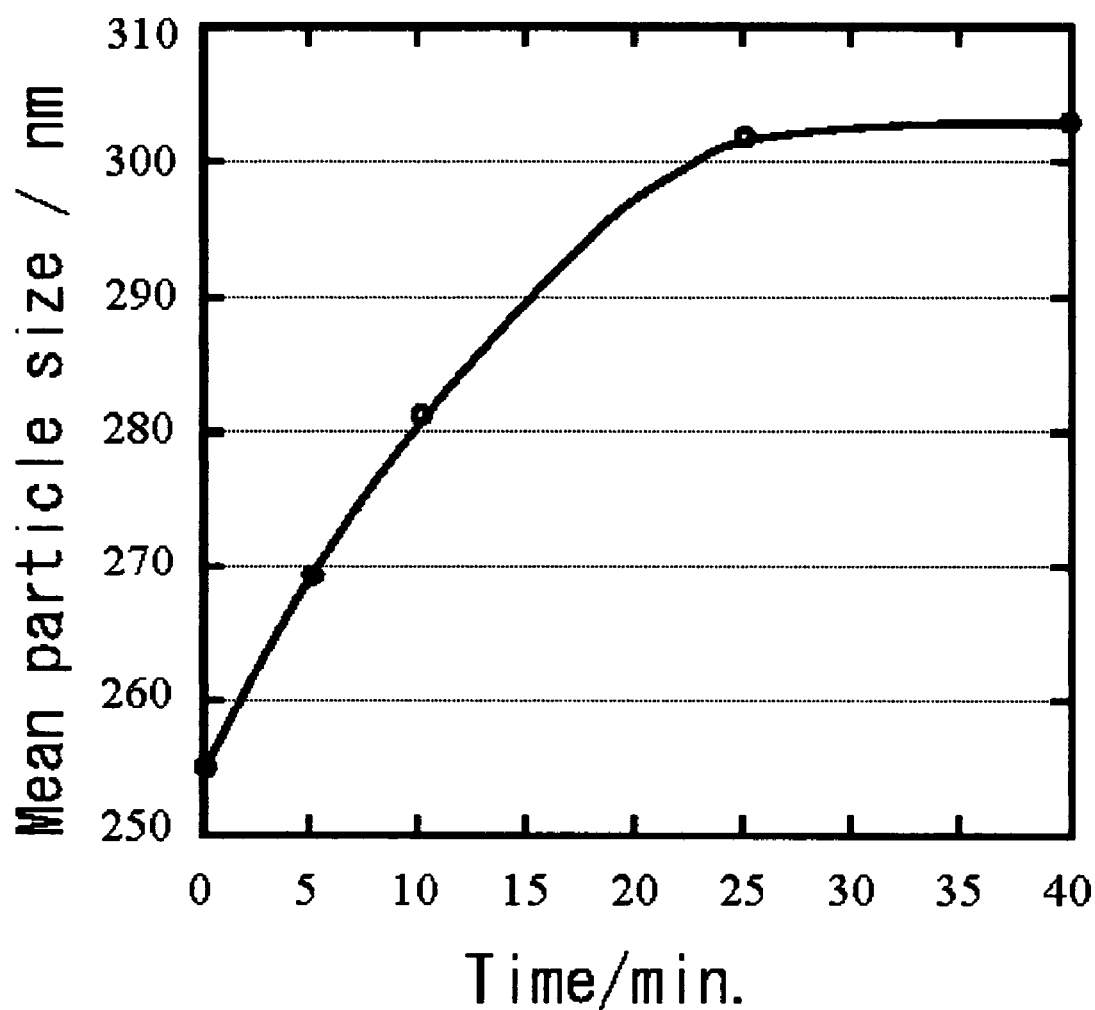
FIG. 13 is a graph showing changes in particle diameter with time from the stop of irradiation of ultrasonic waves after irradiating the ultrasonic waves to the mM SDBS aqueous solution (pH=0.8) of $RuO_2.2H_2O$ (made by Kojima Chemical Reagents Co., Ltd.) for providing a dispersed condition.
Figure 14:
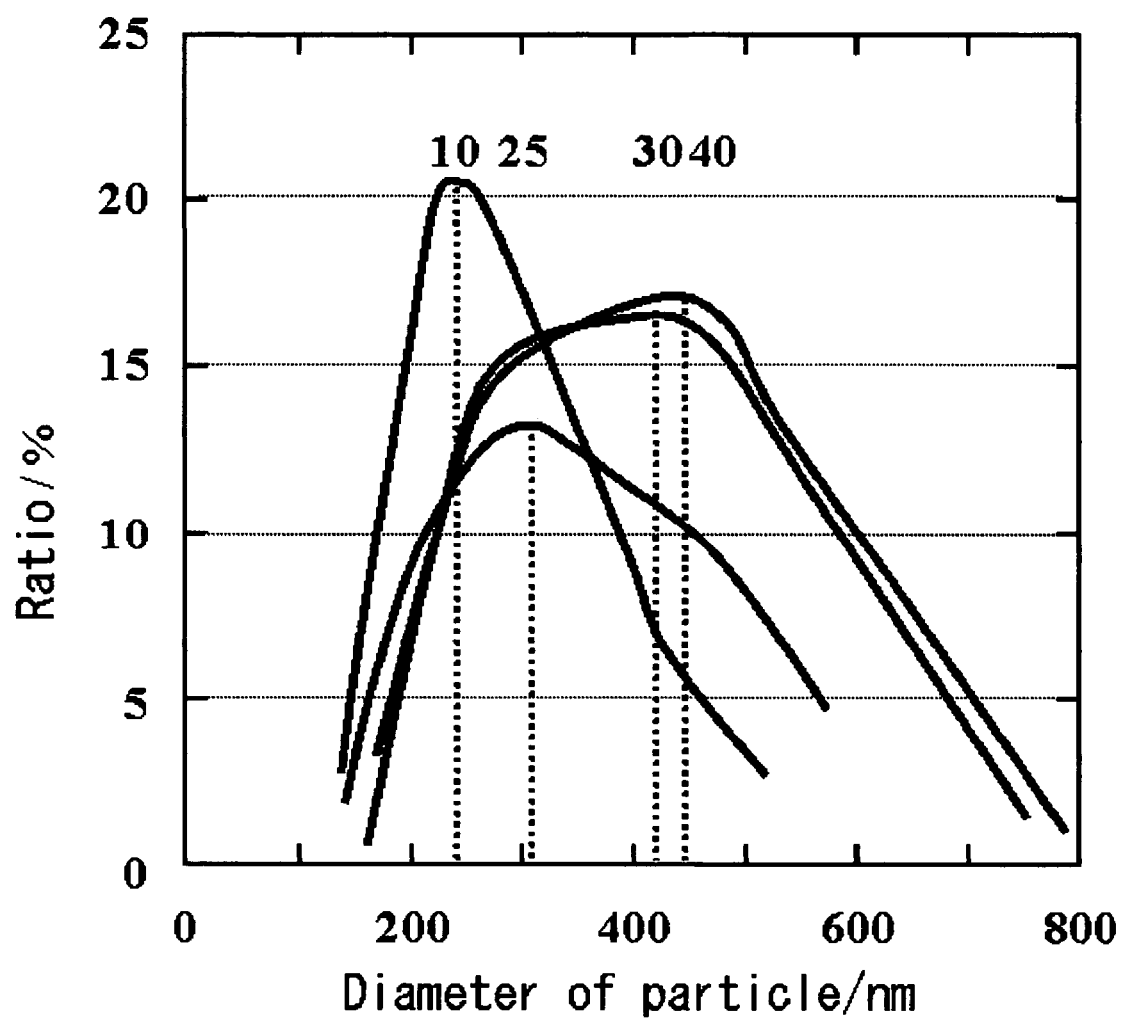
FIG. 14 is a graph showing a particle size distribution of $RuO_2.2H_2O$ (made by Kojima Chemical Reagents Co., Ltd.) in the 10 mM SDBS aqueous solution (pH=0.8).

As a result, for $RuO_2.2H_2O$ (made by Kojima Chemical Reagents Co., Ltd.), the particle diameter immediately after the stop of the sonication was about 255 nm. Then, the particle diameter was about 269 nm after 5 minutes, about 282 nm after 10 minutes, and about 302 nm after 25 minutes (see FIG. 13). From the measurement of a particle diameter distribution, it was also observed that a peak of the particle diameter distribution shifted toward a larger particle diameter with time (see FIG. 14). After 30 minutes from the stop of the sonication, the particle diameter was observed as being substantially constant.

Figure 15:
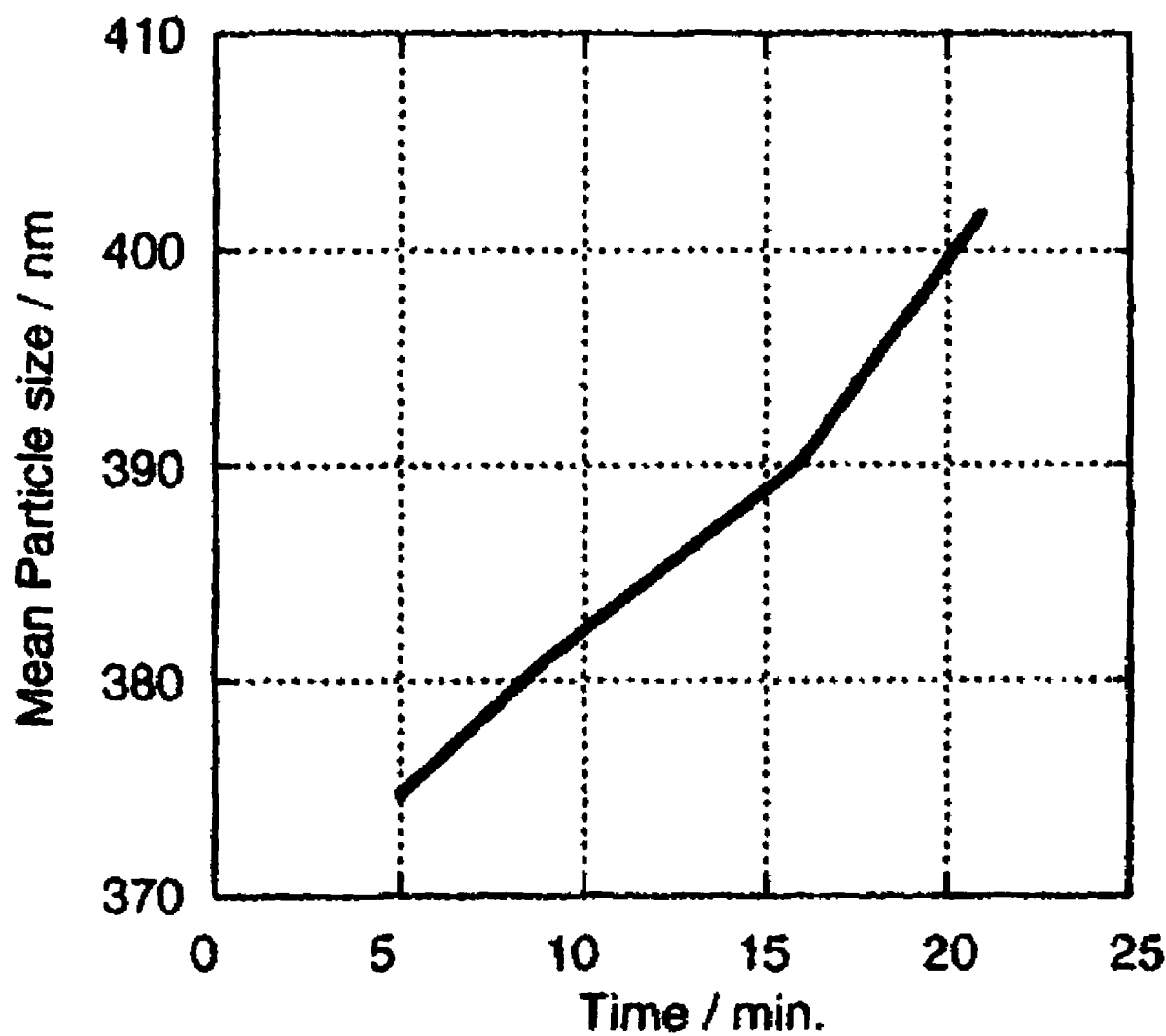
FIG. 15 is a graph showing a particle size distribution of $RuO_2.nH_2O$ (150° C.) in the 10 mM SDBS aqueous solution (pH=0.8).

For $RuO_2.nH_2O$ (150° C.), the particle diameter was about 375 nm after 5 minutes from the stop of the sonication, about 380 nm after 9 minutes, about 390 nm after 16 minutes, and about 400 nm after 21 minutes (see FIG. 15).

For both of $RuO_2.2H_2O$ (made by Kojima Chemical Reagents Co., Ltd.) and $RuO_2.nH_2O$ (150° C.), an increase of the particle diameter with time was observed. This results suggests that the ruthenium oxide nano-particles do not cohere under the sonication, i.e., they are held in a physically stable disperse state without cohering while ultrasonic waves are irradiated to the nano-particles, but they start to cohere immediately after the stop of the sonication. Such cohesion is known as a general phenomenon that, because interface energy (surface tension and surface free energy) at the solid-liquid interface is relatively high and the system is instable, particles tend to cohere with each other so as to minimize the interface.

Surface Geometries and Particle Diameter of Nano-Particles of Ruthenium Oxide Hydrates Disperse states and particle diameters of $RuO_2.2H_2O$ (made by Kojima Chemical Reagents Co., Ltd.), $RuO_2.nH_2O$ (30° C.), and $RuO_2.nH_2O$ (150° C.) were observed from TEM images.

For $RuO_2.2H_2O$ (made by Kojima Chemical Reagents Co., Ltd.), it was confirmed from the TEM image that primary particles had particle diameters of about 50 nm and cohere with each other into particles of about 266 nm.

For $RuO_2.nH_2O$ (30° C.), it was confirmed that primary particles had particle diameters of about 20 to 30 nm and cohere with each other into particles of about 100 nm. Presumably, since the nano-particles were produced in accordance with the process described above, finer particles than those at a reagent level could be obtained.

For $RuO_2.nH_2O$ (150° C.) prepared by annealing $RuO_2.nH_2O$ (30° C.), it was confirmed that primary particles had particle diameters increased about 5 nm as compared with those before the annealing, i.e., about 25 to 35 nm, and cohere with each other into particles of about 100 nm.

Figure 16:
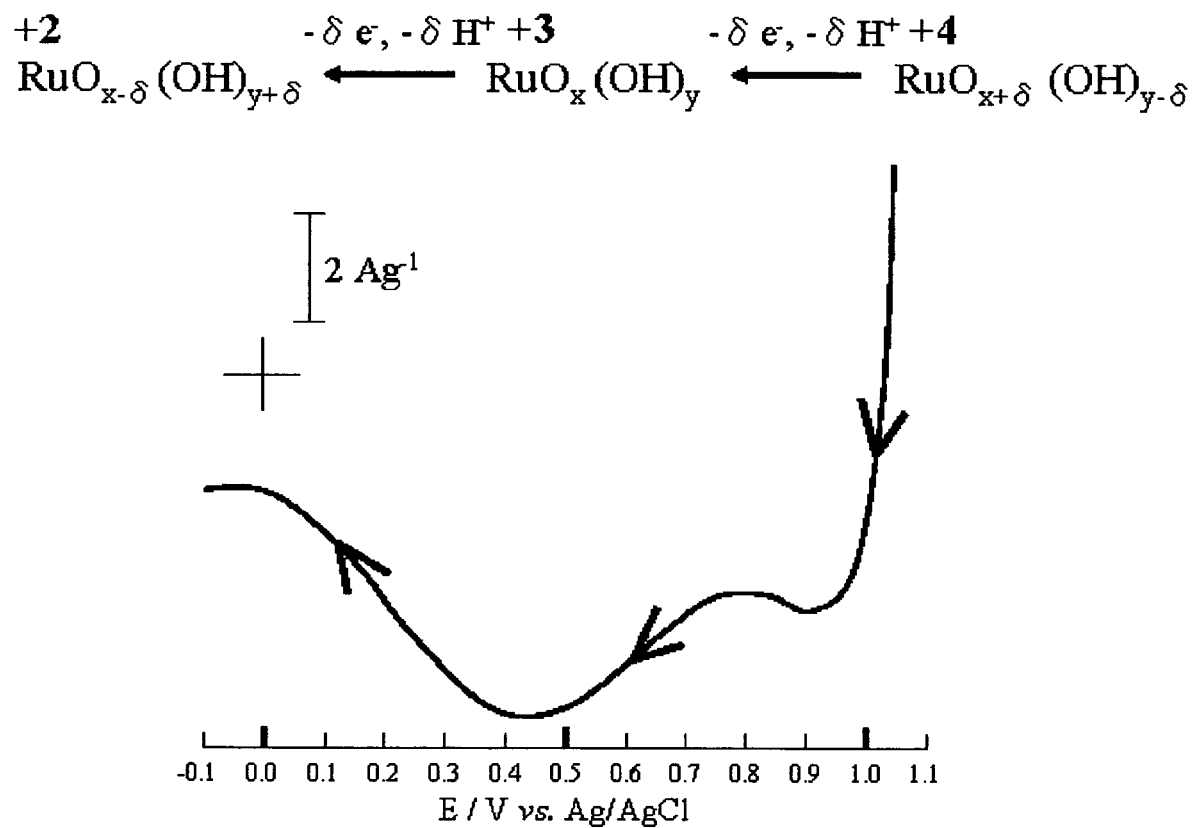
FIG. 16 is a graph showing measurement results of $RuO_2.nH_2O$ (30° C.) with linear sweep voltammetry while sweeping a voltage at a rate of 100 mV/s from 1.1 V on the oxidation side to −0.1 V on the reduction side.

Amount of Hydrating Water, Crystal Structure and Electrochemical Fluctuations of Nano-Particles of Ruthenium Oxide Hydrates $RuO_2.nH_2O$ (150° C.) was subjected to linear sweep voltammetry at a sweep rate of 100 mV/s from 1.1 V on the oxidation side to −0.1 V on the reduction side. As a result, there appeared peaks at 0.958 V vs. Ag/AgCl and 0.457 V vs. Ag/AgCl that were caused upon reduction of ruthenium from 4 to 3 valences and from 3 to 2 valences, respectively. It was hence confirmed that the produced ruthenium oxide had four valences (see FIG. 16).

Next, the number of hydrating water molecules in the ruthenium oxide was closely examined with TGA by annealing the produced ruthenium oxide in vacuum at various temperatures. Experiments were made under conditions of raising temperature over the range of 30 to 450° C. at a rate of 10° C./s in an atmosphere of nitrogen.

A degree x of hydration of $RuO_2.xH_2O$ was calculated based on a formula given below:

weight reduction/%=$x \times$(molecular weight of $H_2O$)/ [$x \times$(molecular weight of $H_2O$)+(molecular weight of $RuO_2$)]

Figure 17:
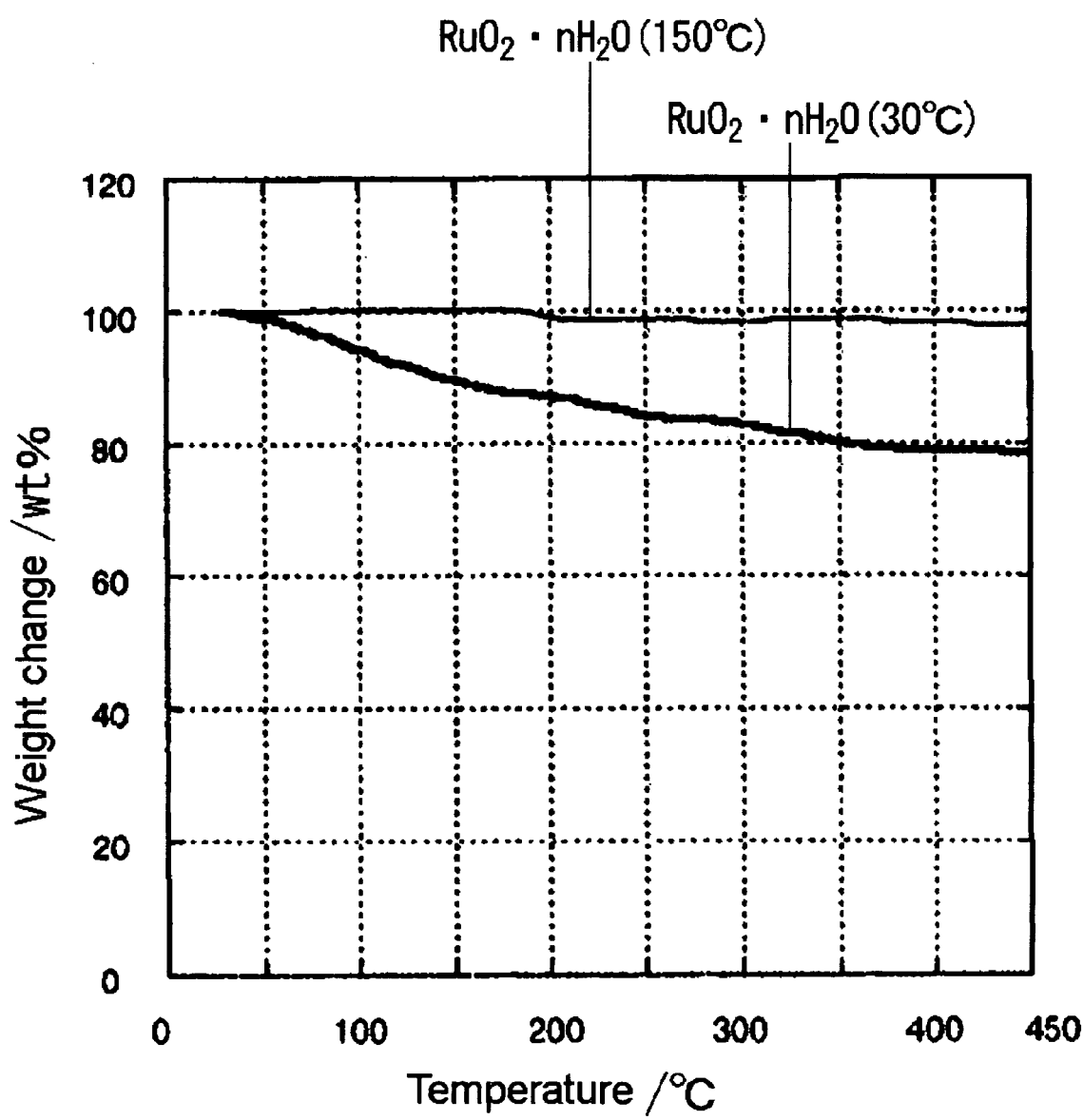
FIG. 17 is a graph for explaining the number of hydrating water molecules when the ruthenium oxide is annealed in vacuum at various temperatures.

The following results were obtained (see FIG. 17).

1. As a result of raising temperature up to 450° C., the weight of the ruthenium oxide [$RuO_2.nH_2O$ (30° C.)], which was held in the state immediately after the production without annealing, reduced 18.01%. Accordingly, it was conformed from the above formula that the ruthenium oxide had 1.6 hydrates.

2. When annealing the ruthenium oxide at 150° C. [$RuO_2.nH_2O$ (150° C.)], the weight reduced 14.33% as a result of raising temperature up to 450° C. Accordingly, it was conformed from the above formula that the ruthenium oxide had 1.2 hydrates.

3. When annealing the ruthenium oxide at 400° C. [$RuO_2.nH_2O$ (400° C.)], 0 hydrate was confirmed.

Figure 18:
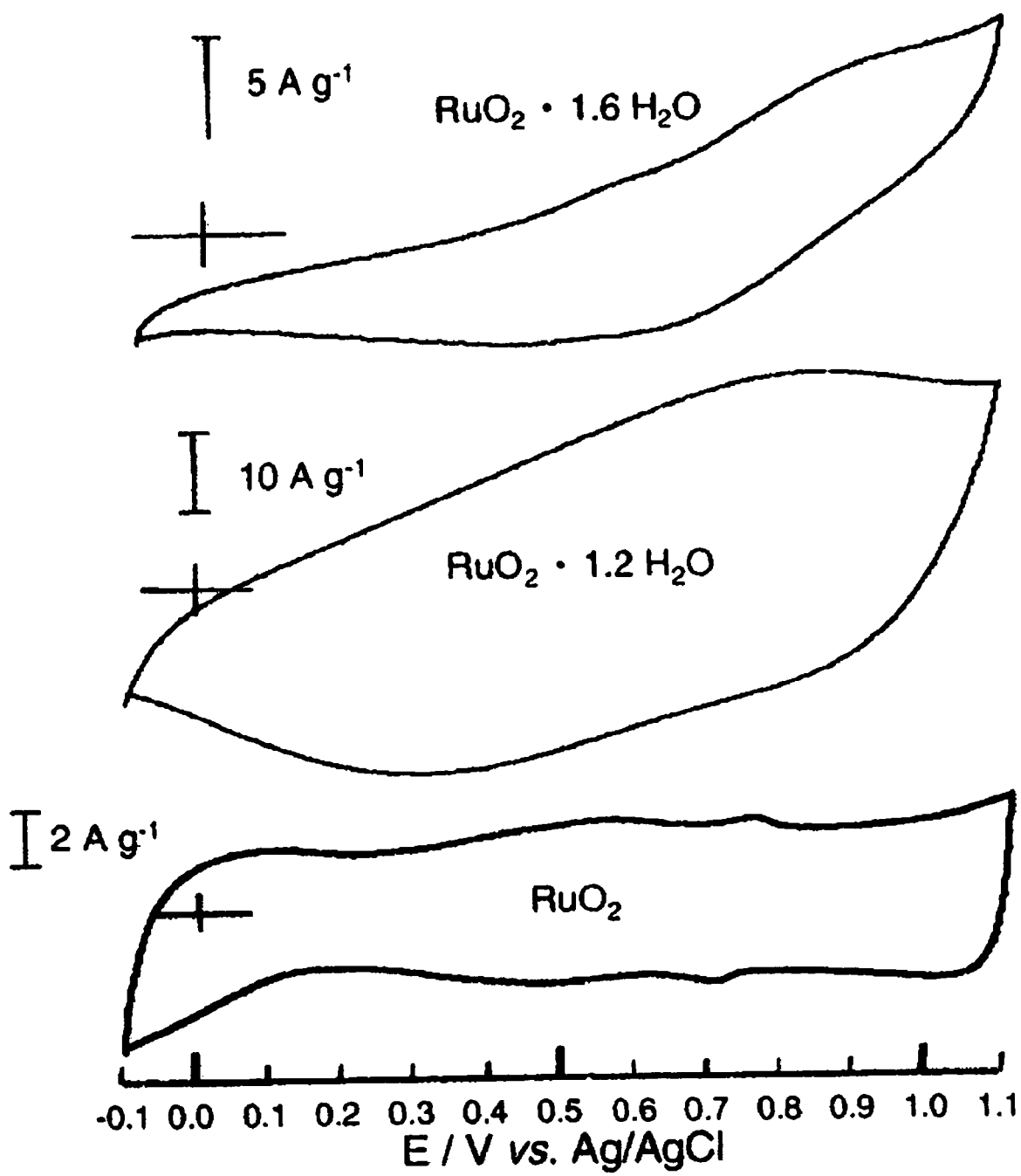
FIG. 18 is a graph for explaining capacity developed when the ruthenium oxide is annealed in vacuum at various temperatures.

Subsequently, the capacity developed when annealing the produced ruthenium oxide in vacuum at various temperatures was closely examined with the cyclic voltammetry. (See FIG. 18)

1. $RuO_2.1.6H_2O$ (30° C.), which was held in the state immediately after the production without annealing, had 41 Ah/kg.

2. $RuO_2.1.2H_2O$ (150° C.) annealed at 150° C. had 104 Ah/kg.

3. $RuO_2.0H_2O$ (400° C.) annealed at 400° C. had 18 Ah/kg.

The relationships among the developed capacity, the number of hydrating water molecules, and the crystal structure are generally known. Therefore, the crystal structure was closely examined with XRD, and the relationship between the number of hydrating water molecules obtained with TGA and the developed capacity was studied. Experiments were made over the scan range of 25 to 65° at a scan speed of 2°/min.

1. It was confirmed from the XRD measurement that $RuO_2.1.6H_2O$ (30° C.) had an amorphous structure. This suggests that, because of having such a structure, the ion diffusion is very fast, but the charge drift resistance is large.

2. It was confirmed from the XRD measurement that $RuO_2.0H_2O$ (400° C.) annealed at 400° C. had a very high crystallinity. This suggests that, because of having such a structure, the charge drift is very fast, but the ion diffusion is very slow and defines a rate-determining step.

In any of the above cases 1 and 2, it is thought that the capacity is developed in the rate-determining step and therefore the developed capacity is relatively small.

3. On the other hand, it was confirmed from the XRD measurement that $RuO_2.1.2H_2O$ (150° C.) annealed at 150° C. had an amorphous structure. Presumably, because of having such a structure, the charge drift resistance and the ion diffusion resistance were well balanced. It was hence confirmed that such a case developed a large capacity.

EXAMPLE 5

Production of Energy Nano-Beads $RuO_2.xH_2O$ produced in Example 4 was given as $RuO_2.1.6H_2O$ in the state as grown and developed a capacity of 41 Ah/kg. In order to optimize the developed capacity, a balance between the electronic conductivity and the ion diffusivity of $RuO_2.xH_2O$ was controlled by carrying out annealing at various temperatures and changing the crystallinity of $RuO_2.xH_2O$. As a result, $RuO_2.1.2H_2O$ (150° C.) annealed at 150° C. developed a relatively high capacity of 104 Ah/kg. For $RuO_2.1.2H_2O$ (150° C.), it was confirmed with TEM that primary particles had particle diameters of 25 to 35 nm and cohere with each other into particles having a mean particle diameter of about 100 nm.

By using, as nuclei, $RuO_2.1.2H_2O$ (150° C.) having such a mean particle diameter, polyaniline was polymerized into very thin films in nano order around the nuclei.

From theoretical calculations, it is known that the smaller the particle diameter of the nano-beads and the thinner a film thickness of an electrode formed using the nano-beads, the higher is the power density. For comparison with $RuO_2.1.2H_2O$ (150° C.) having the particle diameter of about 100 nm, therefore, $RuO_2.2H_2O$ [made by Kojima Chemical Reagents Co., Ltd.] having a relatively large particle diameter (in which primary particles had particle diameters of 20 to 30 nm and cohere with each other into particles having a mean particle diameter of about 266 nm) was also used as nuclei and polyaniline was polymerized into relatively thick films in nano order around the nuclei.

In producing the nano-beads, a reaction field was constructed so as to meet the following conditions.

1. Monomers are selectively present around $RuO_2.nH_2O$ nano-particles as nuclei.

2. Ultrasonic waves are continuously irradiated during the production so that the produced nano-beads will not cohere with each other.

<<Experiment 1>>

Aniline and sodium n-dodecylbenzenesulfonate (hereinafter abbreviated to "SDBS") used here were the same as those used in Example 4. An ultrasonic wave generator used here was the same as that used in Example 3. Ammonium peroxodisulfate available as being Reagent Grade from Kanto Kagaku Corporation was used as it was.

<<Production Procedure>>

1. A disperse solution of ruthenium oxide fine particles serving as nuclei was prepared.

For both of $RuO_2.1.2H_2O$ (made by Kojima Chemical Reagents Co., Ltd.) and $RuO_2.nH_2O$ (150° C.), it is confirmed that they are brought into a chemically disperse state in a solution containing 10 nM of SDBS as a surfactant and having pH=0.8. Because such a concentration of the surfactant exceeds a critical micelle concentration (cmc), a bimolecular layer of SDBS is thought as being present around the ruthenium oxide fine particles. Further, as a result of applying ultrasonic waves to the disperse solution and then measuring the particle diameter distribution and the means particle diameter, it was found in the other Example that the fine particles naturally cohered with each other. Therefore, ultrasonic waves were applied to the solution so that the stable disperse state was maintained from the physical point of view as well.

2. Into the disperse solution thus prepared, aniline monomers were dripped a little by a little using a syringe. At this time, it was thought that hydrophobic aniline monomers were selectively present between the bimolecular layers of SDBS formed around the fine particles, i.e., present in hydrophobic fields. A film thickness of polyaniline was here controlled as follows. For $RuO_2.1.2H_2O$ (150° C.) having the particle diameter of about 100 nm, a relatively small amount, i.e., 1 μl, of aniline monomers was added to form a relatively thin film with polymerization. On the other hand, for $RuO_2.2H_2O$ (made by Kojima Chemical Reagents Co., Ltd.) having the relatively large particle diameter of about 266 nm, a relatively large amount, i.e., 10 μl, of aniline monomers was added to form a relatively thick film with polymerization.

3. Ammonium peroxodisulfate, generally used as an oxidant, was dripped into the solution, while cooling it with ices, to reduce the reaction rate in the polymerization so that branching of polyaniline was held down. This is presumably effective in causing the polymerization to take place selectively around the ruthenium oxide fine particles. Ultrasonic waves were applied to the solution during the polymerization so as to prevent produced nano-beads from cohering with each other and to maintain the nano-beads in a disperse state.

Characterization of Nano-Composite

The $RuO_2.nH_2O$/PAn nano-composite produced as described above were closely examined for the electronic structure with the UV-vis spectroscopic process, the primary structure with the FT-IR spectroscopic process, the dispersivity, surface geometries and particle diameter by using a transmission electron microscope (TEM), and the weight ratio by using a thermogravimetric analyzer (TGA).

<<Experiment 2>>

System 2000 made by Perkin Elmer Co., was used for the infrared spectroscopic (FT-IR) measurement with a medium infrared light source and DTGS as a detector.

MULTI SPEC-1500 made by Shimadzu Corporation was used for the ultraviolet to visible spectrum measurement and COMPAQ DESKPRO made by was used for control of the UV-vis measurement.

TEM and TGA used here were the same as those used in Example 3.

<<Results and Reviews>>

Figure 19:
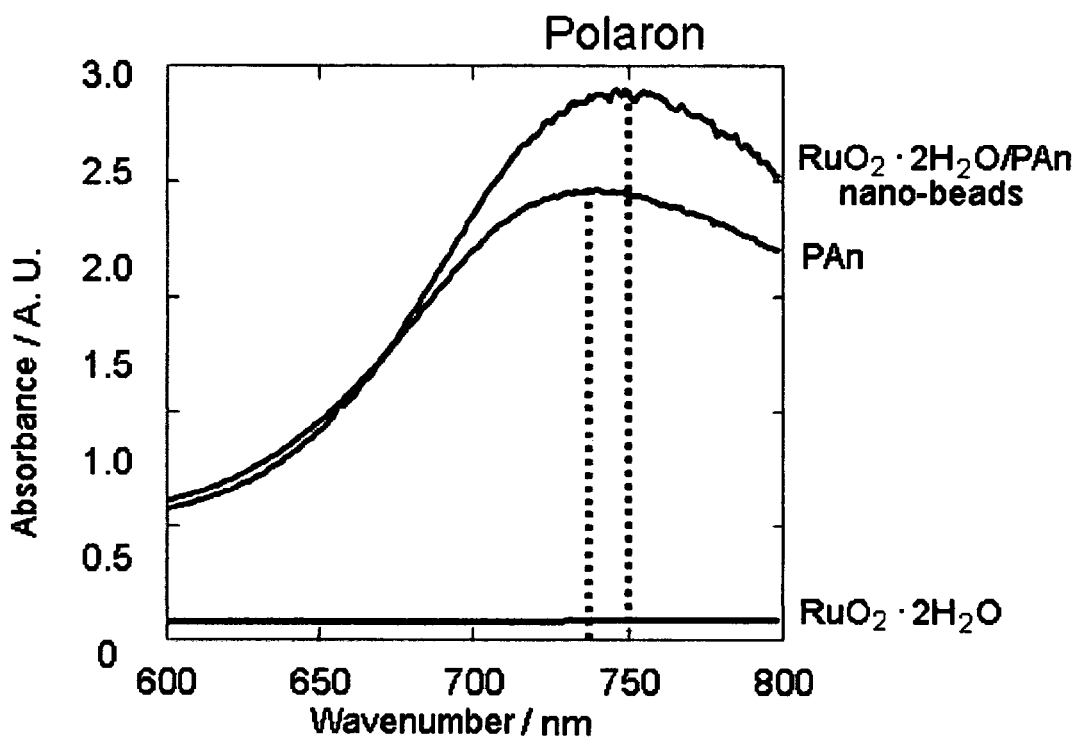
FIG. 19 shows a UV-vis spectroscopic spectrum representing an electronic structure of a nano-composite of $RuO_2.2H_2O$ (made by Kojima Chemical Reagents Co., Ltd.)/PAn.

The electronic structure of a nano-composite of $RuO_2.2H_2O$ (made by Kojima Chemical Reagents Co., Ltd.) PAn was examined with the UV-vis spectroscopic process. A peak attributable to polaron was observed at near 750 nm, thus suggesting that the nano-composite was electrically active (see FIG. 19). For polyaniline polymerized under the same conditions, a peak attributable to polaron was observed at near 735 nm. For a $RuO_2.2H_2O$ sole system, no peak attributable to polaron was observed.

<<Primary Structure of $RuO_2.nH_2O$/PAn Nano-Composite>>

Figure 20:
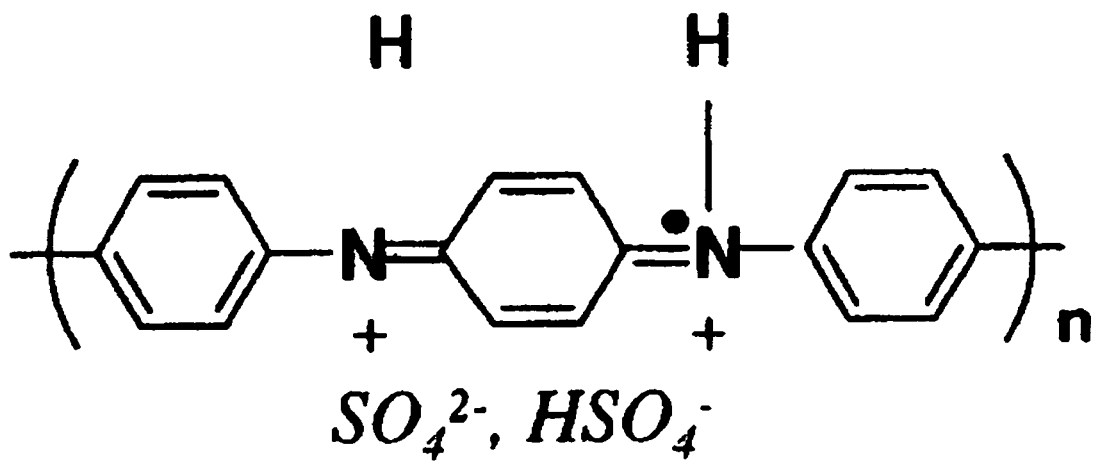
FIG. 20 shows a primary structure of the nano-composite of $RuO_2.2H_2O$ (made by Kojima Chemical Reagents Co., Ltd.)/PAn obtained from a FT-IR spectroscopic spectrum.

The primary structure of the nano-composite of $RuO_2.2H_2O$ (made by Kojima Chemical Reagents Co., Ltd.)/PAn was examined with the FT-IR spectroscopic process. As a result, there appeared a peak attributable to emeraldine base near 1220 m$^{-1}$, a peak attributable to Ph-N near 1300 cm$^{-1}$, a peak attributable to a benzenoid structure near 1480 cm$^{-1}$, and a peak attributable to a quinoid structure near 1560 cm$^{-1}$. Those peaks were not significantly different from peaks observed for polyaniline polymerized under the same conditions and a sample obtained mechanically mixing polyaniline and $RuO_2.2H_2O$ with each other. From the above results, it was suggested the nano-composite contained a structure shown in FIG. 20.

<<Dispersivity, Surface Geometries and Particle Diameter of $RuO_2.nH_2O$/PAn Nano-Beads>>

From a TEM image, it was observed that the produced $RuO_2.nH_2O$/PAn nano-beads were highly dispersed.

For the energy nano-beads produced using $RuO_2.2H_2O$ (made by Kojima Chemical Reagents Co., Ltd.), it was observed that polyaniline was polymerized as films with a thickness of about 33 nm around the ruthenium oxide fine particles having the particle diameter of about 300 nm. Thus, the nano-beads having relatively thick coating films were presumably produced by employing the above-described production method.

On the other hand, for the energy nano-beads produced using $RuO_2.1.2H_2O$ (150° C.), it was observed that polyaniline was polymerized as films with a thickness of about 12 nm around the ruthenium oxide fine particles having the particle diameter of about 100 nm. Thus, the nano-beads having relatively thin coating films were presumably produced by employing the above-described production method.

<<Weight Ratio of $RuO_2.nH_2O$/PAn Nano-Composites>>

A weight ratio of the nano-composite of $RuO_2.2H_2O$ (made by Kojima Chemical Reagents Co., Ltd.)/PAn, for which it was observed that polyaniline was polymerized as films with a thickness of about 33 nm around the nano-particles of $RuO_2$ $2H_2O$ (made by Kojima Chemical Reagents Co., Ltd.) having the particle diameter of about 300 nm, to the nano-composite of $RuO_2.1.2H_2O$ (150° C.) PAn, for which it was observed that polyaniline was polymerized as films with a thickness of about 12 nm around the nano-particles of $RuO_2.1.2H_2O$ (150° C.) having the particle diameter of about 100 nm, was examined with TGA. As experiment conditions, the temperature was raised from 30 to 600° C. at a rate of 10° C./s.

Figure 21:
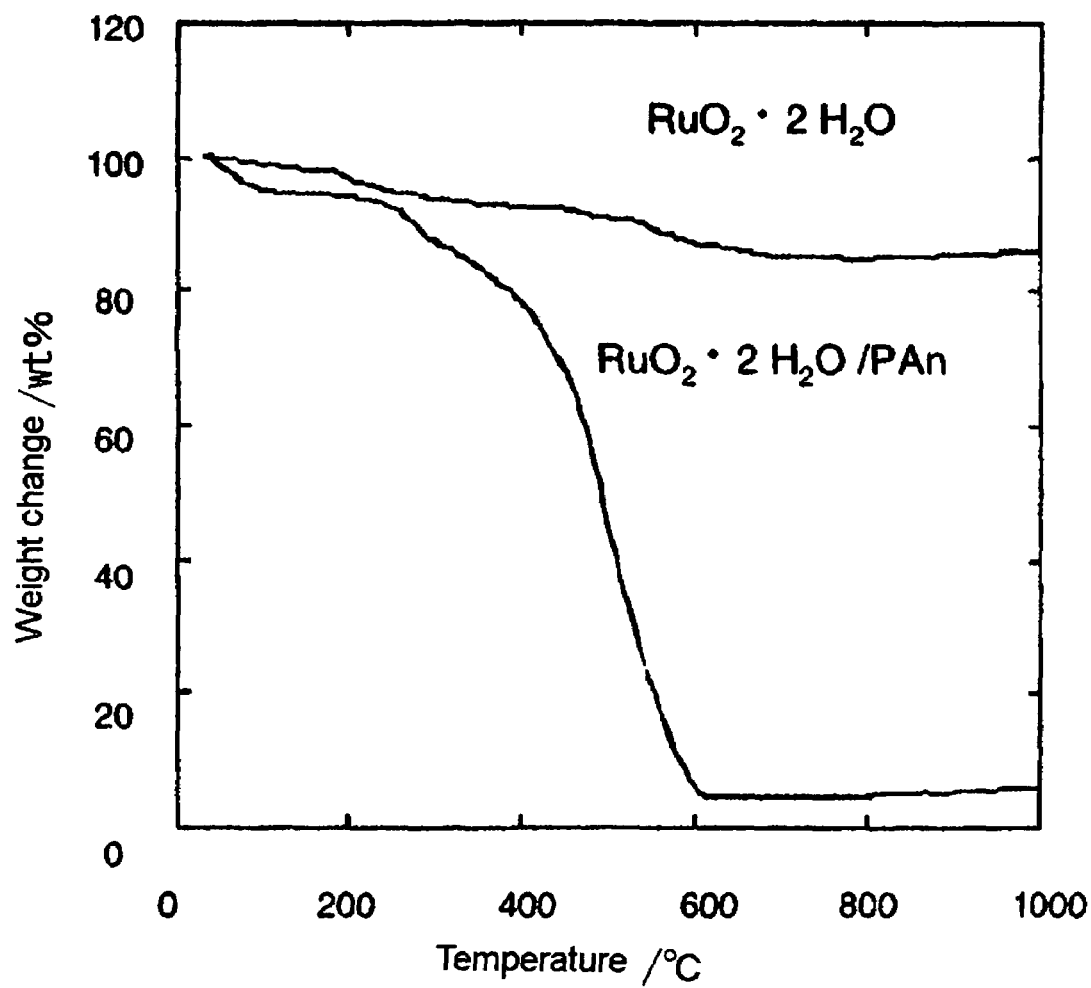
FIG. 21 is a graph for explaining a weight ratio of the $RuO_2. nH_2O$/PAn nano-composite.

As a result, for the nano-composite of $RuO_2.2H_2O$ (made by Kojima Chemical Reagents Co., Ltd.)/PAn, the weight change resulting from raising the temperature up to 600° C. was 93.82%. This is a value including the weight of the hydrating water of $RuO_2.2H_2O$ (made by Kojima Chemical Reagents Co., Ltd.) used as nuclei. Accordingly, the weight change actually reduced with polyaniline was 78.77%. From the above, it was thought that the weight ratio of $RuO_2.2H_2O$ (made by Kojima Chemical Reagents Co., Ltd.) to PAn was 2.385:78.77, i.e., about 3.97. Further, the density of the nano-composite was calculated to be 1.042 gcm$^{-3}$ on an assumption that the density of $RuO_2.2H_2O$ (made by Kojima Chemical Reagents Co., Ltd.) was 2.4 gcm$^{-3}$ and the density of PAn was 1.0 gcm$^{-3}$ (see FIG. 21).

Figure 22:
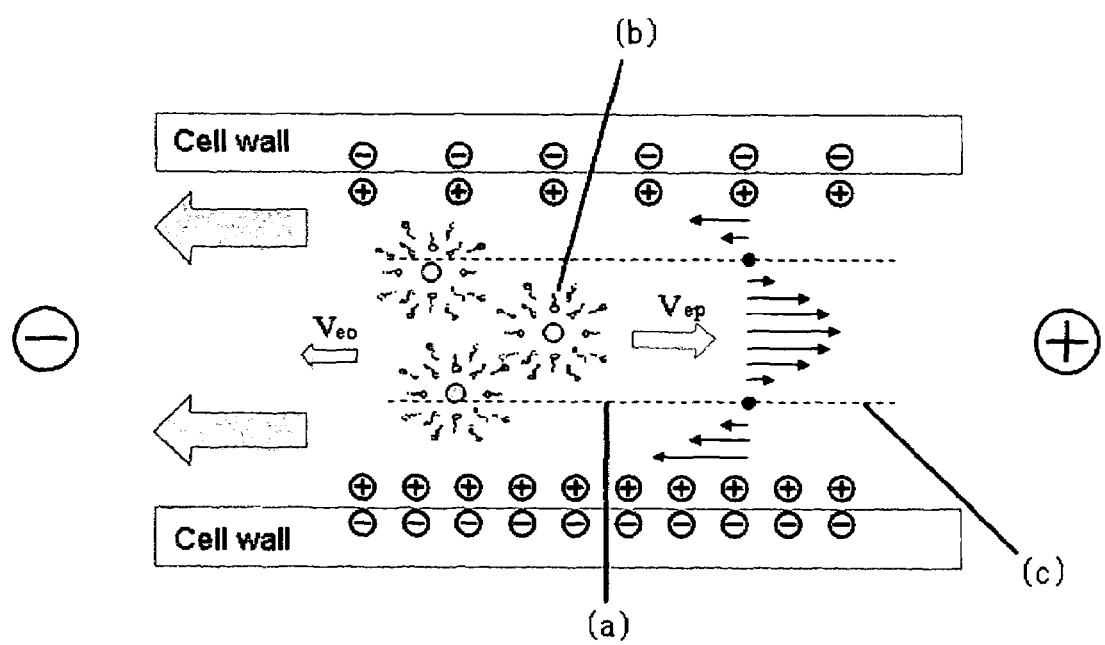
FIG. 22 is an illustration for explaining density of the $RuO_2.nH_2O$/PAn nano-composite.

On the other hand, for the nano-composite of $RuO_2.1.2H_2O$ (150° C.)/PAn, the weight change resulting from raising the temperature up to 600° C. was 28.40%. This is a value including the weight of the hydrating water of $RuO_2$ $2H_2O$ (made by Kojima Chemical Reagents Co., Ltd.) used as nuclei. Accordingly, the weight change actually reduced with polyaniline was 14.07%. From the above, it was thought that the weight ratio of $RuO_2.2H_2O$ (made by Kojima Chemical Reagents Co., Ltd.) to PAn was 67.97: 14.07, i.e., about 82.8:17.2. Further, the density of the nano-composite was calculated to be 2.15 gcm$^{-3}$ on an assumption that the density of $RuO_2.2H_2O$ (made by Kojima Chemical Reagents Co., Ltd.) was 2.4 gcm$^{-3}$ and the density of PAn was 1.0 gcm$^{-3}$ (see FIG. 22).

<<Studies on Electrochemical Behaviors of Nano-Composite Film in Acidic Aqueous Solution>>

Two kinds of energy nano-beads having different particle diameters, given below, were produced with the ultrasonic chemical polymerization process. As a result of characterizing the two kinds of nano-beads, the following could be confirmed regarding the ruthenium oxide-n hydrates serving as nuclei and the film thickness of polyaniline polymerized around the nuclei.

1. Energy nano-beads (1) in which polyaniline was polymerized as films with a thickness of 33 nm around $RuO_2.2H_2O$ (made by Kojima Chemical Reagents Co., Ltd.) having the particle diameter of 300 nm 2. Energy nano-beads (2) in which polyaniline was polymerized as films with a thickness of 12 nm around $RuO_2.1.2H_2O$ (150° C.) having the particle diameter of 100 nm.

A nano-composite film was produced by fixing those two kinds of energy nano-beads onto an electrode with the sweep electrolytic polymerization in a similar manner to that in the above-described Example with polyaniline used as a binder.

Then, electrochemical behaviors of the nano-composite film were examined to review a potentiality of the nano-composite film as an electrode material for electrochemical capacitors.

<<Experiments>>

Sulfuric acid and aniline monomers used here were the same as those used in the other Examples. The electrode was also formed in the same manner as that used in the other Examples.

<<Results and Reviews>>

Figure 23:
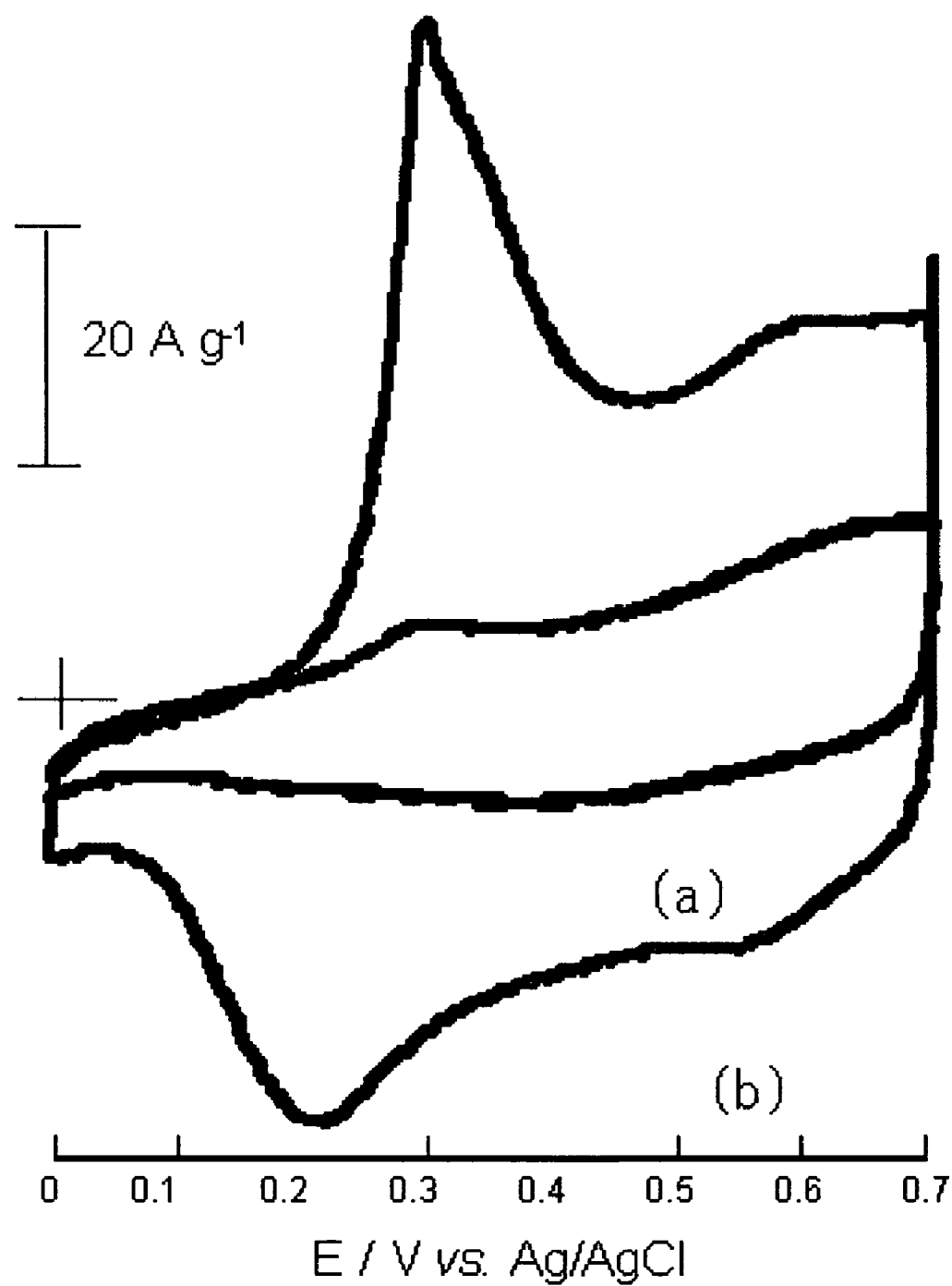
FIG. 23 is a cyclic voltammogram of energy beads (1) and $RuO_2.2H_2O$ (made by Kojima Chemical Reagents Co., Ltd.), which are used as nuclei of the energy beads (1), in 4M sulfuric acid.

Cyclic voltammograms of the energy beads (1) and $RuO_2.2H_2O$ (made by Kojima Chemical Reagents Co., Ltd.) measured in 4 M sulfuric acid is shown in FIG. 23.

As seen from the cyclic voltammogram of the energy beads (1), there appeared peaks corresponding to the first redox for polyaniline at 0.2 to 0.3 V and corresponding to the second redox pair for polyaniline at 0.5 to 0.7 V.

The peak separation at the first reduction/oxidation (redox) peak was 0.089 V and the formal redox potential was 0.25 V vs. Ag/AgCl.

From the mass measurement using a QCM electrode, it was confirmed that the nano-composite film of 1.928 μg was formed on the electrode. Accordingly, a reduction capacity of 41.6 Ah/Kg was calculated. This value was 4 times the specific capacity of 8.61 Ah/Kg obtained with polyaniline. Because the electrode density was measured to be about 1.04 $gcm^{-3}$ in the other Example, the specific capacity per unit volume was 43.3 Ah/l. The differential capacity obtained from the cyclic voltammogram was 211 to 365 $Fg^{-1}$, 220 to 380 F/I.

Those values were about 3 times the specific capacity (13.4 $AhKg^{-1}$, 33.2 Ah/I) (differential capacity=90 $Fg^{-1}$, 216 F/I) of $RuO_2.2H_2O$ (made by Kojima Chemical Reagents Co., Ltd.) used as nuclei.

Figure 24:
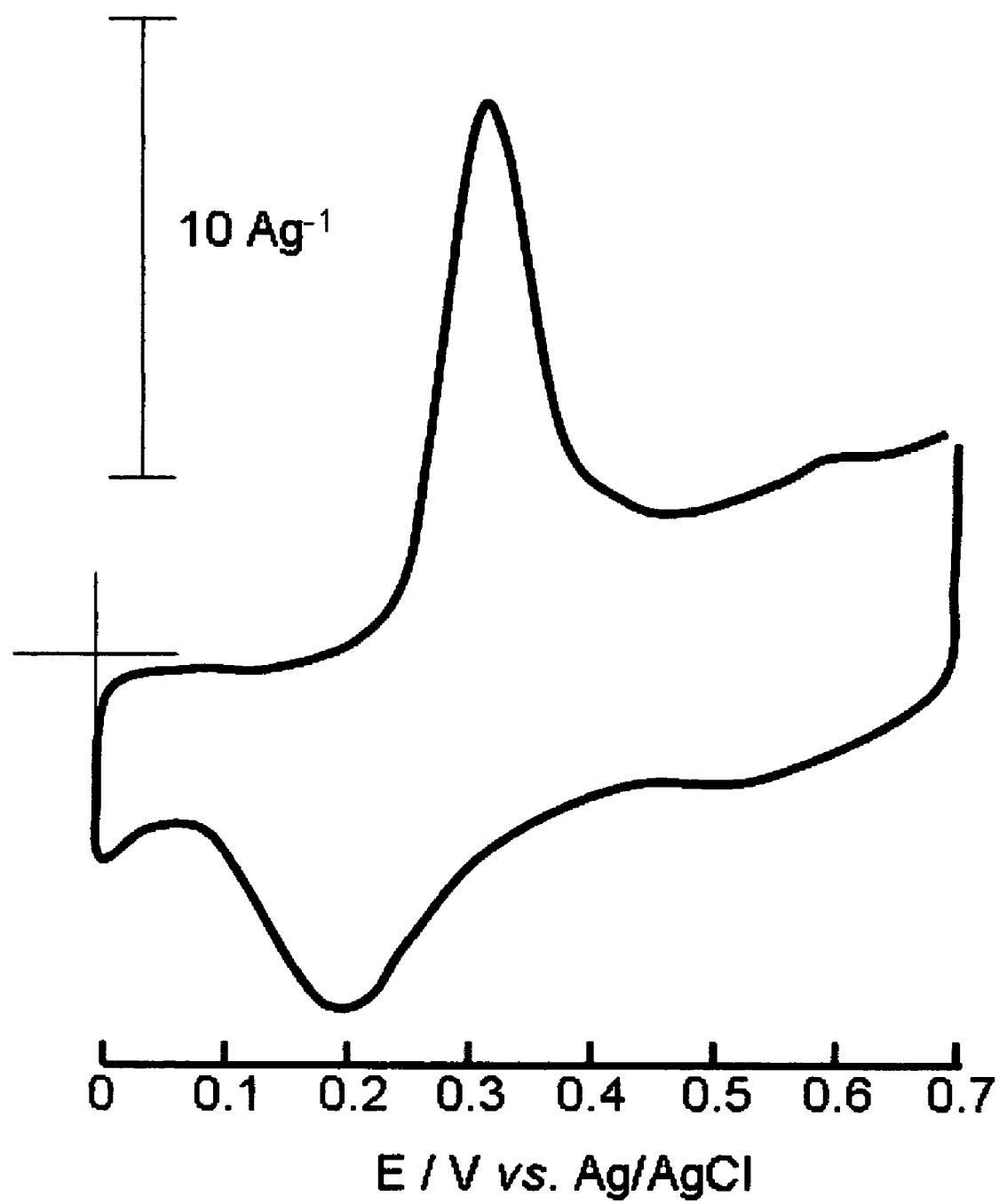
FIG. 24 is a cyclic voltammogram of polyaniline film in 4M sulfuric acid, which is obtained with sweep electrolytic polymerization under the same conditions as those in FIG. 23.

A cyclic voltammogram of the polyaniline film in 4 M sulfuric acid, which was polymerized with the sweep electrolytic polymerization under the same conditions, is shown in FIG. 24.

As seen from the cyclic voltammogram of FIG. 24, the peak separation at the first redox peak for polyaniline was $\Delta E=0.125$ V. On the other hand, the peak separation at the first redox peak for the energy nano-beads (1) was $\Delta E=0.089$ V. Thus, the peak separation of the energy nano-composite (1) had a smaller value than that of polyaniline. Presumably, this result was attributable to that, with the electrode catalyst action developed at the interface between $RuO_2.nH_2O$ and PAn, the electron drift speed was increased and was so the proton exchange rate.

Figure 25:
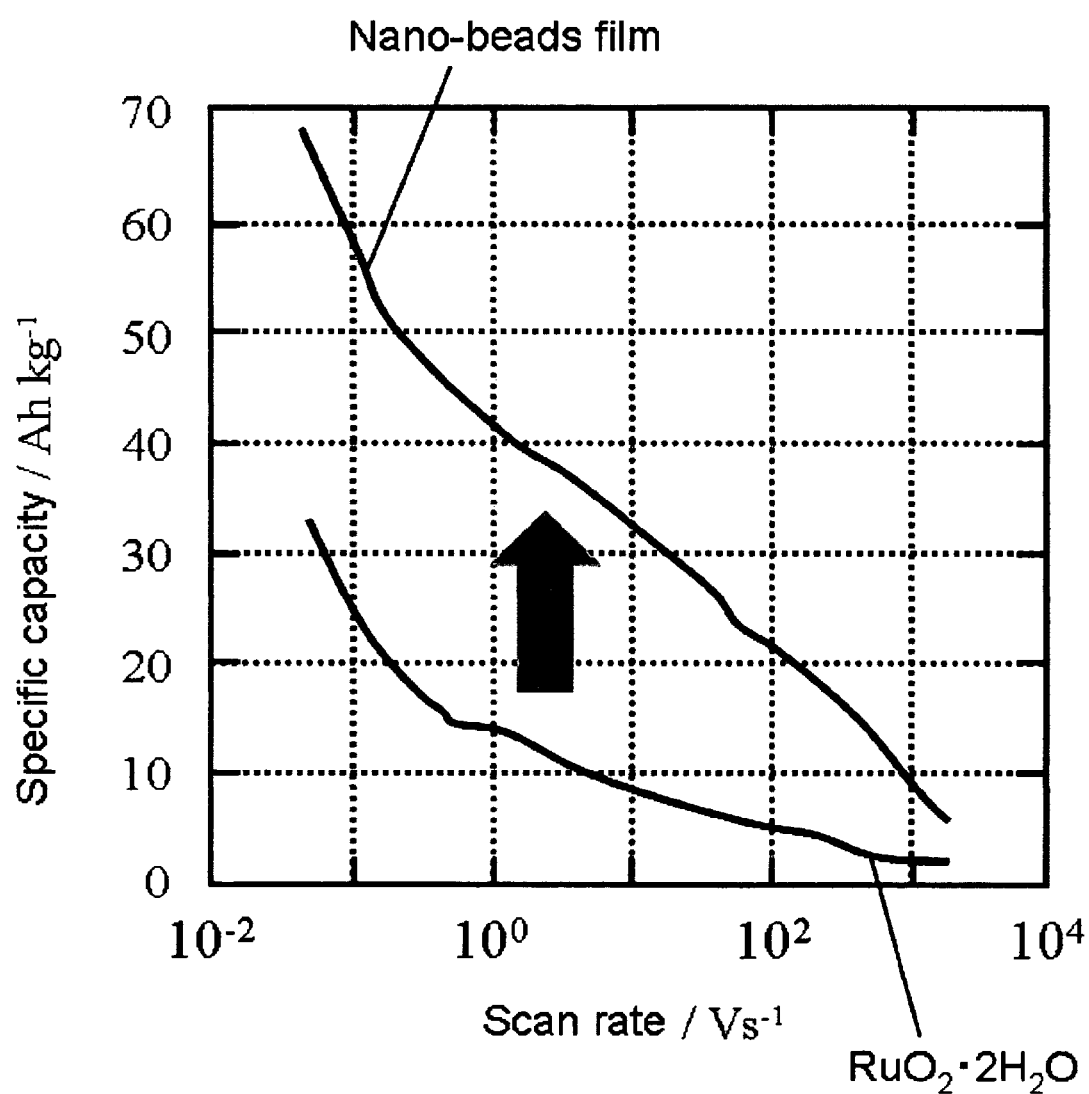
FIG. 25 is a graph showing capacity of the energy beads (1) and $RuO_2.2H_2O$ as the nuclei of the energy beads (1) developed when the scan rate is increased from 5 mV/s to 300 V/s.

Further, the specific capacities of the energy nano-beads (1) and $RuO_2.2H_2O$ used as nuclei, which were resulted when increasing the scan rate from 5 mV/s to 300 V/s, are shown in FIG. 25.

The energy nano-beads (1) showed an initial specific capacity of 68 Ah/Kg at 5 mV/s. On the other hand, $RuO_2.2H_2O$ used as nuclei showed an initial specific capacity of 32 Ah/Kg.

The scan rate at which the specific capacity showed 50% of the initial specific capacity was about 400 mV/s for the energy beads (1) and about 20 mV/s for $RuO_2.2H_2O$ used as nuclei.

This result suggests that the energy beads (1) have a higher capacity retention rate with respect to the scan rate, and the electrode reaction rate due to the interaction at the interface between ruthenium oxide and polyaniline is increased.

Figure 26:
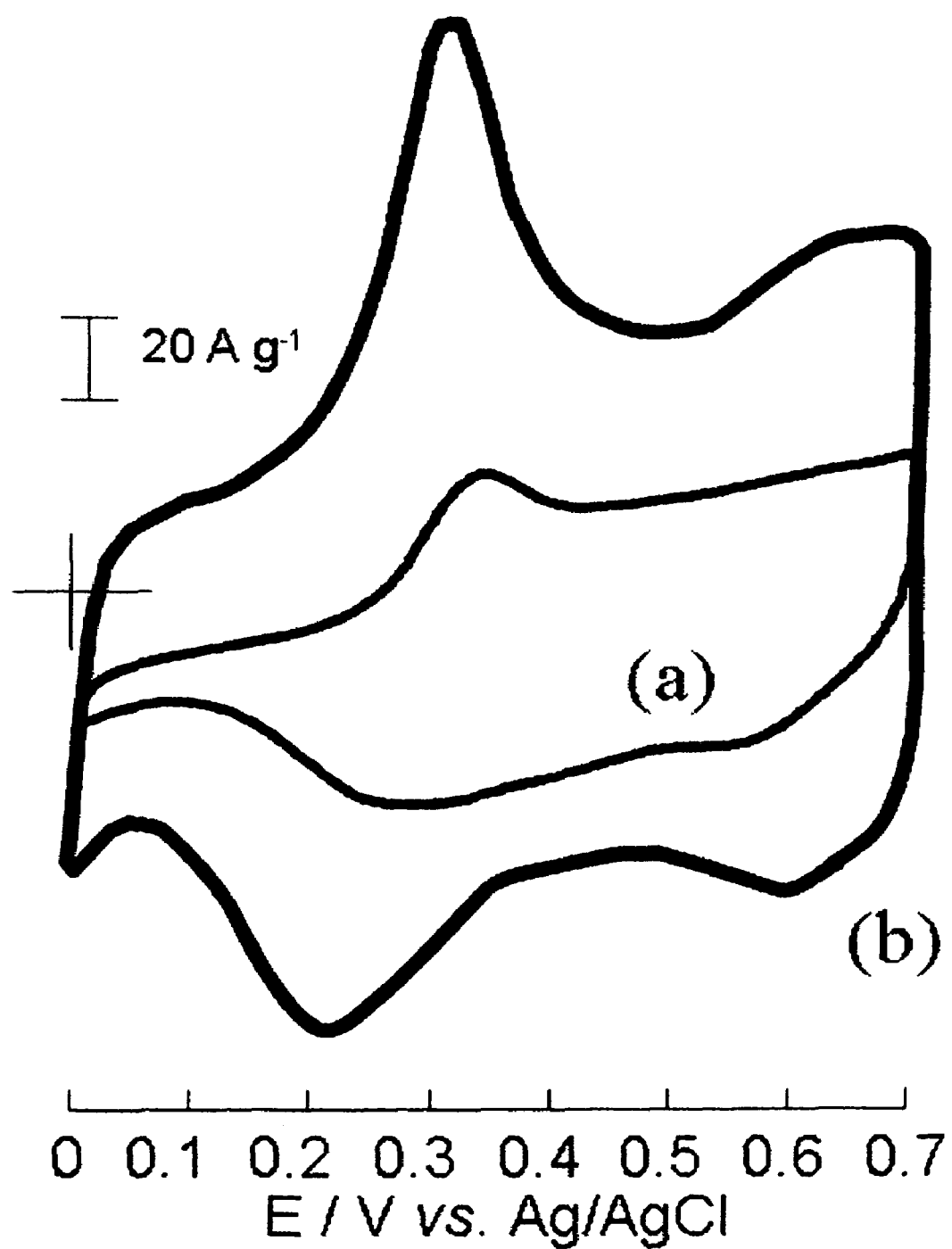
FIG. 26 is a cyclic voltammogram of energy beads (2) and $RuO_2.1.2H_2O$ (made by Kojima Chemical Reagents Co., Ltd.), which are used as nuclei of the energy beads (2), in 4M sulfuric acid.

Next, FIG. 26 shows a cyclic voltammogram of the energy beads (2), in which the particle diameter of ruthenium oxide as nuclei was reduced to 100 nm, i.e., about ⅓ of that in the energy beads (1), and the film thickness of polyaniline polymerized around the nuclei was reduced to 12 nm, i.e., about a half of that in the energy beads (1), by controlling the reaction field, and a cyclic voltammogram of $RuO_2.1.2H_2O$ (made by Kojima Chemical Reagents Co., Ltd.) used as nuclei in the energy beads (2), both the cyclic voltammograms being measured in 4 M sulfuric acid.

As seen from the cyclic voltammograms, there appeared peaks corresponding to the first redox for polyaniline at 0.2 to 0.3 V and corresponding to the second redox pair for polyaniline at 0.5 to 0.7 V.

The peak separation at the first reduction/oxidation (redox) peak was 0.097 V and the formal redox potential was 0.26 V vs. Ag/AgCl.

From the mass measurement using a QCM electrode, it was confirmed that the nano-composite film of 2.711 μg was formed on the electrode. Accordingly, a reduction capacity of 92 Ah/Kg was calculated. This value was about 11 times the specific capacity of 8.61 Ah/Kg obtained with polyaniline. Because the electrode density was measured to be about 2.16 $gcm^{-3}$ in the other Example, the specific capacity per unit volume was 199 Ah/l. The differential capacity obtained from the cyclic voltammogram was 509 to 743 $Fg^{-1}$, 1100 to 1604 F/I.

Those values were about 1.2 times the specific capacity (78 Ah/Kg, 189 Ah/I) (differential capacity=576 $Fg^{-1}$, 1382 F/I) of $RuO_2.1.2H_2O$ used as nuclei.

Next, a comparison was made with the cyclic voltammogram of the polyaniline film in 4 M sulfuric acid, which was polymerized with the sweep electrolytic polymerization under the same conditions.

The peak separation at the first redox peak for polyaniline was $\Delta E=0.125$ V. On the other hand, the peak separation at the first redox peak for the energy nano-beads (2) was $\Delta E=0.098$ V. Thus, the peak separation of the energy nano-composite (2) had a smaller value than that of polyaniline. Presumably, this result was attributable to that, with the electrode catalyst action developed at the interface between $RuO_2.nH_2O$ and PAn, the electron drift speed was increased and was so the proton exchange rate.

Figure 27:
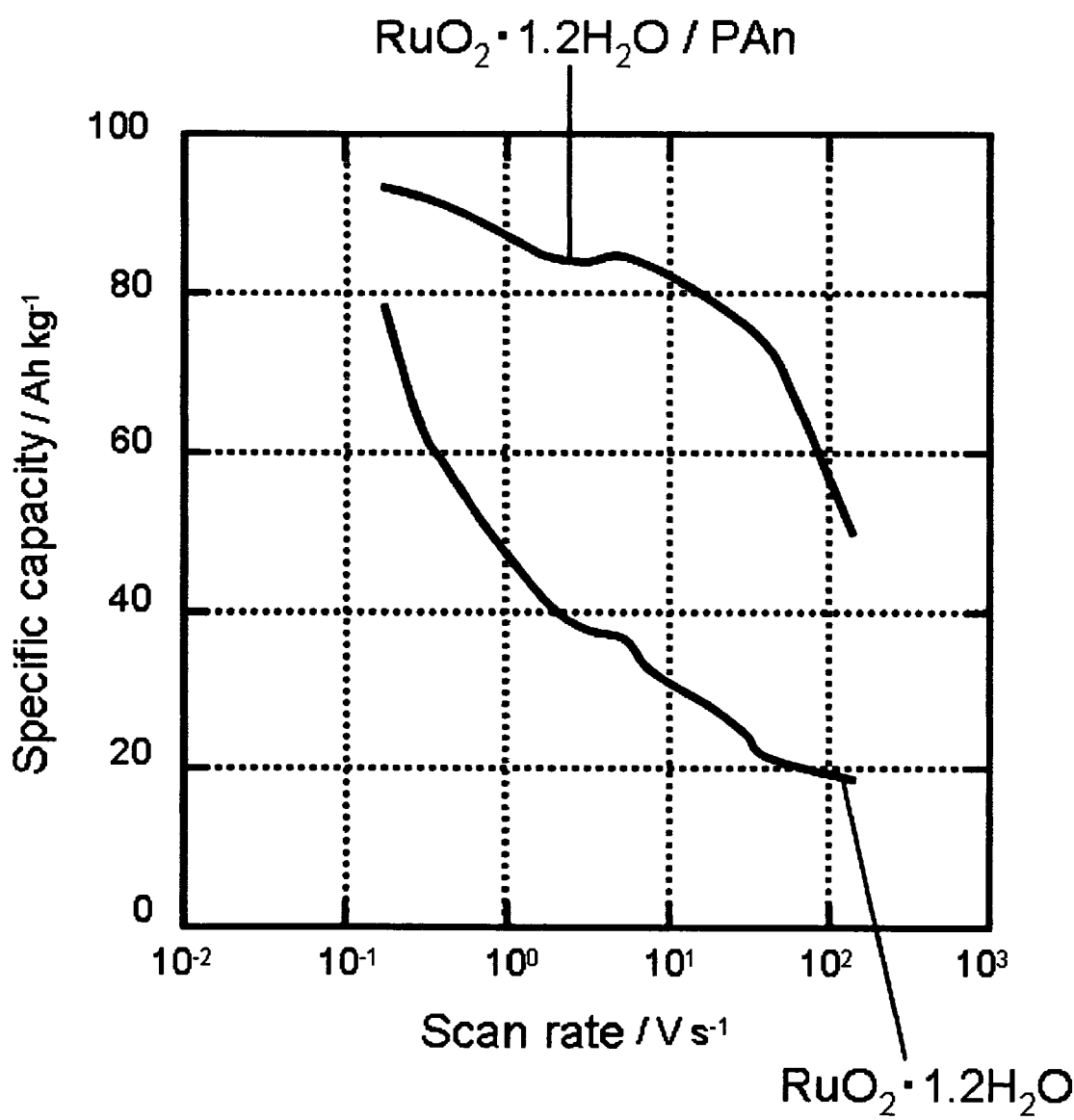
FIG. 27 is a graph showing capacity of the energy beads (2) and $RuO_2. 2H_2O$ as the nuclei of the energy beads (2) developed when the scan rate is increased from 50 mV/s to 20 V/s.

The specific capacities of the energy nano-beads (2) and $RuO_2.1.2H_2O$ used as nuclei, which were resulted when increasing the scan rate from 50 mV/s to 20 V/s, are shown in FIG. 27.

The energy nano-beads (2) showed an initial specific capacity of 95 Ah/Kg at 50 mV/s. On the other hand, $RuO_2.1.2H_2O$ used as nuclei showed an initial specific capacity of 83.5 Ah/Kg.

The scan rate at which the specific capacity showed 50% of the initial specific capacity was about 20 V/s for the energy beads (2) and about 0.7 V/s for $RuO_2.1.2H_2O$ used as nuclei.

This result suggests that the energy beads (2) have a higher capacity retention rate with respect to the scan rate, and the electrode reaction rate due to the interaction at the interface between ruthenium oxide and polyaniline is increased.

Comparing between the composites (1) and (2) the scan rate at which the specific capacity showed 50% of the initial specific capacity, the scan rate was 0.4 V/s for (1) and about 20 V/s for (2). Also, the scan rate at which the specific capacity of $RuO_2.nH_2O$ used as nuclei showed 50% of the initial specific capacity was about 0.02 V/s for (1) and about 0.7 V/s for (2). Accordingly, it can be thought that the smaller capacity retention rate of the composite (1) than that of the composite (2) depends on $RuO_2.nH_2O$ used as nuclei.

Considering (1) and (2) as composite materials, however, it can be said that the composite (1) has a higher capacity retention rate than the composite (2).

The above results are presumably realized with the following effects that are obtained from a decrease in the particle diameter of ruthenium oxide.

1. With a decrease in the particle diameter of ruthenium oxide, an area of the interface developing the electrode catalyst effect is relatively increased, whereby the electrode reaction rate is increased in a relatively large region. At the same time, the proton exchange rate is also increased. This further suggests increases of the redox reaction rate and the ion diffusion rate which are said as defining the rate-determining step in the conductive high-molecule sole system.

Figure 28:
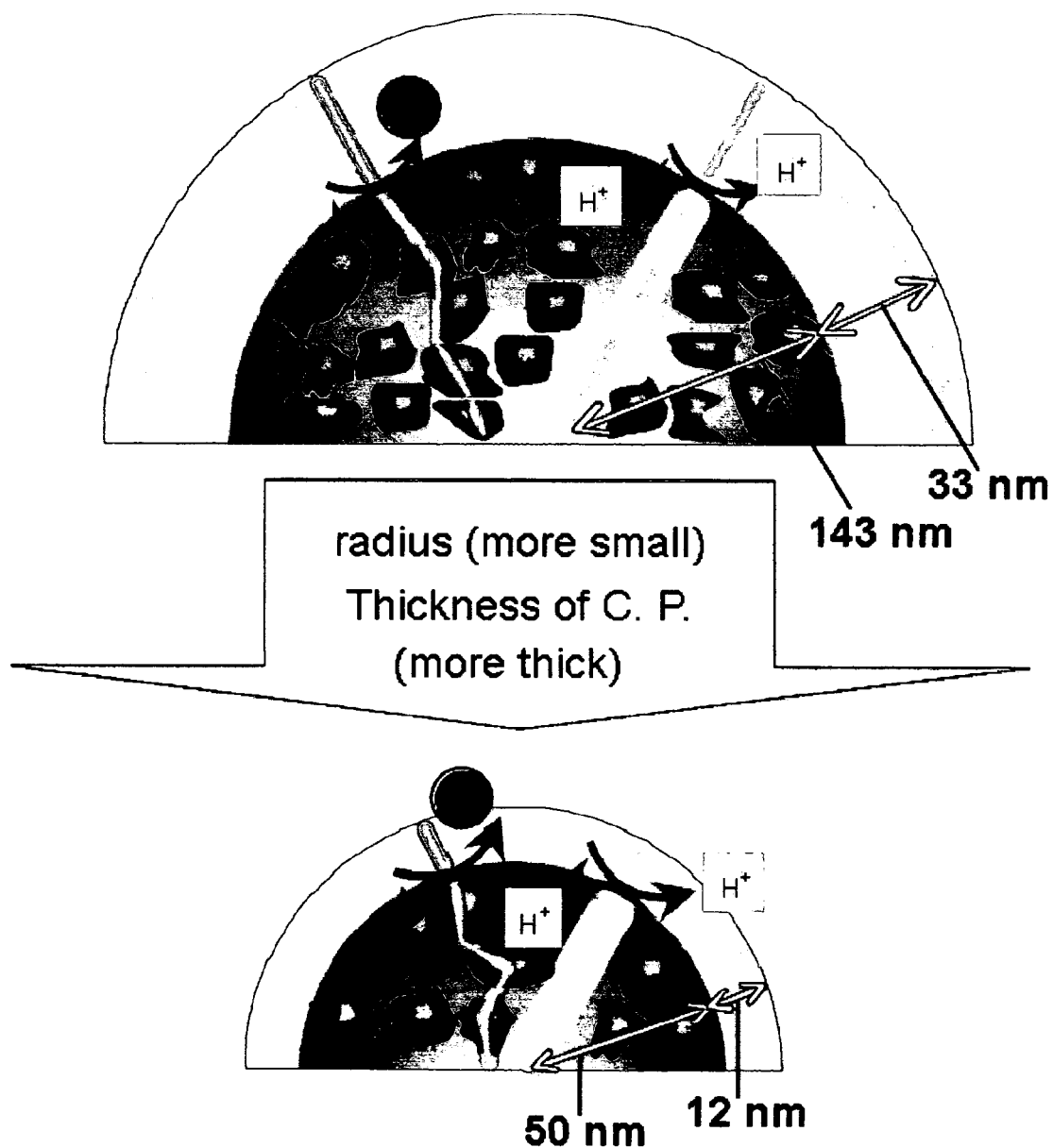
FIG. 28 is an illustration showing that the ion diffusivity is increased in the energy beads (2) having a thinner polyaniline film formed with polymerization than in the energy beads (1) having a thicker polyaniline film.

2. Polyaniline is polymerized as thinner films in the energy nano-beads (2). It is therefore thought that the ion diffusion rate is increased in the energy beads (2) than in the energy beads (1) having thicker polyaniline films (see FIG. 28).

Figure 29:
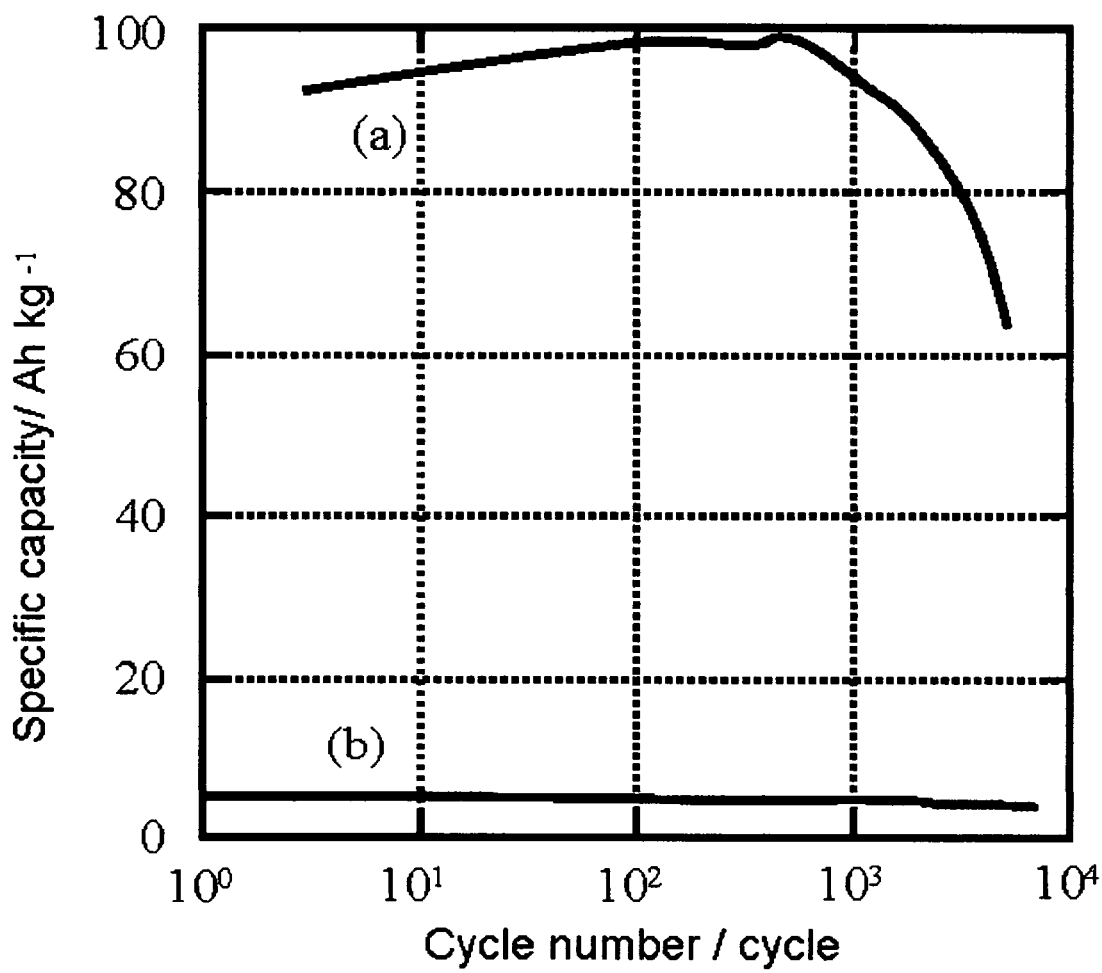
FIG. 29 is a graph showing that a nano-composite film containing, as nuclei, ruthenium oxide with a particle diameter of 100 nm retains a high capacity development rate of 64 Ah/Kg, i.e., 70% of the initial capacity, even after 5000 cycles.

Additionally, the nano-composite film made up of, as nuclei, the ruthenium oxide with the particle diameter of 100 nm retains a high capacity development rate of 64 Ah/Kg, i.e., 70% of the initial capacity, even after 5000 cycles (see FIG. 29).

The invention claimed is:

1. Inorganic/organic composite nano-beads each having a three-dimensional structure in which a nucleus is made of an inorganic material having a particle diameter of nano order and a electronic conductivity of $10^0$ to $10^5$ S/cm, and is covered with a thin film of an organic electrically conductive material,
wherein the inorganic material comprises $RuO_2$ or acetylene black.

2. Inorganic/organic composite nano-beads according to claim 1, wherein the nucleus material has a continuously changing valence and also has a redox activity over a range of −0.1 to 1.1 V versus Ag/AgCl.

3. Inorganic/organic composite nano-beads according to claim 1, wherein the nucleus material has a structure in which electronic inter-particle paths are spontaneously constructed between adjacent particles.

4. Inorganic/organic composite nano-beads according to claim 3, wherein the nucleus material has a structure in which a chain structure made up of primary particles coupled with each other in a moniliform.

5. Inorganic/organic composite nano-beads according to any one of claims 1 to 4, wherein the electrically conductive material has an electric activity over a range of −0.1 to 1.1 V versus Ag/AgCl.

6. Inorganic/organic composite nano-beads according to any one of claims 1 to 4, wherein the electrically conductive material is a conductive oligomer.

7. An energy storage device made of inorganic/organic composite nano-beads according to any one of claims 1 to 4.

8. A method of producing inorganic/organic composite nano-beads according to any one of claims 1 to 4, the method comprising the steps of
dispersing colloidal particles of a nucleus material in a chemically stable condition to form a disperse system in which a mean particle diameter of resulting structures is a minimum value,
converting organic monomers into oligomers in the disperse system to form an organic electrically conductive material, and
coating the structures with thin films of the organic electrically conductive material.

9. A method of producing inorganic/organic composite nano-beads according to claim 8, wherein a selective reaction field is created by causing oxidants to be adsorbed onto surfaces of the nucleus material by electrostatic forces.

10. A method of producing inorganic/organic composite nano-beads according to claim 9, wherein the oligomers are obtained by adjusting a monomer concentration and lowering a reaction field temperature, thereby controlling a reaction rate.

11. A method of producing inorganic/organic composite nano-beads according to claim 8, further comprising the step of continuously maintaining a physically dispersed state with irradiation of an ultrasonic wave.

* * * * *